United States Patent
Kumar et al.

(10) Patent No.: US 12,188,545 B2
(45) Date of Patent: Jan. 7, 2025

(54) GEARED DRIVE SYSTEM PROVIDING INTERMITTENT MOTION

(71) Applicant: Array Tech, Inc., Albuquerque, NM (US)

(72) Inventors: Nikhil Kumar, Albuquerque, NM (US); Nathan Schuknecht, Golden, CO (US)

(73) Assignee: ARRAY TECH, INC., Albuquerque, NM (US)

( * ) Notice: Subject to any disclaimer, the term of this patent is extended or adjusted under 35 U.S.C. 154(b) by 0 days.

(21) Appl. No.: 18/358,446

(22) Filed: Jul. 25, 2023

(65) Prior Publication Data

US 2023/0370015 A1    Nov. 16, 2023

Related U.S. Application Data

(62) Division of application No. 17/650,489, filed on Feb. 9, 2022, now Pat. No. 11,711,052.
(Continued)

(51) Int. Cl.
*F16H 27/06* (2006.01)
*F16H 29/12* (2006.01)
(Continued)

(52) U.S. Cl.
CPC ............. *F16H 27/06* (2013.01); *F16H 29/12* (2013.01); *F24S 30/425* (2018.05); *H02S 20/32* (2014.12);
(Continued)

(58) Field of Classification Search
CPC .......... F16H 27/06; F16H 29/12; F24S 25/70; F24S 30/425; F24S 2030/12; F24S 2030/134; H02S 20/32; Y02E 10/50
See application file for complete search history.

(56) References Cited

U.S. PATENT DOCUMENTS 9,581,678 B2 *  2/2017  Corio ..................... F24S 40/00
10,809,345 B2 * 10/2020 Corio ..................... F24S 40/00
(Continued)

FOREIGN PATENT DOCUMENTS

DE  202017006862 U1  9/2018
EP      3804121 A1    4/2021
(Continued)

OTHER PUBLICATIONS

IDEEMATEC; "Horizon L:Tec 1P: The gold standard"; Website located at: https://www.ideematec.com/products-services/solar-trackers/ltec-1p ; 2024 ; accessed on Sep. 13, 2024.
(Continued)

*Primary Examiner* — Adam D Rogers
(74) *Attorney, Agent, or Firm* — MASCHOFF BRENNAN

(57) ABSTRACT

A mounting assembly may include an arced connecting member that includes a first drive chain along a bottom surface of the arced connecting member, a second drive chain positioned adjacent to the first drive chain, and a third drive chain in a gap between the first and the second drive chains. The mounting assembly may include an intermittent-motion drive system that has a drive wheel with a nub extending from a lateral surface of the drive wheel, the nub being shaped to interface with notches included along the third drive chain. The intermittent-motion drive system may include a first and a second protrusion shaped to interface with surfaces of the first and second drive chains, respectively. Rotation of a drive axle extending through the drive wheel may affect rotation of the drive wheel, rotational movement of the nub extending from the drive wheel, and movement of the arced connecting member.

9 Claims, 38 Drawing Sheets

Related U.S. Application Data

(60) Provisional application No. 63/147,425, filed on Feb. 9, 2021.

(51) Int. Cl.
*F24S 25/70* (2018.01)
*F24S 30/00* (2018.01)
*F24S 30/425* (2018.01)
*H02S 20/32* (2014.01)

(52) U.S. Cl.
CPC ............ *F24S 25/70* (2018.05); *F24S 2030/12* (2018.05); *F24S 2030/134* (2018.05); *Y02E 10/50* (2013.01)

(56) References Cited

U.S. PATENT DOCUMENTS

| | | | |
|---|---|---|---|
| 11,035,591 B2* | 6/2021 | Childress | F16C 17/10 |
| 11,711,052 B2* | 7/2023 | Kumar | F16H 27/06 |
| | | | 136/246 |
| 2014/0150774 A1 | 6/2014 | Chang et al. | |
| 2014/0338659 A1 | 11/2014 | Corio | |
| 2015/0234031 A1 | 8/2015 | Corio | |
| 2016/0365830 A1 | 12/2016 | Bailey et al. | |
| 2018/0091088 A1* | 3/2018 | Barton | F24S 30/425 |
| 2018/0348331 A1 | 12/2018 | Corio | |
| 2023/0383794 A1* | 11/2023 | Schuknecht | H02S 20/32 |

FOREIGN PATENT DOCUMENTS

| | | |
|---|---|---|
| WO | 2013190196 A2 | 4/2014 |
| WO | 2019228793 A1 | 12/2019 |

OTHER PUBLICATIONS

European Patent Office; International Search Report and Written Opinion issued in Int'l App No. PCT/US2022/070593 dated Apr. 21, 2022.

* cited by examiner

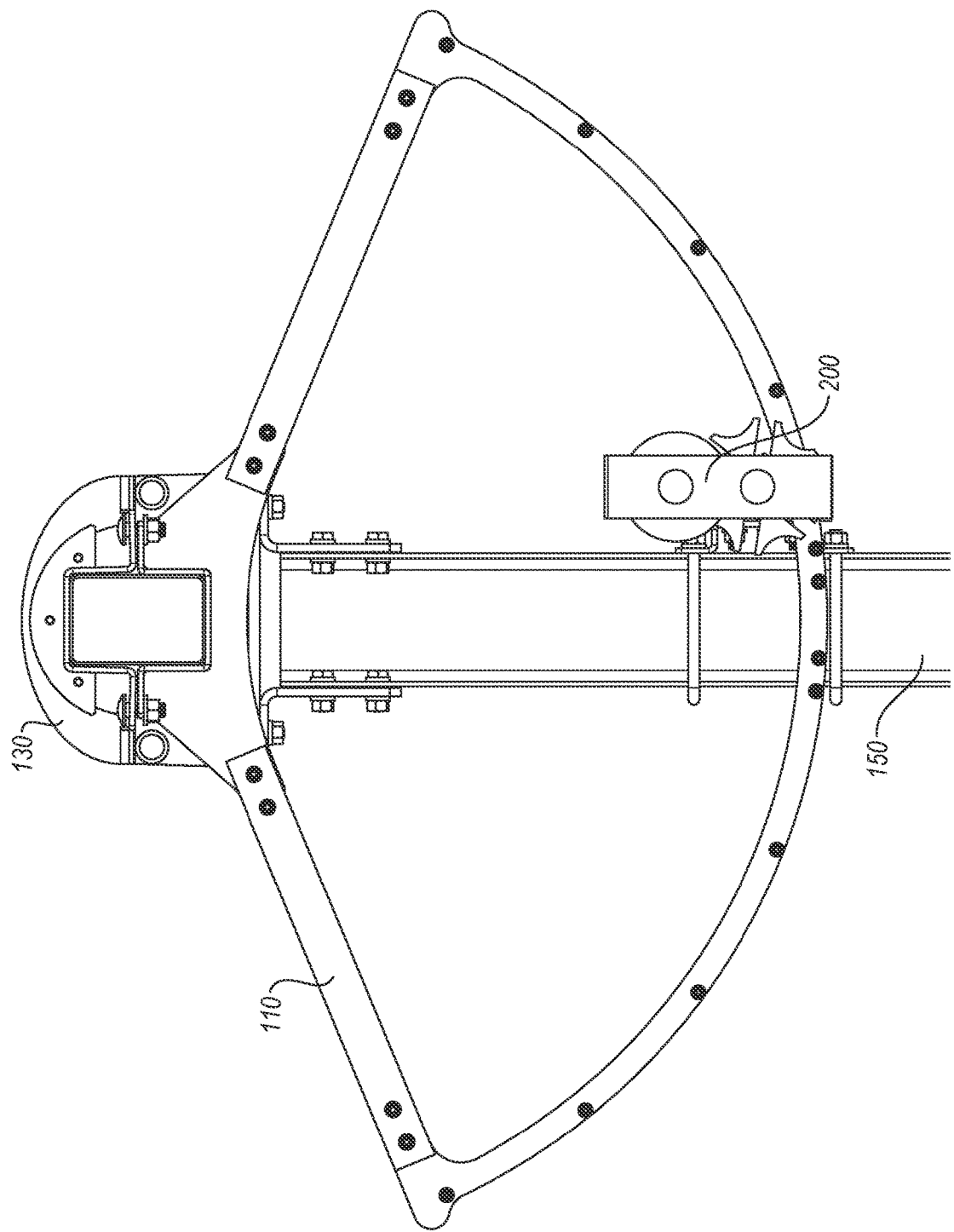

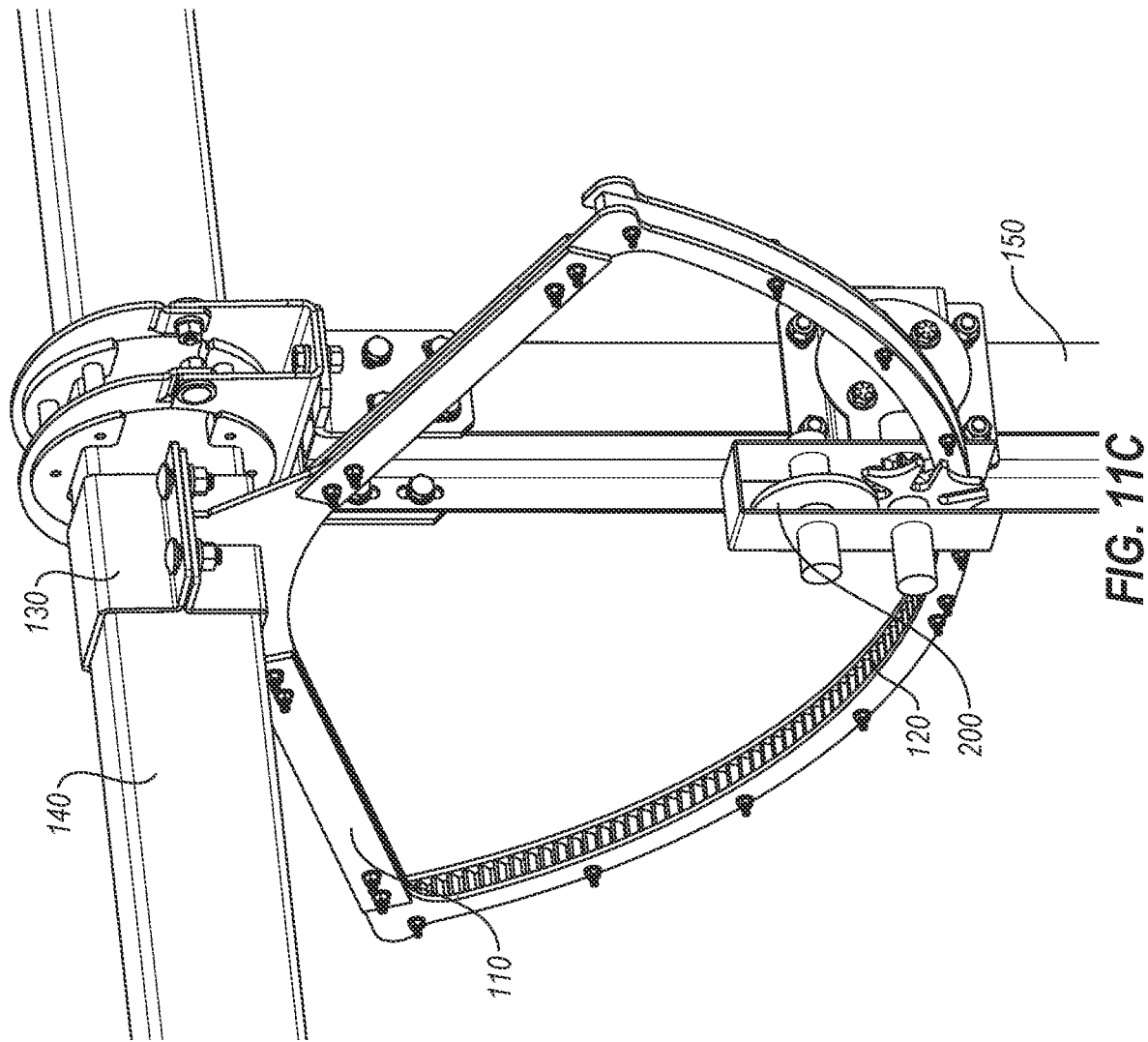

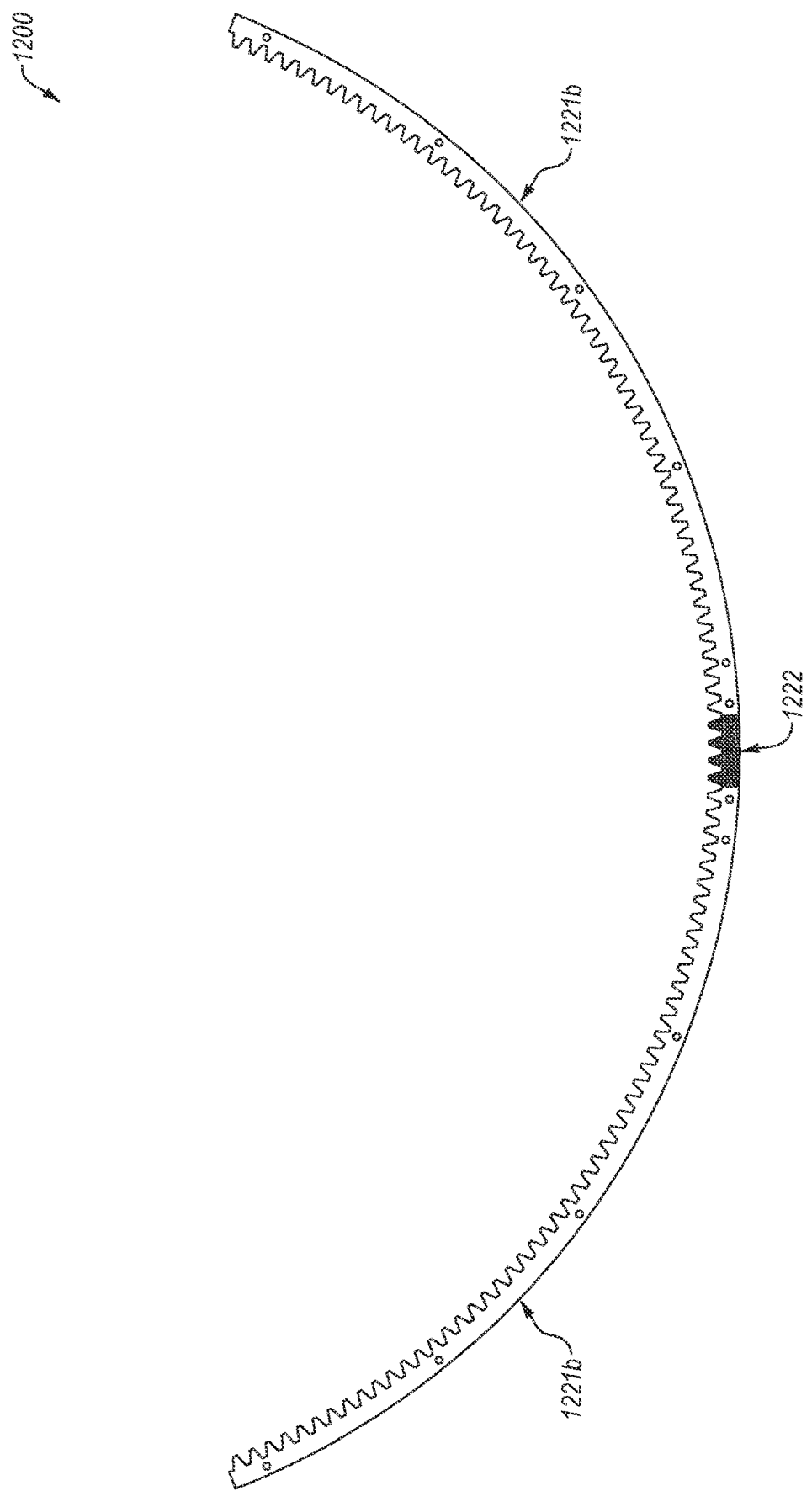

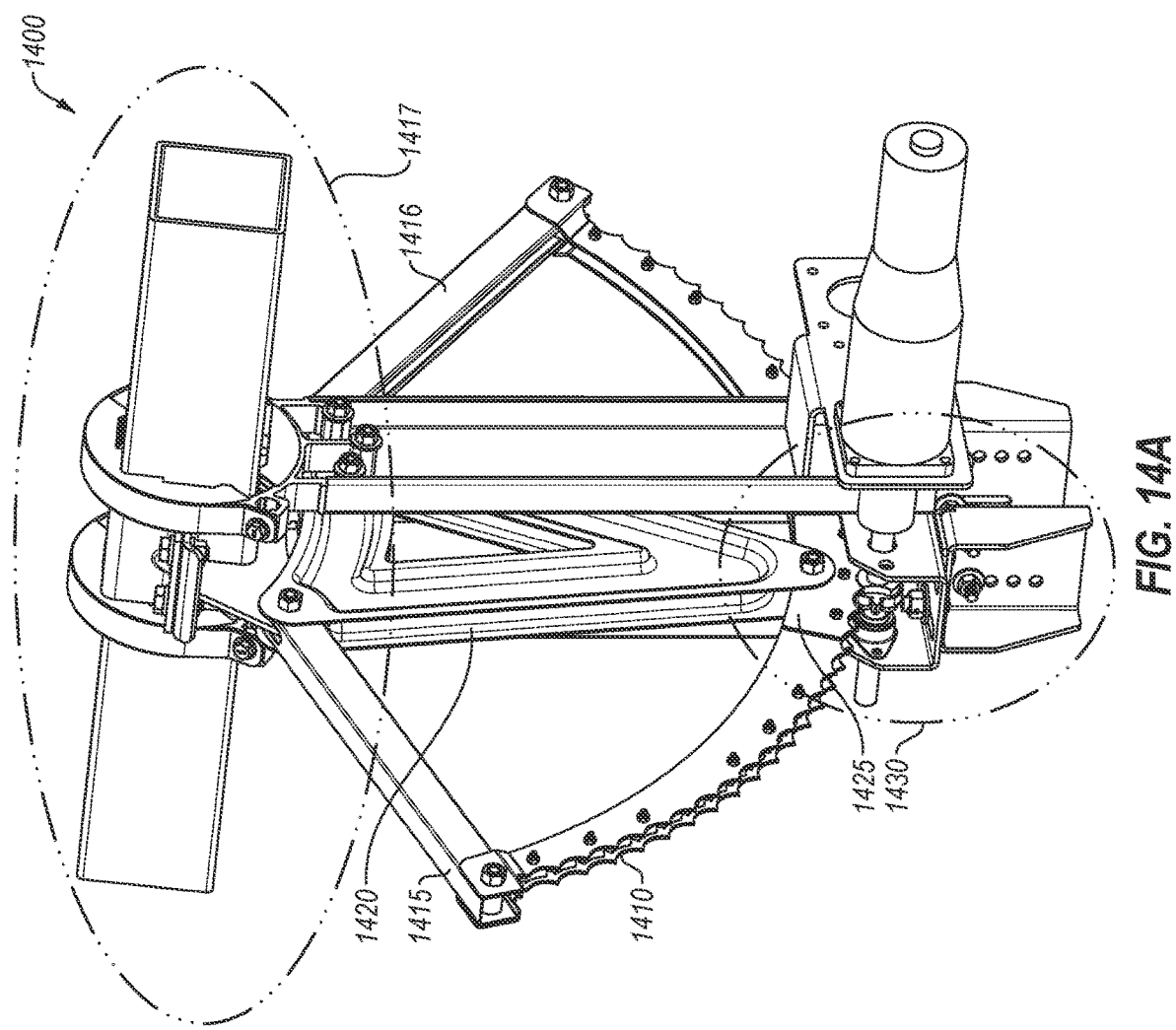

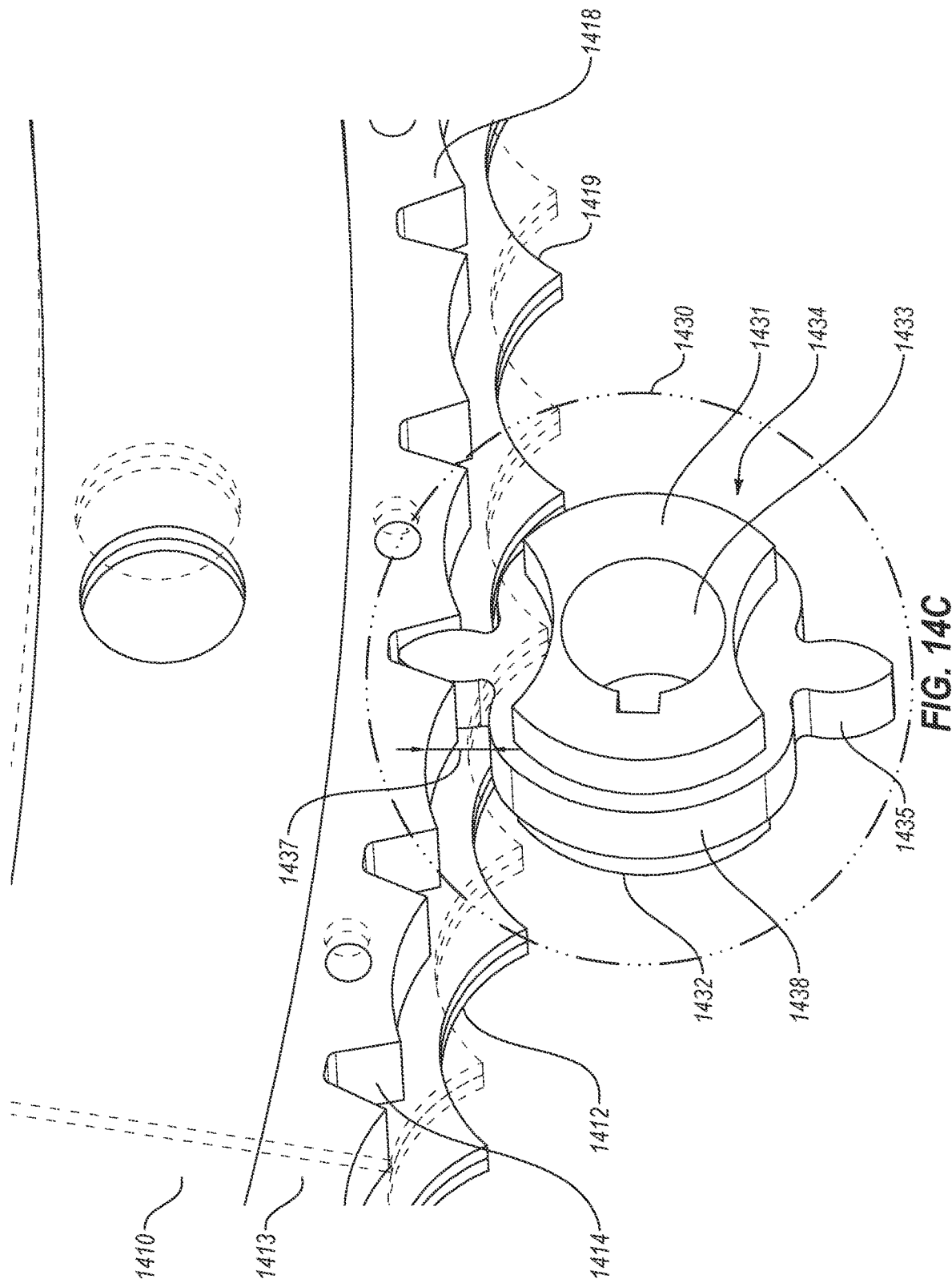

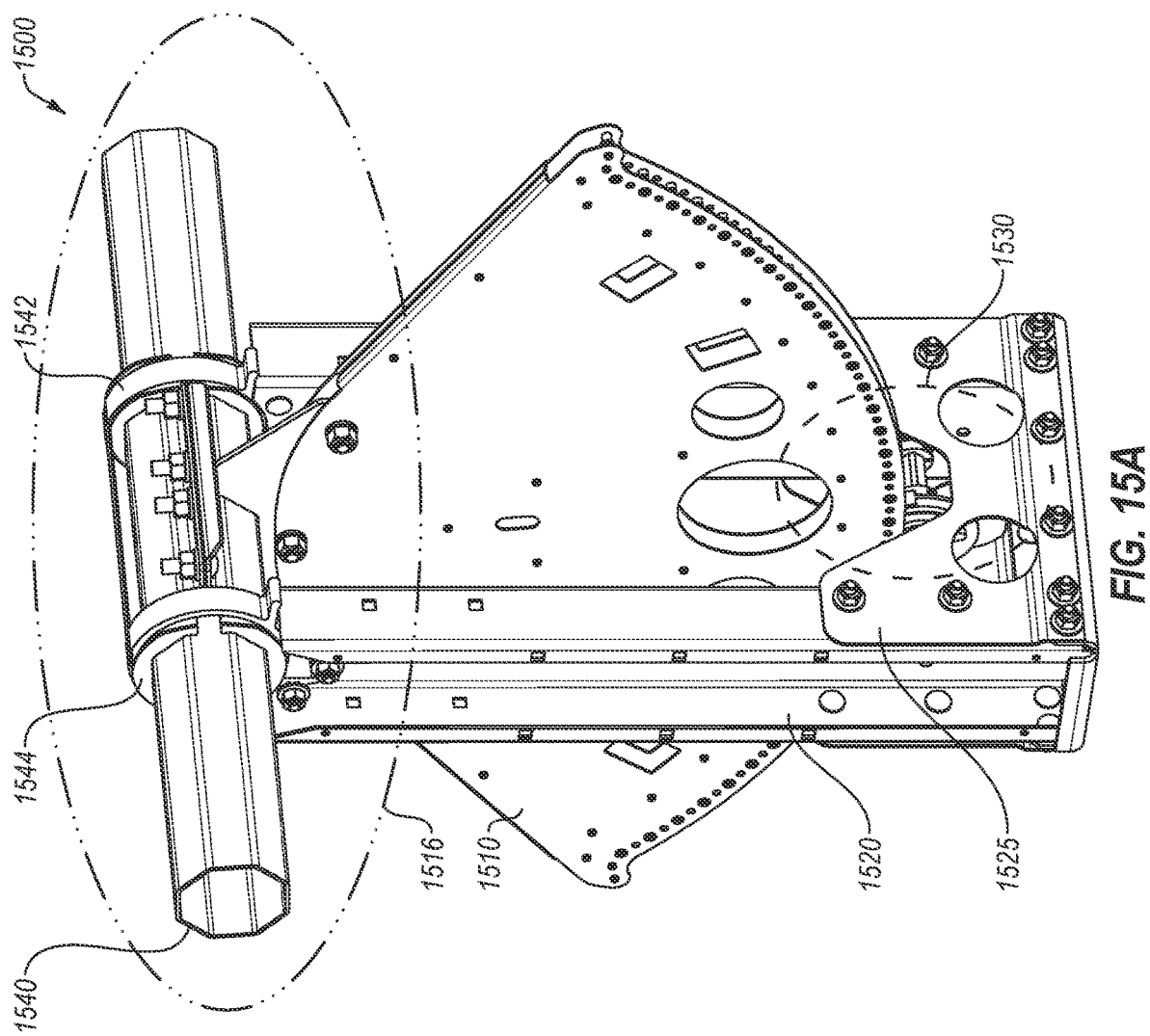

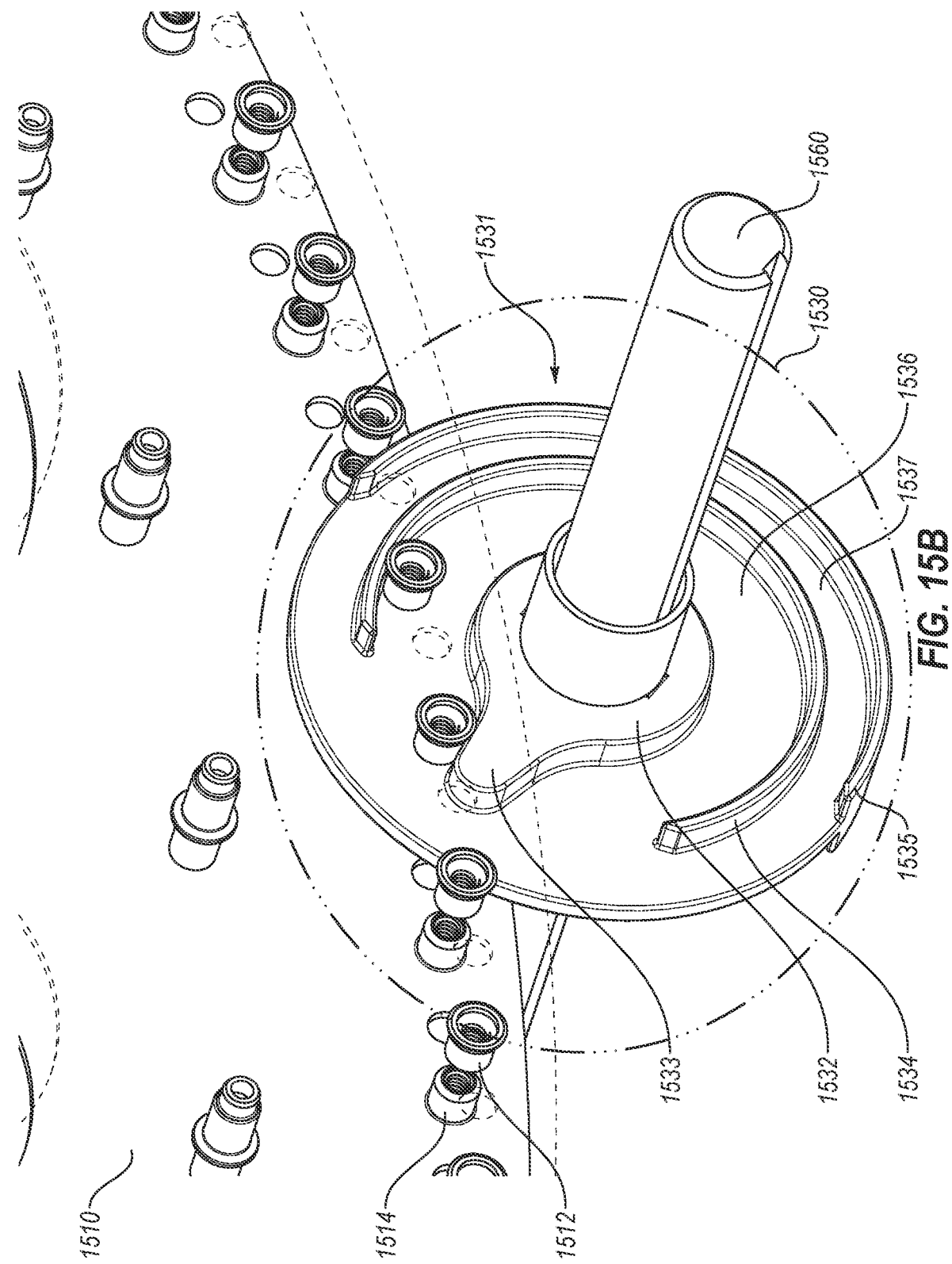

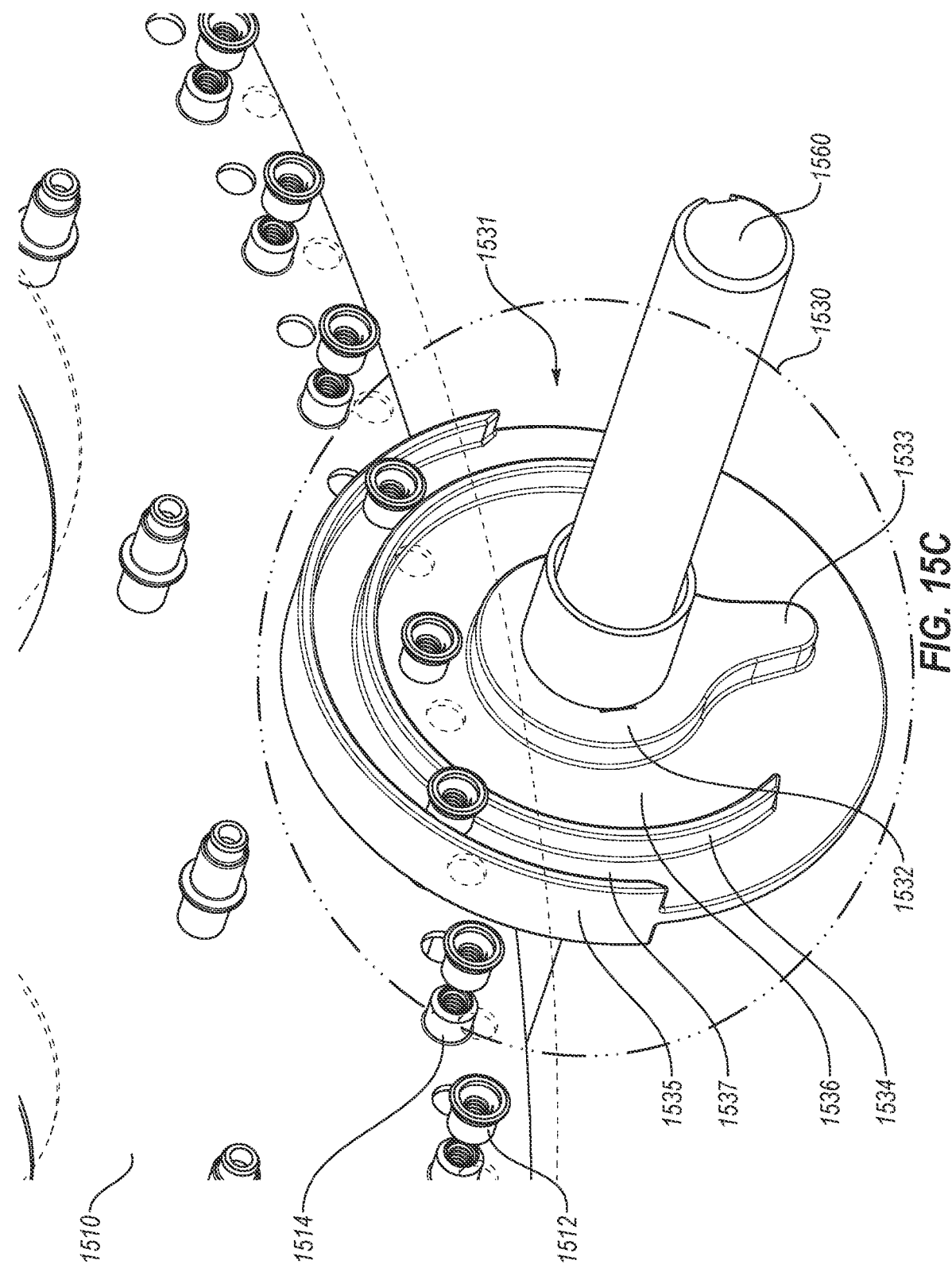

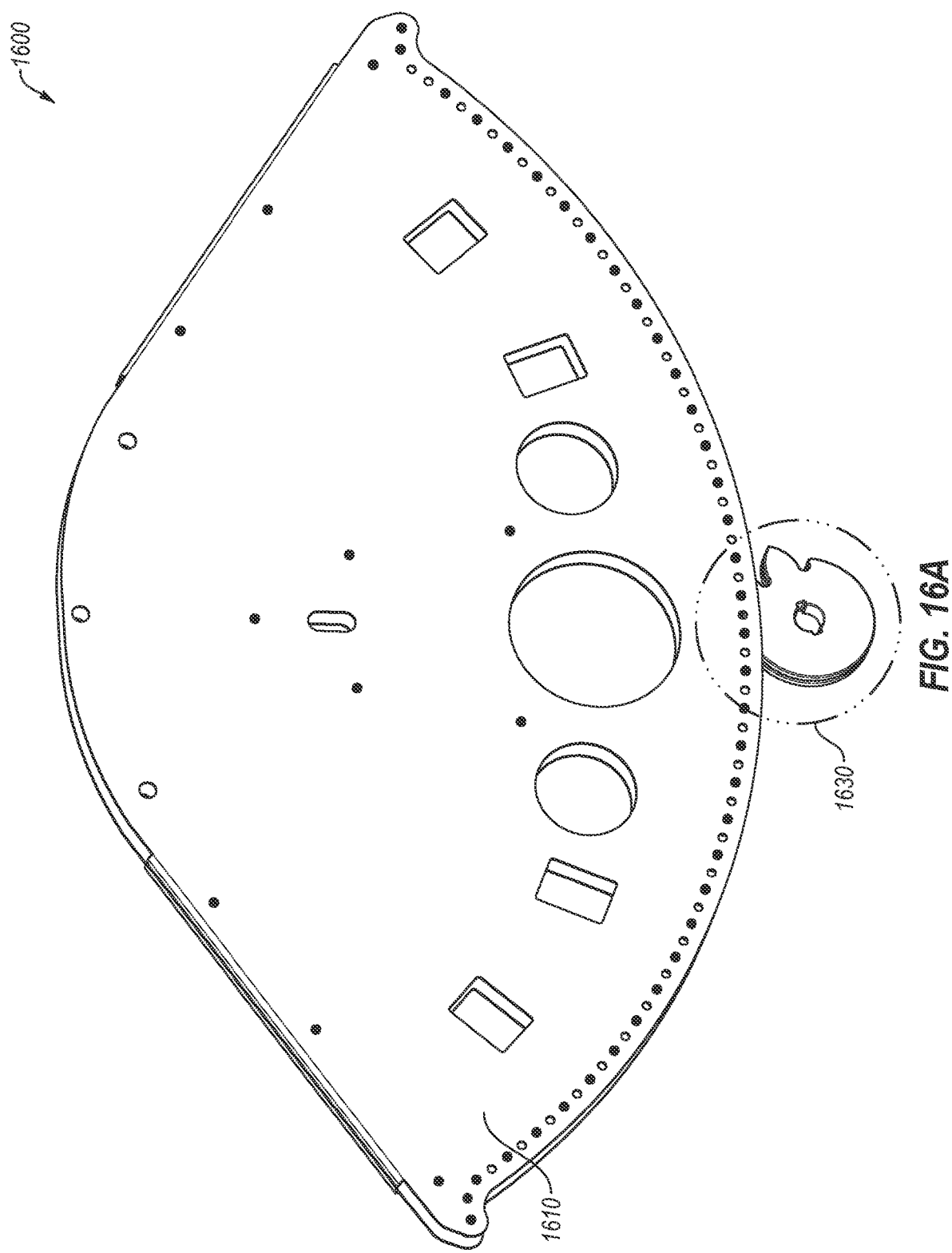

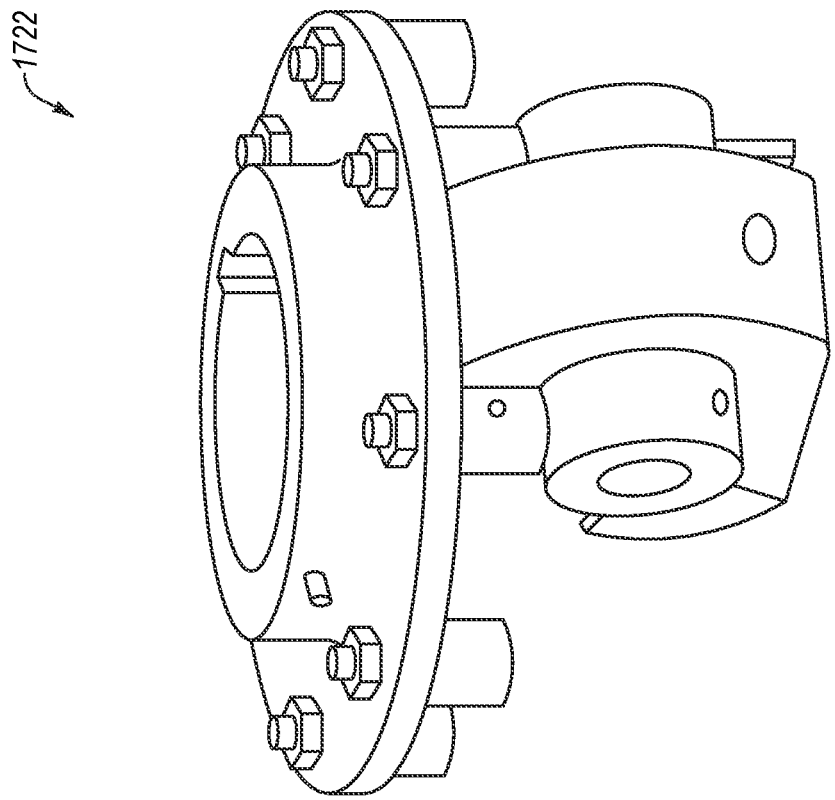
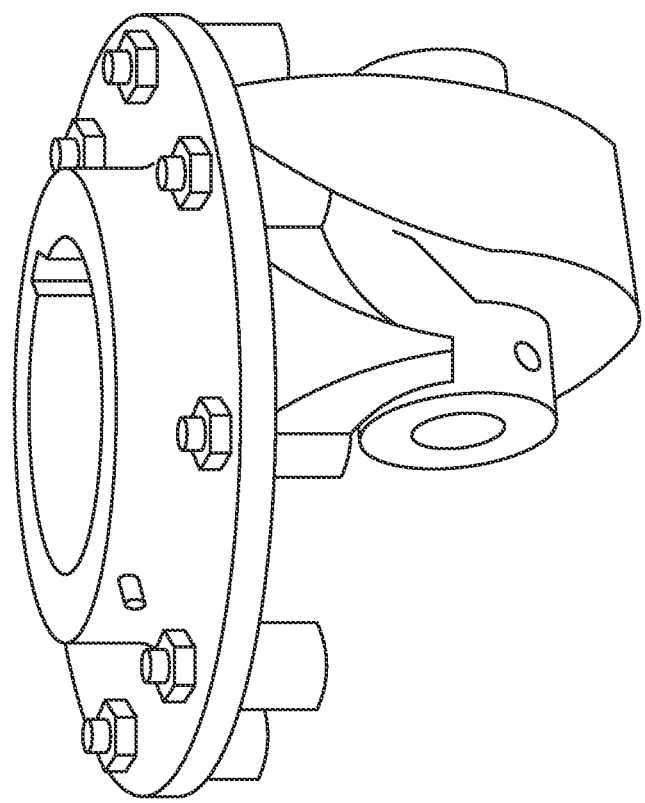
FIG. 17Jb

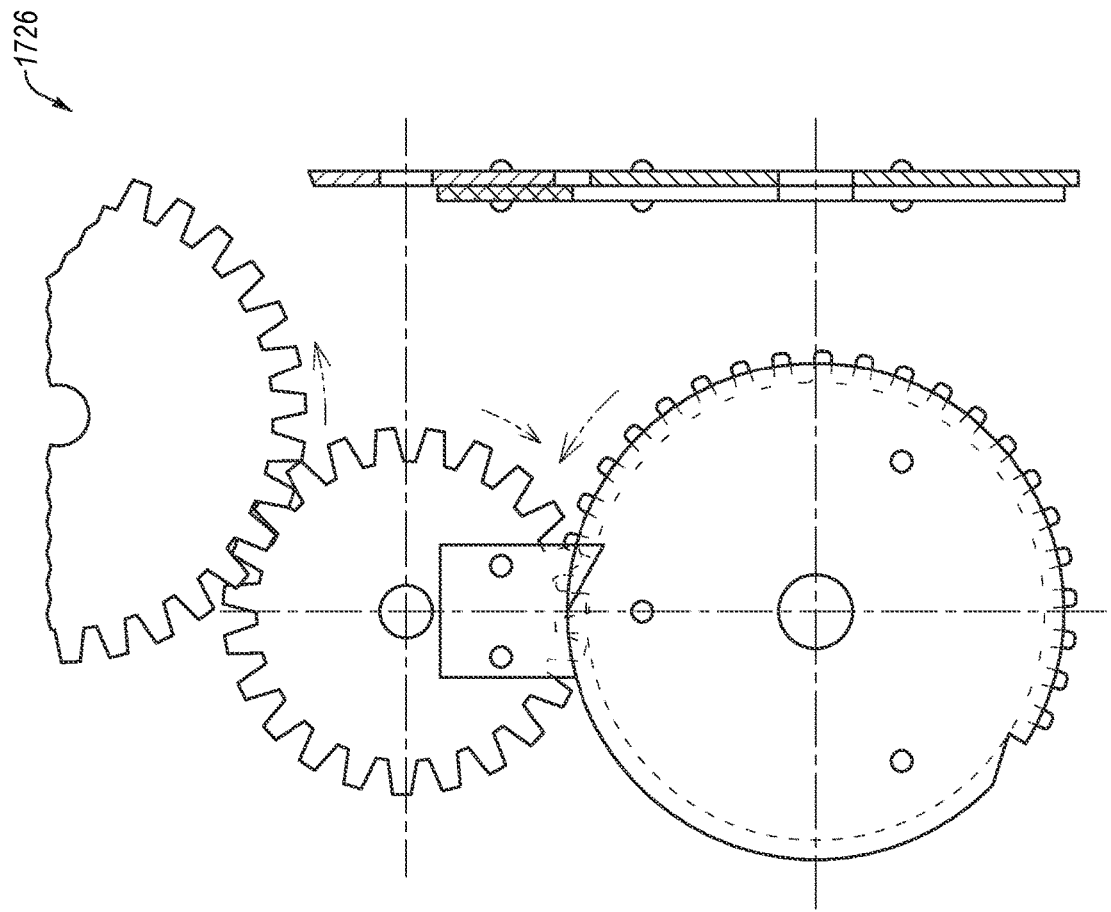
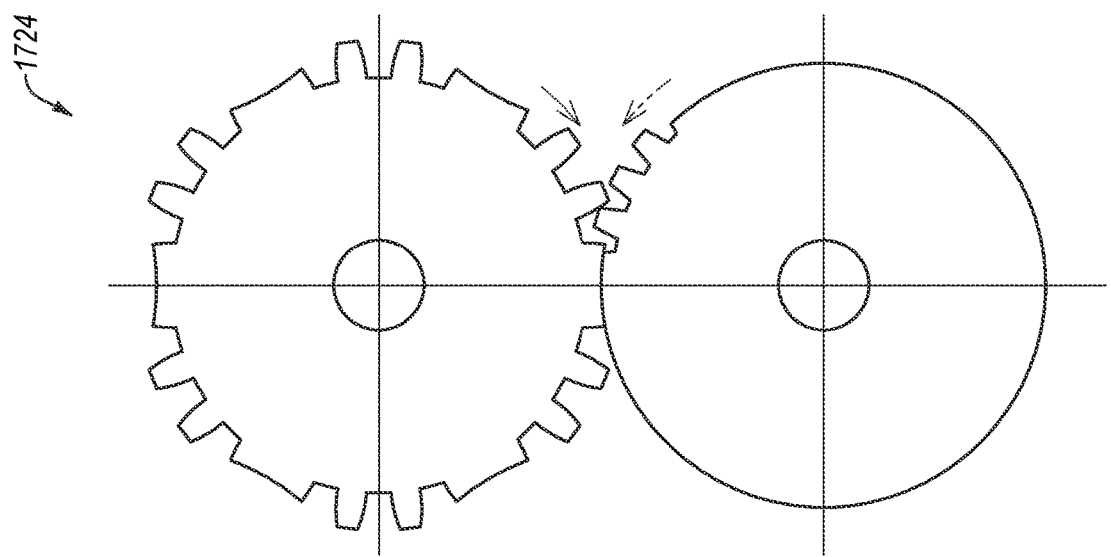
FIG. 17K

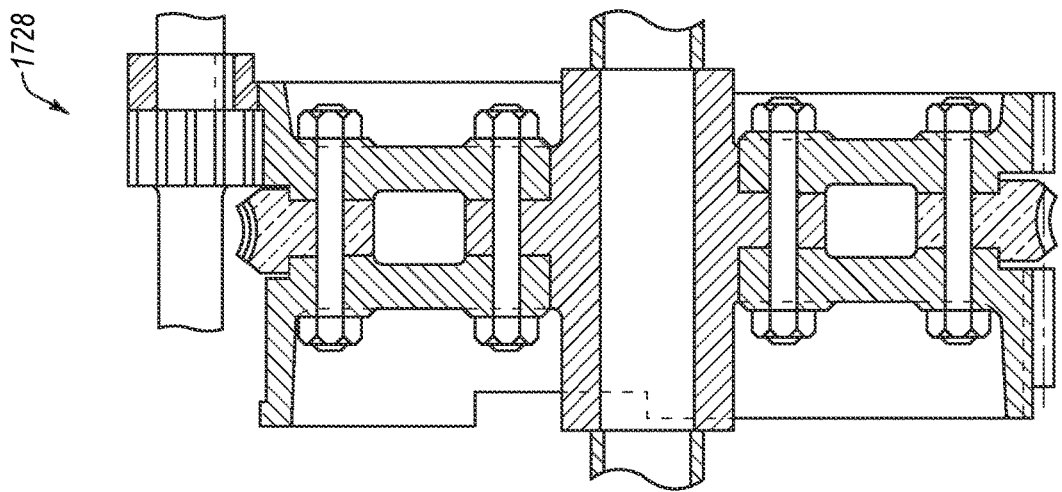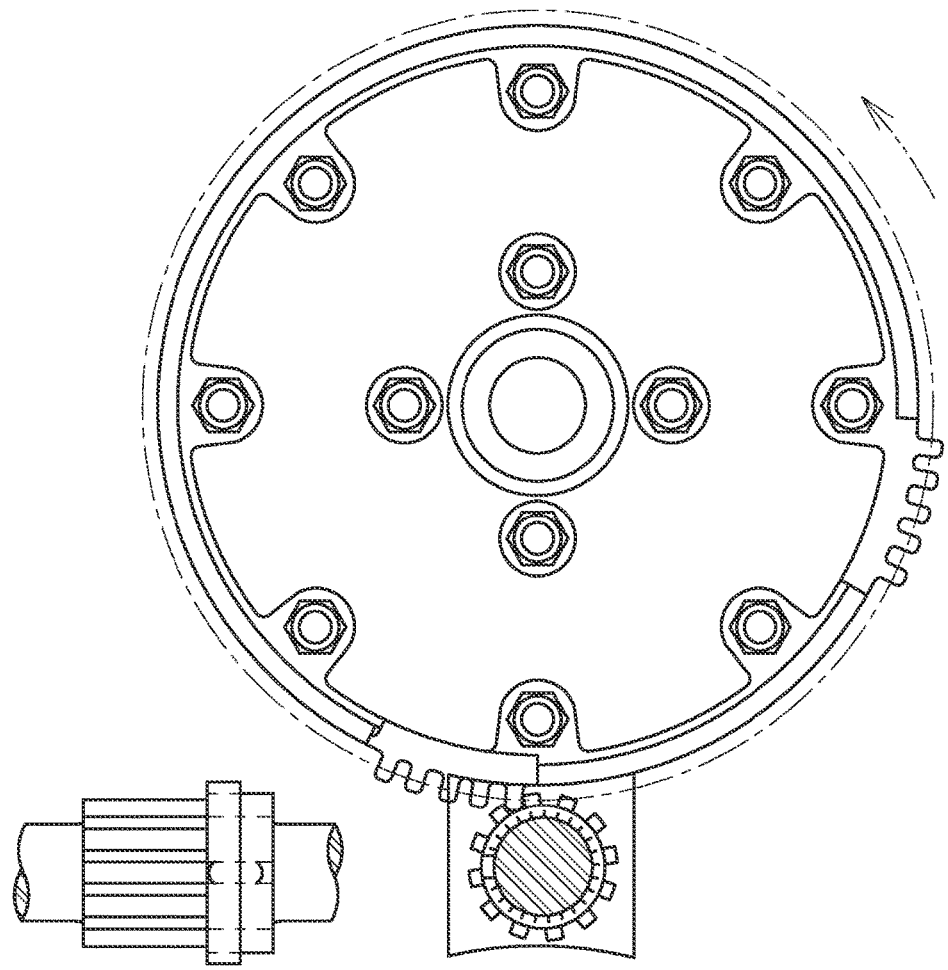
FIG. 17L

GEARED DRIVE SYSTEM PROVIDING INTERMITTENT MOTION

CROSS-REFERENCE TO RELATED APPLICATIONS

This application is a divisional application of U.S. patent application Ser. No. 17/650,489, filed on Feb. 9, 2022, which claims the benefit of U.S. patent application Ser. No. 63/147,425, filed on Feb. 9, 2021; the disclosures of both are incorporated herein by reference in their entirety.

TECHNICAL FIELD

The present disclosure relates to use of a geared drive system that provides intermittent motion.

BACKGROUND

Systems of solar panels may include one or more photovoltaic ("PV") modules. The PV modules may be mounted in rows on solar trackers that direct an orientation of the PV modules such that the orientation of the PV modules changes throughout a day. The PV modules may be placed in an outdoor location such that the PV modules may receive sunlight without obstruction.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

One or more embodiments of the present disclosure may relate to mounting assemblies. A mounting assembly may include an arced connecting member that includes a first drive chain along a bottom surface of the arced connecting member, a second drive chain positioned adjacent to the first drive chain, and a third drive chain in a gap between the first and the second drive chains. The mounting assembly may include an intermittent-motion drive system that has a drive wheel with a nub extending from a lateral surface of the drive wheel, the nub being shaped to interface with notches included along the third drive chain. The intermittent-motion drive system may include a first and a second protrusion shaped to interface with surfaces of the first and second drive chains, respectively. Rotation of a drive axle extending through the drive wheel may affect rotation of the drive wheel, rotational movement of the nub extending from the drive wheel, and movement of the arced connecting member.

The object and advantages of the embodiments will be realized and achieved at least by the elements, features, and combinations particularly pointed out in the claims. It is to be understood that both the foregoing general description and the following detailed description are explanatory and are not restrictive of the invention, as claimed.

BRIEF DESCRIPTION OF THE DRAWINGS

Example embodiments will be described and explained with additional specificity and detail through the accompanying drawings in which:

FIGS. 11A-11C illustrate alternative views of the mounting assembly of FIG. 10A;

FIG. 12 illustrates an example drive chain including varying materials;

FIG. 14A illustrates a third example embodiment of a mounting assembly including an intermittent-motion drive system according to the present disclosure;

FIGS. 14B and 14C illustrate close-up views of the third example embodiment of the intermittent-motion drive system according to the present disclosure;

FIG. 15A illustrates a fourth example embodiment of a mounting assembly including an intermittent-motion drive system according to the present disclosure;

FIGS. 15B and 15C illustrate close-up views of the fourth example embodiment of the intermittent-motion drive system according to the present disclosure;

FIG. 16A illustrates a fifth example embodiment of a mounting assembly including an intermittent-motion drive system according to the present disclosure;

FIGS. 17A-17M illustrate alternative examples of mechanisms to produce intermittent motion when driving the drive chain.

DETAILED DESCRIPTION

Figure 1:
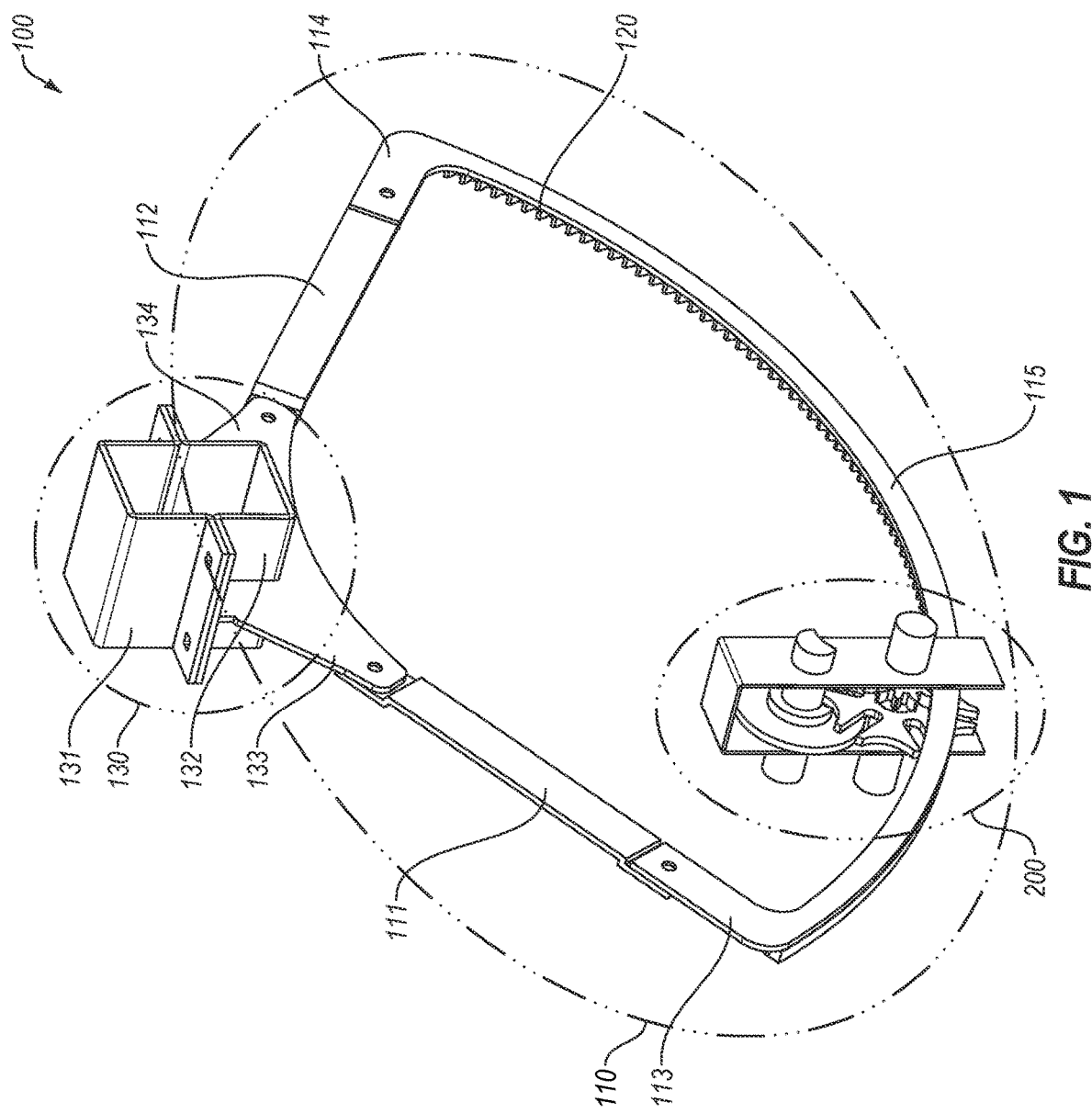
FIG. 1 illustrates an example embodiment of a mounting assembly including a multi-point lock internally geared (e.g., intermittent motion) drive system according to the present disclosure.

A PV module may be positioned in an outdoors environment to increase exposure of the PV module to sunlight such that more photons of energy are absorbed by the PV module. The PV module may be mounted on a mounting assembly including a single- or dual-axis tracker such that the PV module remains oriented towards the Sun for longer periods of time relative to a PV module mounted on a mounting assembly not including a tracker. When positioning of the PV module is fixed, the position of the Sun relative to the PV module changes throughout a given day. The single- or dual-axis tracker may rotate the orientation of the PV module along one or more axes of rotation throughout a given day to reduce an angle of incidence between the PV module and the Sun for an extended period of time. Reducing the angle of incidence such that orientation of the PV module with respect to the Sun is generally perpendicular may increase the number of photons of energy absorbed by the PV module and the amount of electrical power generated by the PV module.

Solar tracking methods and/or systems may include mounting a given PV module on a mounting assembly. The mounting assembly may include one or more mechanisms that may affect rotation of the given PV module mounted on the mounting assembly, such as torsion beams, clamps, brackets, purlins, etc. The one or more mechanisms may affect rotation of the given PV module by being supplied motion by a motor and/or an actuator. Solar tracking methods and/or systems, however, may experience durability issues due to wear and/or corrosion of the mounting assembly. Using a solar tracking system introduces moving components to the given PV module and/or mounting assembly that may be damaged. For example, wind loads and/or vibration of the solar tracking system during operation may cause wear-and-tear damage to the mounting assembly, the given PV module, the motor, and/or the actuator. Replacement of damaged components of the solar tracking system may cause the given PV module to be inoperable for some time, which may offset efficiency gains from tracking movement of the Sun in addition to adding expense. Additionally or alternatively, solar tracking methods and/or systems may provide low tracking resolution such that the PV module may not accurately follow movement of the Sun.

The present disclosure relates to, among other things, use of a Geneva drive system or other intermittent-motion-producing mechanical linkage to facilitate driving and locking of solar trackers. A PV module may be mounted on a mounting assembly including the intermittent-motion drive system. The mounting assembly may include a drive arc and a separate intermittent-motion drive system as a driveshaft mechanism. The PV module may be mounted on a torsion beam coupled to the mounting assembly such that orientation of the PV module may be changed by rotating the torsion beam. Rotation of the torsion beam may be facilitated by movement of the intermittent-motion drive system along the drive arc of the mounting assembly.

The intermittent-motion drive system according to the present disclosure may provide a way to drive and lock a solar tracking system in one or more positions. The intermittent-motion drive system according to the present disclosure may lock the solar tracking system at a specific stow angle to reduce wind load on components of the solar tracking system. The intermittent-motion drive system according to the present disclosure may include multiple locking positions in one rotation of the driveshaft such that a high resolution of the solar tracking may be obtained (e.g., a variety of locking positions are provided with precise orientations of the PV module). The intermittent-motion drive system according to the present disclosure may reduce damage to motors and/or driveshafts by isolating torque on the torque beam. Costs associated with wear of components of the solar tracking system may be reduced by the intermittent-motion drive system according to the present disclosure. Additionally or alternatively, by using the intermittent-motion drive system, in at least some circumstances components of the mounting assembly may be made of a more wear-resistant and corrosion-resistant material. Additionally or alternatively, in some circumstances a casing may be provided around the intermittent-motion drive system that may protect portions of the intermittent-motion drive system from corrosion and the elements.

Embodiments of the present disclosure are explained with reference to the accompanying figures.

FIG. 1 illustrates an example embodiment of a mounting assembly 100 according to the present disclosure. The mounting assembly 100 may include a drive arc 110, a toothed drive chain 120, a ring 130, and an intermittent-motion drive system 200. The drive arc 110 may include a first leg 111 connected to a first end 113 of an arced connecting member 115 and a second leg 112 connected to a second end 114 of the arced connecting member 115. The toothed drive chain 120 may interface with the arced connecting member 115 such that one or more teeth of the toothed drive chain 120 protrude from the arced connecting member 115. The intermittent-motion drive system 200 may be positioned such that gears included in the intermittent-motion drive system 200 interface with one or more teeth of the toothed drive chain 120. The intermittent-motion drive system 200 may be described in further detail below in relation to FIGS. 2 and 3. The first leg 111 and the second leg 112 of the drive arc 110 may be coupled to the ring 130. While the drive chain 120 is illustrated as toothed, it will be appreciated that a friction-based interface or any other mechanism via which motion from one body (the intermittent-motion drive system 200) is transferred to another (the drive chain 120) is contemplated within the scope of the present disclosure.

The drive arc 110 may be made of a material such as iron, steel, plastic, carbon fiber, composite, etc. In some embodiments, the first leg 111, the second leg 112, and the arced connecting member 115 may be a single, cast-molded structure. In these and other embodiments, the ring 130 may be included in the single, cast-molded structure. Additionally or alternatively, the first leg 111, the second leg 112, the arced connecting member 115, and the ring 130 may be separate components. In such embodiments, a first end of the first leg 111 may be coupled to the arced connecting member 115, a second end of the first leg may be coupled to the ring 130, a first end of the second leg 112 may be coupled to the arced connecting member 115, and a second end of the second leg 112 may be coupled to the ring 130. The components of the drive arc 110 may be coupled together by welding, riveting/bolting, screwing, or coupled together by fastening the components together by any other method.

Figure 8:
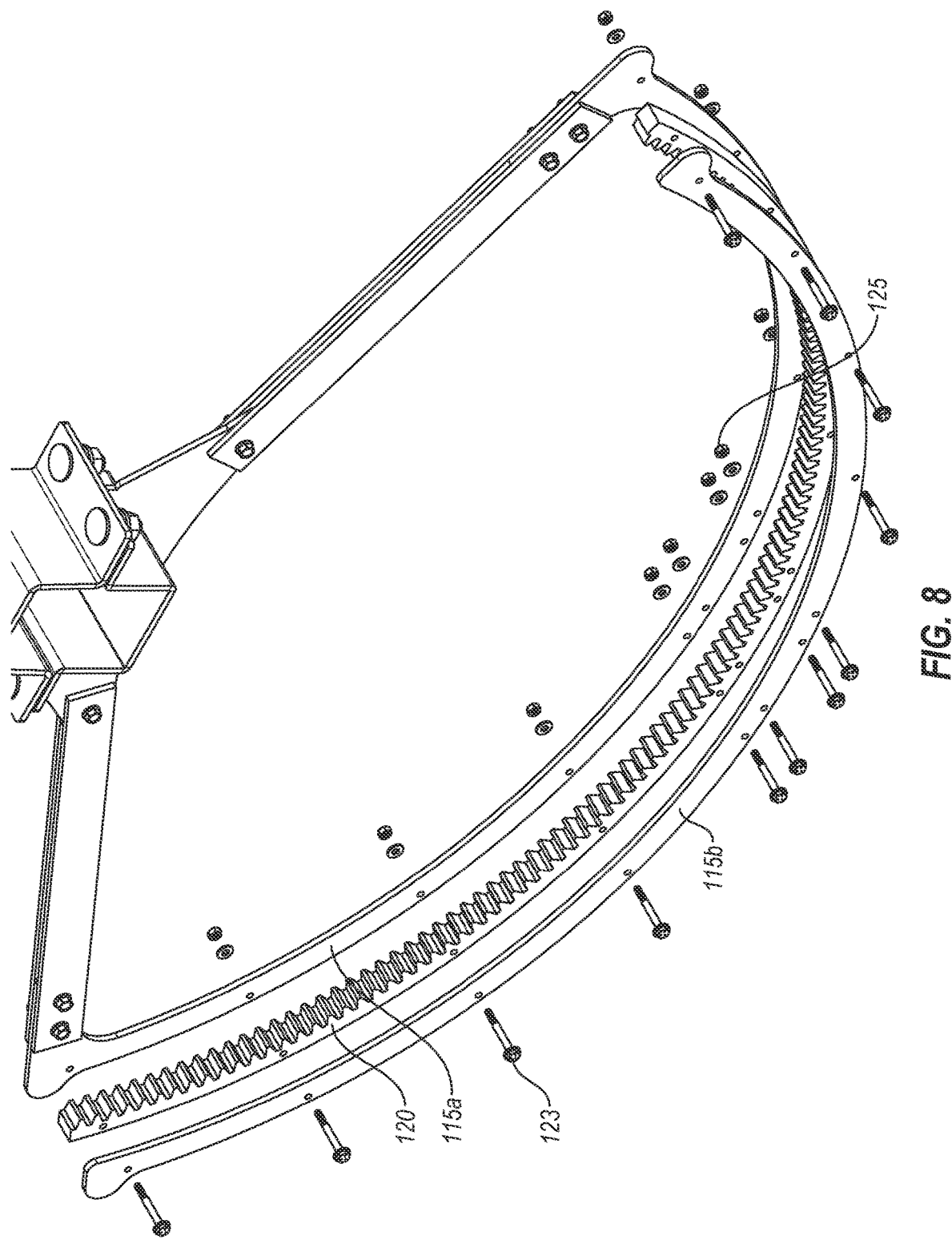
FIG. 8 illustrates an exploded view of an arced connecting member and a toothed drive chain of the intermittent-motion drive system according to the present disclosure.

The toothed drive chain 120 may include one or more teeth 122. In some embodiments, the teeth 122 may be evenly spaced apart along a substantial portion of (such as the entire) length of the drive chain 120. For example, the one or more teeth 122 of the drive chain 120 may be spaced such that an interval 124 between a first tooth and a second tooth is the same as or similar to an interval 124 between a third tooth and a fourth tooth. In some embodiments, the one or more teeth 122 may include triangular shapes such that the end of each tooth is pointed. In these and other embodiments, the end of each tooth may be made of two straight edges, or the end of each tooth may be a rounded point. Additionally or alternatively, the one or more teeth 122 may include rectangular shapes such that the end of each tooth is a flat surface. Additionally or alternatively, the teeth 122 of the toothed drive chain 120 may include truncated triangular shapes, an involute geared tooth shape (e.g., involute circles forming a number of the faces of the gear shape), etc. The toothed drive chain 120 may be made of a material such as iron, steel, plastic, carbon fiber, composite, etc. In some embodiments, the arced connecting member 115 of the drive arc 110 may include an indented section in which the toothed drive chain 120 may be inserted. In some embodiments, the toothed drive chain 120 may be positioned between a first arced connecting section, such as first arced connecting section 115a, and a second arced connecting section, such as second arced connecting section 115b, as illustrated in FIG. 8. In some embodiments, the toothed drive chain 120 may include a curved strip from which the one or more teeth 122 extend. The curvature of the curved strip may correspond to the curvature of the arced connecting member, so the toothed drive chain 120 may interface with the arced connecting member 115.

The ring 130 may include an aperture through which a torsion beam and/or other support beam on which a PV module may be mounted may be inserted. The ring 130 may be shaped as a rectangle, square, hexagon, octagon, circle, etc. based on the shape of the torsion beam and/or other support beam to be inserted through the aperture of the ring 130. In some embodiments, the ring 130 may include two or more interfacing components that may interface in a vertical or horizontal direction, or any other direction. For example, the ring 130 may include a bottom section 132 in which the torsion beam and/or other support beam may be positioned and a top section 131 which may interface with the bottom section 132 to enclose the torsion beam and/or other support beam. The top of the bottom section 132 may include tabs extending from one or more sides, and the bottom of the top section 131 may include corresponding tabs that may be positioned flush against and interface with the tabs of the bottom section 132. Additionally or alternatively, the bottom section 132 and the top section 131 may be connected by a flange-groove mechanism and/or a hinge mechanism. In some embodiments, one or more connecting members, such as a first connecting member 133 and/or a second connecting member 134, may extend from the bottom section 132 of the ring 130. The first leg 111 and/or the second leg 112 of the drive arc 110 may be connected to the ring 130 by interfacing with the one or more connecting members 133 and/or 134.

Figure 2:
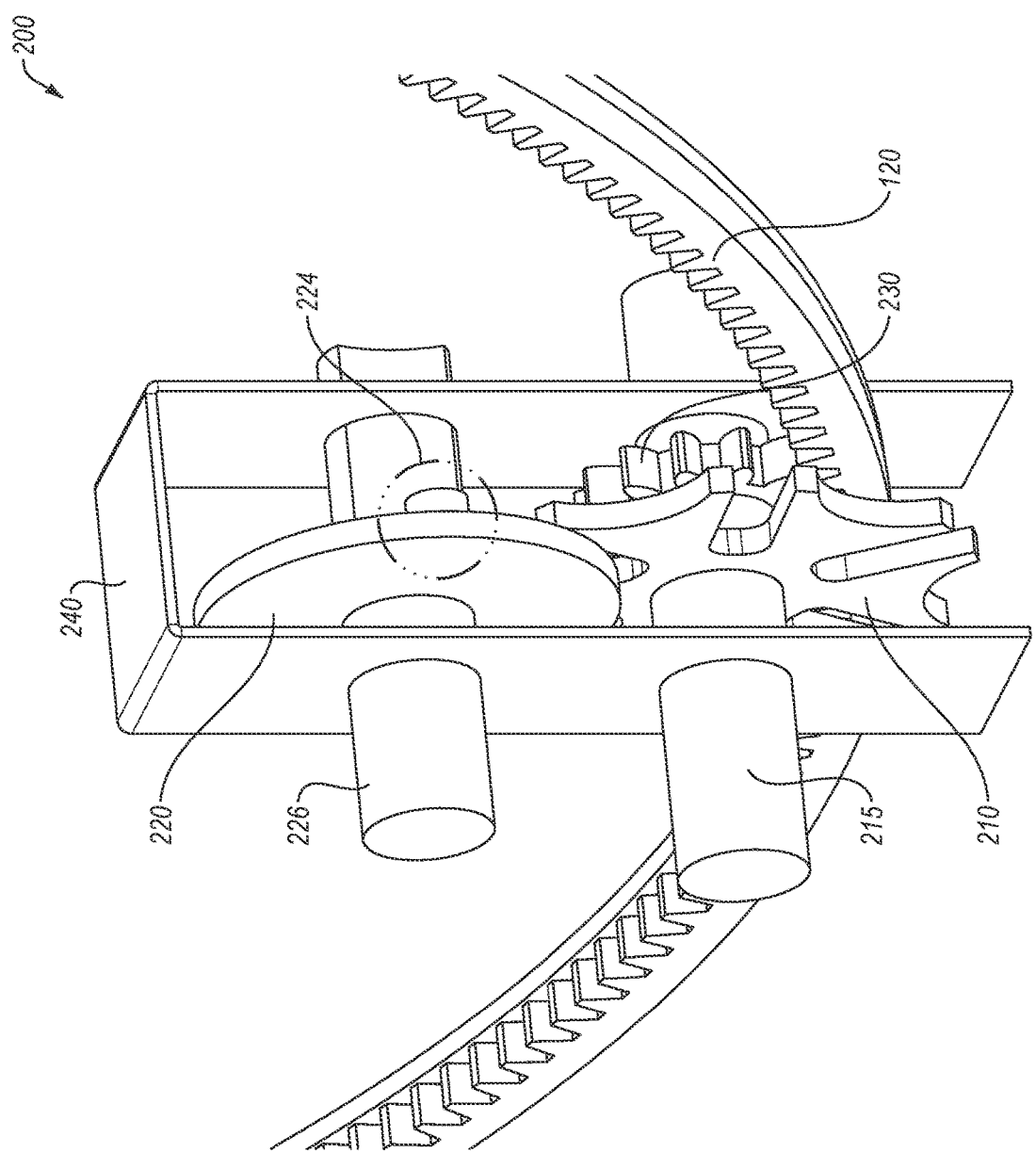
FIG. 2 illustrates a close-up view of an example embodiment of the intermittent-motion drive system according to the present disclosure.

FIG. 2 illustrates a close-up view of the example embodiment of the intermittent-motion drive system 200 according to one or more embodiments of the present disclosure. The intermittent-motion drive system 200 may include a driven wheel 210, a driven axle 215, a drive wheel 220, a drive pin 224, a drive axle 226, a sprocket 230, and/or a housing 240. The driven wheel 210 may include an opening through which the driven axle 215 may extend as an axis of rotation for the driven wheel 210. In some embodiments, the driven wheel 210 may be keyed to or otherwise coupled to the driven axle 215 such that the driven wheel 210 and/or the driven axle 215 rotate as a single body. Additionally or alternatively, bearings to facilitate free movement between the driven wheel 210 and/or the driven axle 215 in one or both rotational directions may be included in the intermittent-motion drive system 200.

In some embodiments, the sprocket 230 may include an opening through which the driven axle 215 may extend. In these and other embodiments, the driven axle 215 may act as an axis of rotation for the sprocket 230. For example, the sprocket 230 may be keyed to the driven axle 215 and/or there may be one-way bearings at the interface between the sprocket 230 and the driven axle 215.

The drive wheel 220 may include an opening through which the drive axle 226 may extend as an axis of rotation for the drive wheel 220. In these and other embodiments, the drive axle 226 may act as an axis of rotation for the drive wheel 220. For example, the drive wheel 220 may be keyed to the drive axle 226 and/or there may be one-way bearings at the interface between the drive wheel 220 and the drive axle 226. The drive pin 224 may be attached to and/or formed as a unitary body with the drive wheel 220.

Figure 5A:
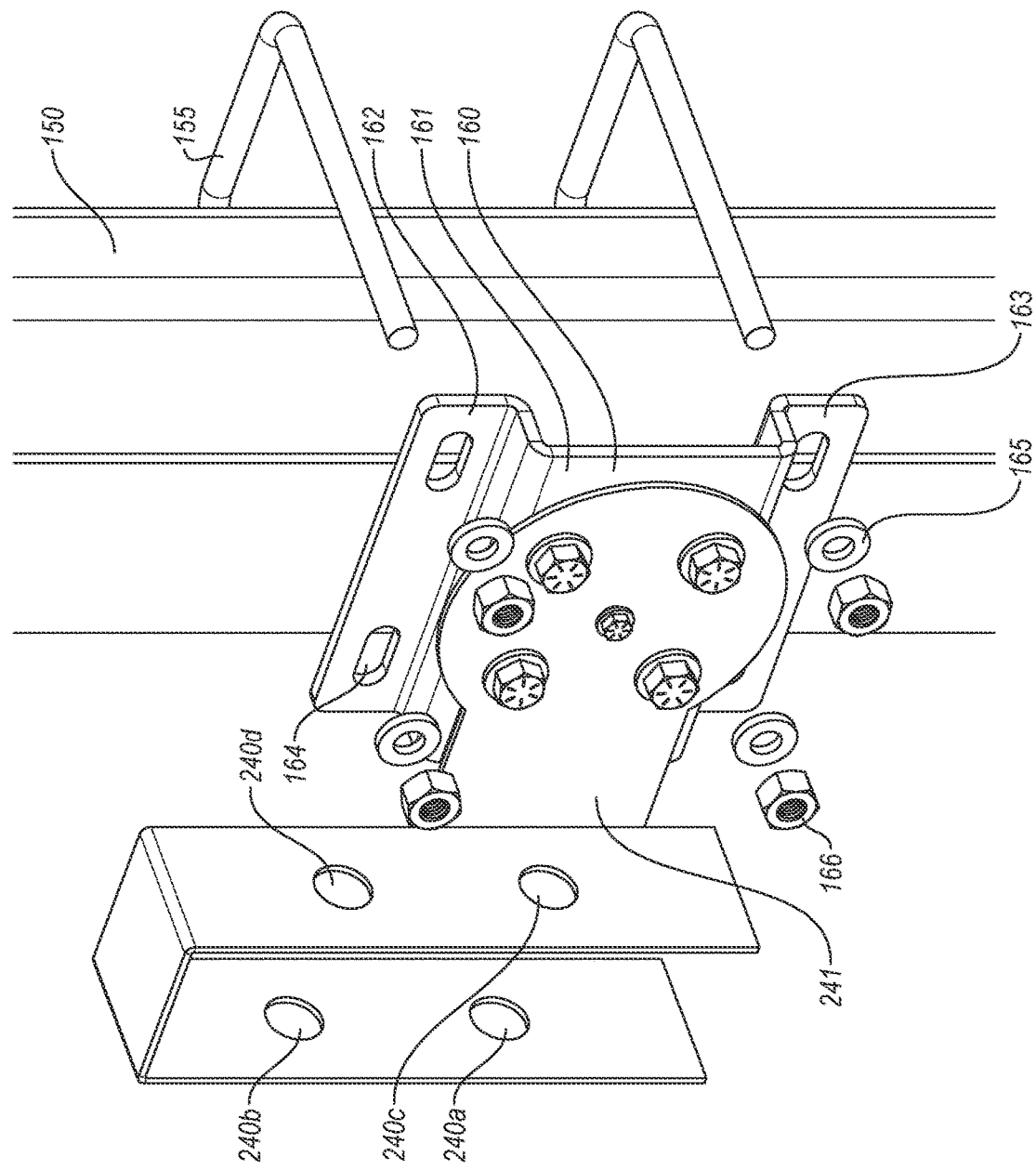
FIG. 5A illustrates a close-up view of a mounting device for the intermittent-motion drive system according to the present disclosure.

In some embodiments, the housing 240 may include a first opening and a second opening in a first side of the housing 240 and a third opening and a fourth opening in a second side of the housing 240. For example, the openings of the housing 240 may include a first opening 240a, a second opening 240b, a third opening 240c, and a fourth opening 240d as illustrated in FIG. 5A. In some embodiments, the second side of the housing 240 may be opposite of the first side of the housing 240. In these and other embodiments, the first opening and the third opening of the housing 240 may be aligned, and the second opening and the fourth opening may be aligned. The driven axle 215 may extend through the first opening and the third opening, and the drive axle 226 may extend through the second opening and the fourth opening. In some embodiments, the housing may include a gasket or other sealing mechanism permitting rotation of the driven axle 215 and/or the drive axle 226 relative to the housing 240 while preventing and/or reducing exposure of a region within the housing 240 to external environmental factors. In some embodiments, the housing 240 may be replaced by a single plate from which various components of the intermittent-motion drive system may be cantilevered rather than being supported on two sides by the housing 240.

The drive wheel 220 may include a rotationally symmetrical wheel. In some embodiments, the drive wheel 220 may include a circular, a square, a hexagonal, or other polygonal wheel. The drive pin 224 may be a cylindrical or semi-cylindrical peg protruding from a first surface of the drive wheel 220 such that rotation of the drive wheel 220 causes rotation of the drive pin 224 in the same direction as the drive wheel 220 about the drive axle 226 but offset a distance from the drive axle 226. The drive axle 226 may include a first section and a second section in which the first section includes a cylindrical shaft, and the second section includes a semi-cylindrical shaft (e.g., the second section may include a semi-circular cross-section or a crescent cross-section). In some embodiments, the first section and the second section may include a single shaft in which a portion of the single shaft is removed to form the second section of the drive axle 226. Additionally or alternatively, the first section of the drive axle 226 may include a first shaft, and the second section of the drive axle 226 may include a second shaft separate from the first shaft. In some embodiments, the drive wheel 220 may include a protrusion 222 that may interface with the driven wheel 210 as described in further detail in relation to FIG. 3.

The driven wheel 210 may include a rotationally symmetrical gear. The driven wheel 210 may include one or more channels in which the drive pin 224 may enter as the drive pin 224 rotates about the drive axle 226. Each channel may include a stadium shape (e.g., a rectangular shape with generally half circle shapes at the ends) such that walls of each channel are straight or substantially straight and include an end corresponding to the shape of the drive pin 224. For example, an end of a given channel may be rounded in a semi-circular shape when a given pin has a cylindrical shape. Rotation of the driven wheel 210 may be caused by rotation of the drive pin 224 as the drive pin 224 interfaces with each of the channels included in the driven wheel 210. For example, a given driven wheel including four channels may rotate one-fourth of the circumference of the given driven wheel for each revolution of the drive wheel 220 and the associated drive pin 224. Rotation of the driven axle 215 may be caused by rotation of the driven wheel 210. The shape of the driven wheel at openings of the one or more channels and between channels may depend on the shape of the protrusion 222 as described in further detail in relation to FIG. 3. While four channels are illustrated, it will be appreciated that any number of channels may be included, such as two, three, five, six, seven, eight, ten, twelve, etc.

The sprocket 230 may include a rotationally symmetrical gear having one or more teeth 232. The one or more teeth 232 of the sprocket 230 may be shaped to interface with the interval 124 between any two teeth 122 of the toothed drive chain 120. For example, a given sprocket may include rectangular teeth corresponding to a given toothed drive chain having rectangular teeth.

Rotation of the sprocket 230 may facilitate movement and/or rotation of the mounting assembly 100 along the toothed drive chain 120 such that orientation of the PV module mounted on the mounting assembly 100 may be adjusted. In some embodiments, spacing between teeth 232 of the sprocket 230 and intervals 124 between teeth 122 of the toothed drive chain 120 may be specified based on the size of the driven wheel 210, spacing of the channels of the driven wheel 210, the number of channels of the driven wheel 210, and/or the size of the drive wheel 220. Additionally or alternatively, the size of the driven wheel 210, spacing of the channels of the driven wheel 210, the number of channels of the driven wheel 210, and/or the size of the drive wheel 220 may be specified based on spacing between teeth of the sprocket 230 and intervals between teeth of the toothed drive chain 120. For example, a given intermittent-motion drive system may include a given drive wheel and a given driven wheel including five channels, and the given intermittent-motion drive system may be coupled to a mounting assembly. One rotation of the given drive wheel may rotate the given driven wheel one-fifth of the circumference of the given driven wheel. A sprocket attached to the given driven wheel may rotate a corresponding length, causing the mounting assembly coupled to the given intermittent-motion drive system to rotate based on the corresponding length.

In some embodiments, the driven wheel 210, the driven axle 215, the drive wheel 220, the drive axle 226, the sprocket 230, and/or the housing 240 may be assembled as the intermittent-motion drive system 200 separate from other components of the mounting assembly 100, such as the drive arc 110 and/or the toothed drive chain 120. In these and other embodiments, a worn and/or corroded component of the intermittent-motion drive system 200 may be replaced by removing the intermittent-motion drive system 200 and replacing the worn and/or corroded component without dismounting the PV module from the mounting assembly 100. In some embodiments, components of the intermittent-motion drive system, such as the driven wheel 210, the driven axle 215, the drive wheel 220, the drive axle 226, the sprocket 230, and/or the housing 240, may be lubricated, such as by lubricating oils, hydraulic fluids, spindle oils, or other machine greases, to reduce corrosion and/or heat generation during operation of the intermittent-motion drive system 200. In these and other embodiments, the housing 240 may enclose other components of the intermittent-motion drive system 200 to facilitate lubrication of the components. For example, the housing 240 may include casing on any of the open faces with gaps or openings for the drive chain 120. In some embodiments, roller bearings may be utilized in addition to or in place of the lubrication. In some embodiments, all of the faces of the housing 240 may include material to provide an enclosure such that only openings for the drive chain 120 are exposed to environmental factors.

Figure 3:
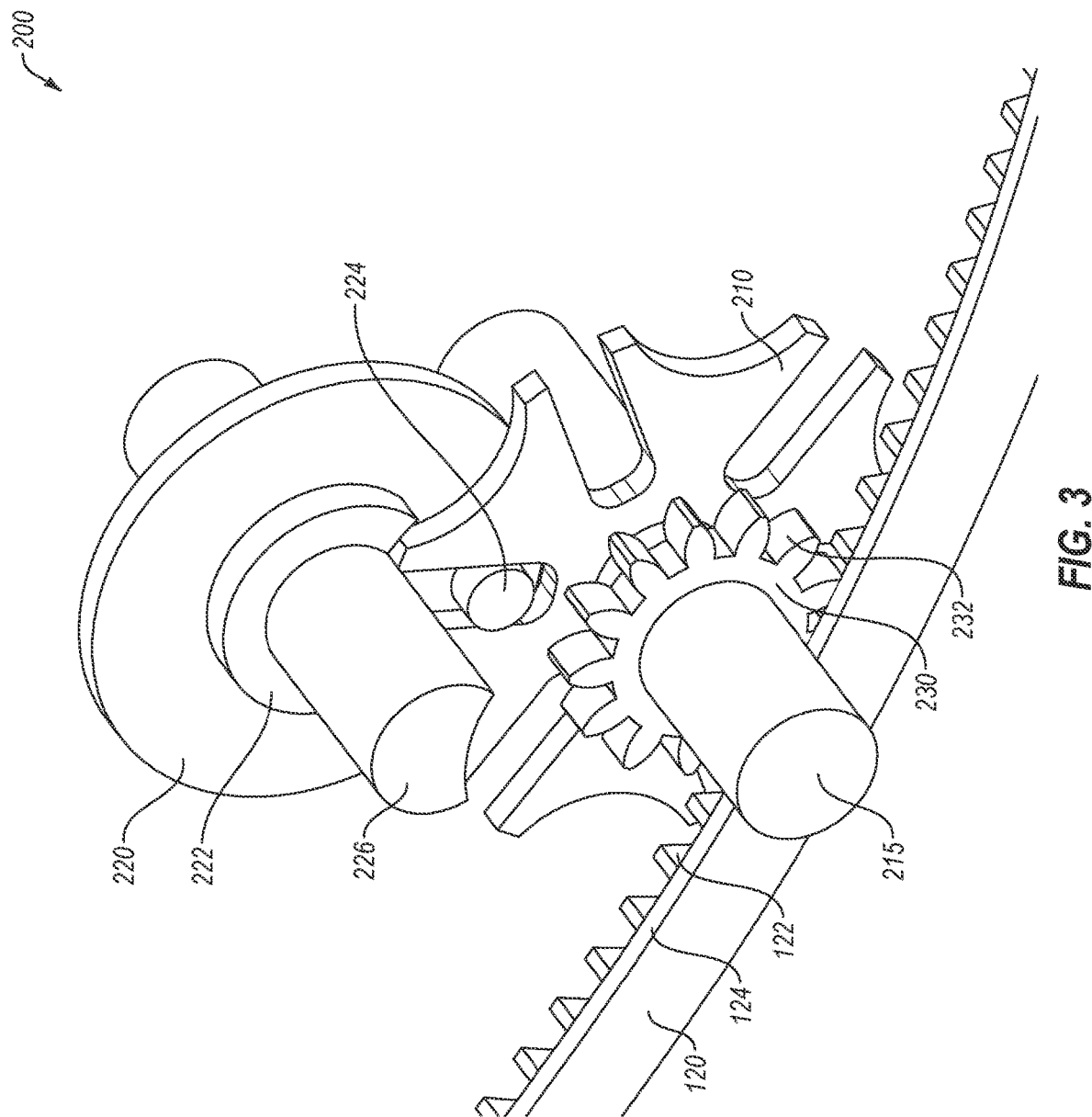
FIG. 3 illustrates a different close-up view of the example embodiment of the intermittent-motion drive system focusing on a driven wheel and a drive wheel of the intermittent-motion drive system according to the present disclosure.

FIG. 3 illustrates a close-up view of an example embodiment of the intermittent-motion drive system 200 without the housing 240 focusing on the drive wheel 220 and the driven wheel 210 of the intermittent-motion drive system 200, in accordance with one or more embodiments of the present disclosure. The drive wheel 220 may include the protrusion 222 that may interface with aspects of the driven wheel 210. In some embodiments, the shape of the protrusion 222 may be at least partially the same or similar to the shape of the drive wheel 220 from which the protrusion 222 extends. Additionally or alternatively, the shape of the protrusion 222 may include a flat edge such that the protrusion 222 includes a semi-circular or semi-polygonal shape.

The shape of the driven wheel 210 may correspond to the shape of the protrusion 222. The shape of the driven wheel 210 at the opening of each channel may be flat or substantially flat such that the driven wheel 210 does not contact the protrusion 222 when the drive pin 224 is inside a given channel (e.g., in a driving position). The shape of the driven wheel 210 between channels may include an arc corresponding to the curvature of the protrusion 222 such that the driven wheel 210 contacts the protrusion 222 when the drive pin 224 is outside of the channels (e.g., in a locking position).

When the drive pin 224 is outside of the channels (e.g., when the protrusion 222 interfaces with arcs of the driven wheel 210 between channels), the driven wheel 210, and by implication the driven axle 215, may be locked relative to the rotation of the drive axle 226. By locking the driven wheel and/or the driven axle 215, a more stable arrangement of the mounting assembly and associated PV modules may be obtained. For example, the drive system, motor, actuator, etc. associated with the drive axle 226 may be disconnected from the forces experienced by the PV module, the drive chain 120, and/or the driven axle 215. For example, when experiencing high winds or other forces by the PV module and/or the mounting assembly that may transfer to the driven axle 215, such forces may be reduced or avoided from acting on the driven axle 226 and its associated components. For example, the relatively large surface area of the protrusion 222 interfacing with the arcs of the driven wheel 210 between channels may distribute such force and prevent them from causing detrimental and/or damaging motions to the driven axle 226 and/or associated components. Additionally or alternatively, the locking position may provide greater rigidity and structural integrity to the overall driving mechanism when in the locking position. For example, the relatively large surface area of the protrusion 222 interfacing with the arcs of the driven wheel 210 between channels may provide a stable and rigid connection such that potential movements between components, rotations back and forth, and/or other similar motions may be mitigated when in the locking position. In these and other embodiments, the mounting assembly may be moved to the locking position (e.g., when the protrusion 222 interfaces with the arcs of the driven wheel 210 between the channels) in times of high loads, such as extremely high winds, heavy snow fall, etc.

By providing the intermittent-motion drive system 200, the PV module orientation may be changed when the drive pin 224 is inside a given channel. Additionally, while the drive pin 224 is outside of any channels and the protrusion 222 is interfacing with the driven wheel 210, various components of the drive system (such as the drive axle 226 and/or an associated motor (not shown)) may be decoupled from the PV module system such that forces such as wind forces or other external forces act on the mounting assembly 100, those forces may not be passed along to or may be reduced as applied to the drive axle 226 and/or the associated motor.

In some embodiments, the toothed drive chain 120 may include portions of varying materials. For example, a portion of the toothed drive chain 120 may include teeth made of a plastic or other composite material while other portions of the toothed drive chain 120 may include teeth made of stainless steel or other metal or other more durable material than the other teeth. In these and other embodiments, the teeth of more durable material may be used as more secure locations/orientations. For example, in circumstances of high-wind or other high forces, the orientation of the PV module may be shifted such that the sprocket 230 is retained in one of the portions with teeth of more durable material. In some embodiments, the toothed drive chain 120 may include multiple portions of the more durable material such that there are multiple orientations at which the PV module may be shifted while still utilizing the teeth of more durable material. Additionally, a lower-cost material may be used to manufacture the remainder of the teeth. In these and other embodiments, teeth in one or more first sections of the toothed drive chain 120 may be made using the more durable material, while one or more second sections may be made using the lower-cost (and less durable) material. As such, using the more durable materials to make particular sections of the toothed drive chain 120 may facilitate more precise and/or minute adjustments within the angles corresponding to the sections made of the more durable material.

Figure 4B:
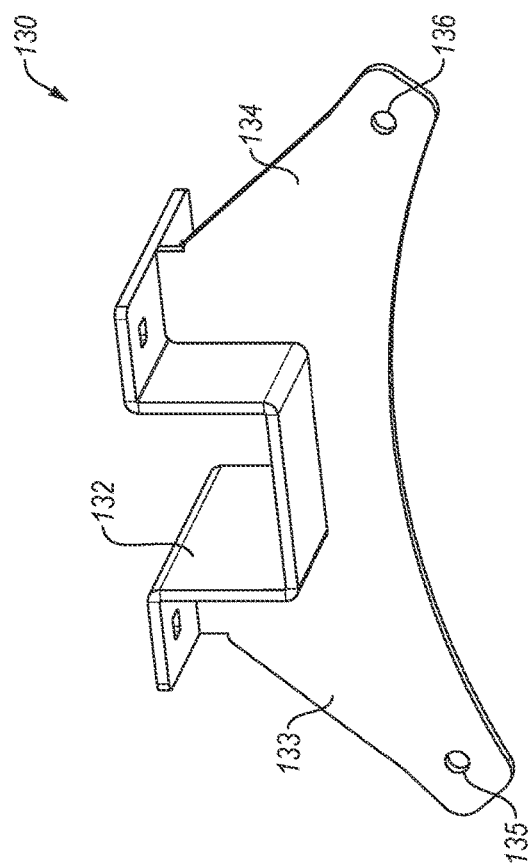
FIG. 4B illustrates a close-up view of a bottom section of the ring according to the present disclosure.
Figure 4A:
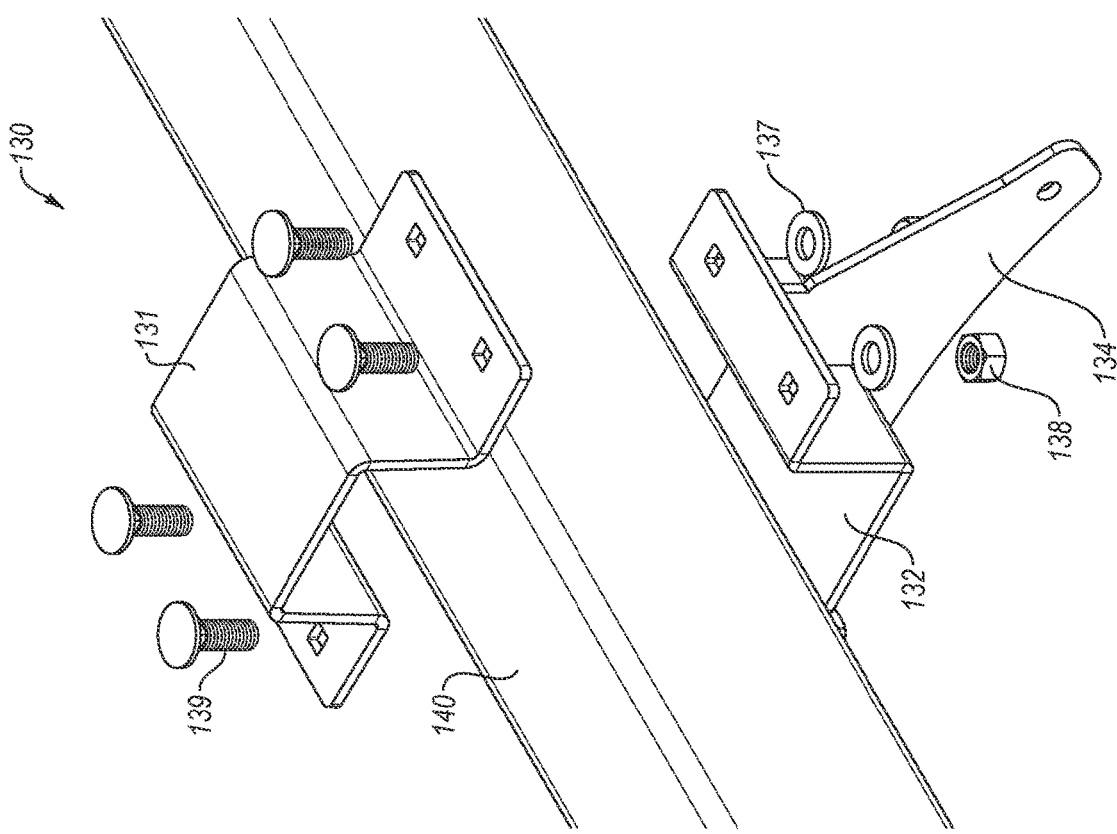
FIG. 4A illustrates an exploded view of a ring defining a torsion beam aperture according to the present disclosure.

FIG. 4A illustrates an exploded view of the ring 130 defining the torsion beam aperture according to the present disclosure. The ring 130 may include the top section 131, the bottom section 132, the first connecting member 133, and the second connecting member 134 as described above in relation to FIG. 1. In some embodiments, the top section 131 and the bottom section 132 may be separate components. In these and other embodiments, the top section 131 and/or the bottom section 132 may include openings through which fasteners may extend to secure the top section 131 to the bottom section 132. For example, the top section 131 and/or the bottom section 132 may include openings through which screws 139 may extend. The screws 139 may be secured in the openings by washers 137 and nuts 138 positioned below the openings of the bottom section 132. In some embodiments, a torsion beam 140 may be positioned such that the bottom section 132 of the ring 130 partially encompasses a lower region of the torsion beam 140, and the top section 131 partially encompasses an upper region of the torsion beam 140. The torsion beam 140 may be coupled to the mounting assembly 100 by positioning the torsion beam 140 in the bottom section 132 of the ring 130 and fastening the top section 131 to the bottom section 132.

FIG. 4B illustrates a close-up view of the bottom section 132 of the ring 130 according to the present disclosure. As described above, the bottom section 132 may include the first connecting member 133, which may be coupled to the first leg 111 of the drive arc 110, and the second connecting member 134, which may be coupled to the second leg 112 of the drive arc 110. In some embodiments, the first connecting member 133 may include a first opening 135 through which a fastener, such as a screw or a bolt, may extend such that the first connecting member 133 of the ring 130 interfaces with the first leg 111 of the drive arc 110. In these and other embodiments, the second connecting member 134 may include a second opening 136 through which a fastener may extend such that the second connecting member 134 of the ring 130 interfaces with the second leg 112 of the drive arc 110.

FIG. 5A illustrates a close-up view of a support-beam mounting bracket 160 for the intermittent-motion drive system 200 according to the present disclosure. The support-beam mounting bracket 160 may include a central section 161, one or more mounting surfaces, such as a first mounting surface 162 and/or a second mounting surface 163, one or more openings 164, one or more washers 165, and one or more nuts 166. In some embodiments, the support-beam mounting bracket 160 may be coupled to a support beam 150 by one or more binding rods 155. The intermittent-motion drive system 200 may be coupled to the support-beam mounting bracket 160 such that the intermittent-motion drive system 200 is secured to the support beam 150 to which the support-beam mounting bracket 160 is coupled.

In some embodiments, the support-beam mounting bracket 160 may include a flat or substantially flat central section and one or more depressed edges such that the central section of the support-beam mounting bracket 160 is elevated relative to the one or more depressed edges. The one or more depressed edges may include the first mounting surface 162, the second mounting surface 163, and/or additional mounting surfaces. In some embodiments, the first mounting surface 162 and/or the second mounting surface 163 may include one or more openings 164 through which the one or more binding rods 155 may extend. In some embodiments, the binding rod 155 may include a U-shaped bolt capable of extending through the openings 164. In these and other embodiments, the binding rod 155 may include threaded ends such that one of the nuts 166 may be fastened to one of the threaded ends of the binding rod 155. The support-beam mounting bracket 160 may be positioned against the support beam 150 such that the first mounting surface 162 and/or the second mounting surface 163 are positioned flush against the support beam 150. In some embodiments, the openings 164 may include two openings positioned along the first mounting surface 162 and/or the second mounting surface 163. The two openings may include a spacing between the two openings longer than a width of the support beam 150. The binding rod 155 may include a width corresponding to the spacing between the two openings such that the binding rod 155 may interface with one or more edges of the support beam 150 when the binding rod extends through the openings 164. The binding rod 155 may be secured by the washers 165 and the nut 166 such that the support-beam mounting bracket 160 is fastened against the support beam 150.

The intermittent-motion drive system 200 may be attached to the support-beam mounting bracket 160. In some embodiments, the housing 240 of the intermittent-motion drive system 200 may include a driveline mounting bracket 241 capable of interfacing with the support-beam mounting bracket 160. The driveline mounting bracket 241 may include a protrusion securely coupled to the housing 240, such as by welding, gluing, bolting, or other coupling technique, and extending from the housing 240 in a direction parallel to or substantially parallel to the orientation of the housing 240 with respect to one or more openings 240a and/or 240b of the housing 240 through which the driven axle 215 and/or the driven axle 226 may extend.

Figure 5B:
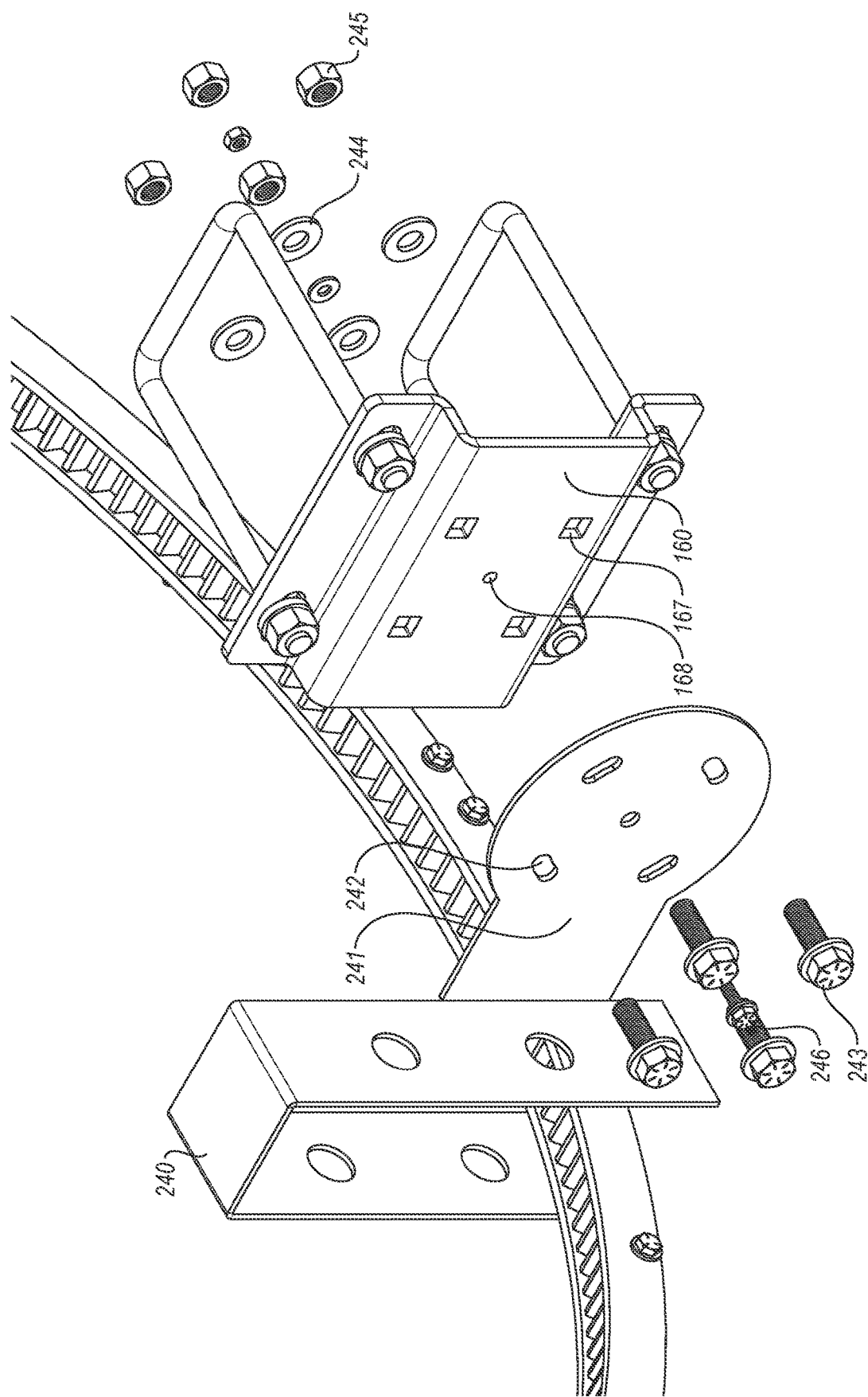
FIG. 5B illustrates an exploded view of the mounting device for the intermittent-motion drive system according to the present disclosure.

FIG. 5B illustrates an exploded view of the support-beam mounting bracket 160 for the intermittent-motion drive system 200 according to the present disclosure. In some embodiments, the driveline mounting bracket 241 may include one or more openings 242 through which fasteners 243 may extend. The support-beam mounting bracket 160 may include one or more openings 167 in which the fasteners 243 may interface after extending through the openings 242 of the driveline mounting bracket 241. The fasteners 243 may be secured to the support-beam mounting bracket 160 by washers 244 and nuts 245 positioned flush against a back surface of the support-beam mounting bracket 160. Additionally or alternatively, the support-beam mounting bracket 160 may include a central opening 168 in which a central rivet 246 may interface. The central rivet 246 may facilitate rotation of the driveline mounting bracket 241 for alignment with the support-beam mounting bracket 160, the drive arc 110, the toothed drive chain 120, and/or other components of the mounting assembly 100. Such rotation may include the fasteners 243 sliding within the openings 242. For example, in some embodiments, the driveline mounting bracket 241 may rotate a predetermined amount based on the fasteners 243 sliding within the openings 242 about the central rivet 246 such that an orientation of the driveline mounting bracket 241 may be changed. In these and other embodiments, changing the orientation of the driveline mounting bracket 241 may thereby change the orientation of the intermittent-motion drive system 200.

Figure 6:
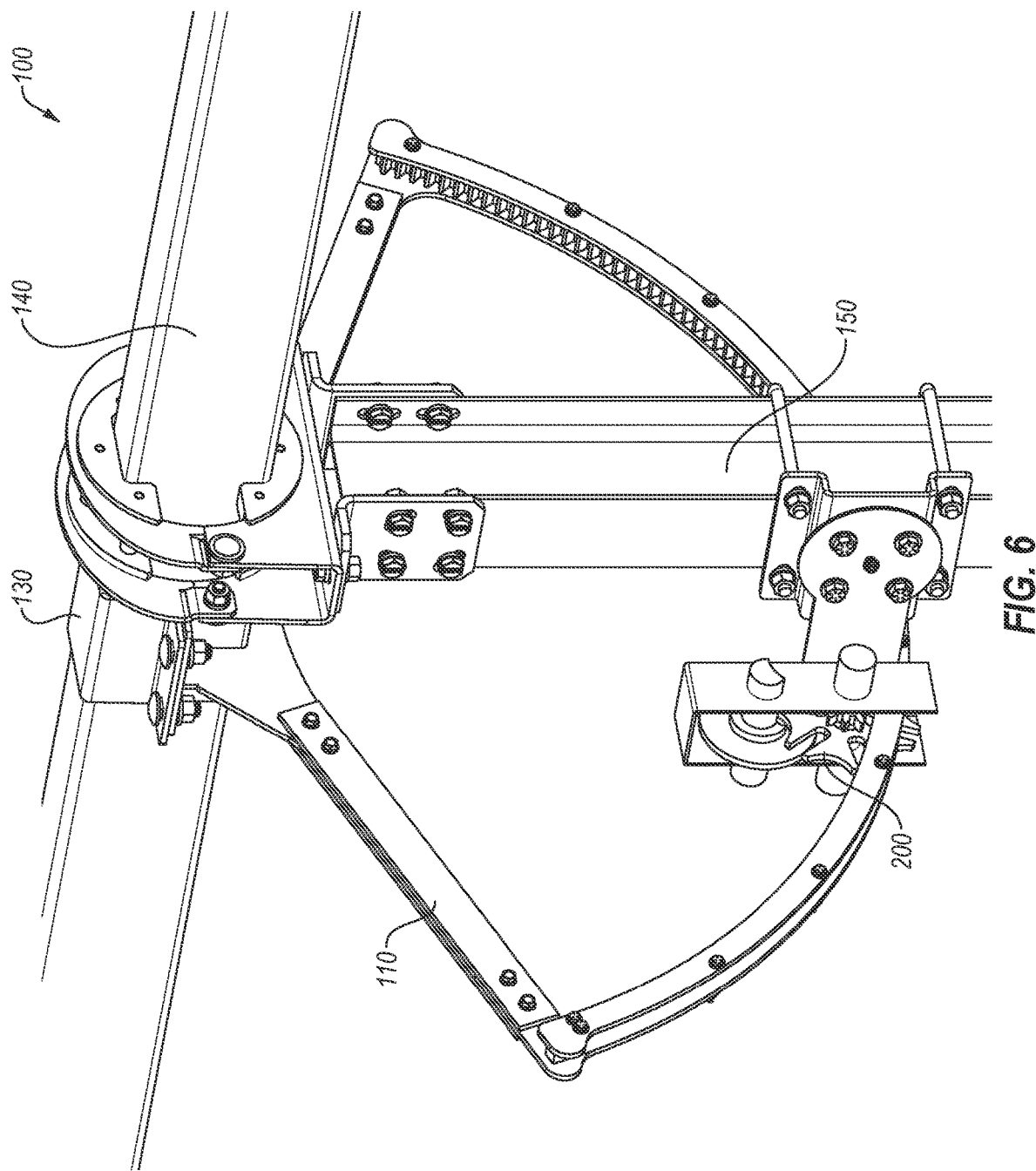
FIG. 6 illustrates the example embodiment of the mounting assembly including the intermittent-motion drive system coupled to a support column and a torsion beam according to the present disclosure.

FIG. 6 illustrates a perspective view of the example embodiment of the mounting assembly 100 including the intermittent-motion drive system 200 coupled to a support beam 150 and a torsion beam 140 according to the present disclosure.

In some embodiments, the mounting assembly 100 may include a bushing 145 at the interface between the torsion beam 140 and the support beam 150. For example, as the arced connecting member 115 rotates due to driving via the intermittent-motion drive system 200, the torsion beam 140 may also rotate relative to the support beam 150. The bushing 145 may facilitate rotation of the torsion beam 140 while still being supported by the support beam 150.

Figure 7:
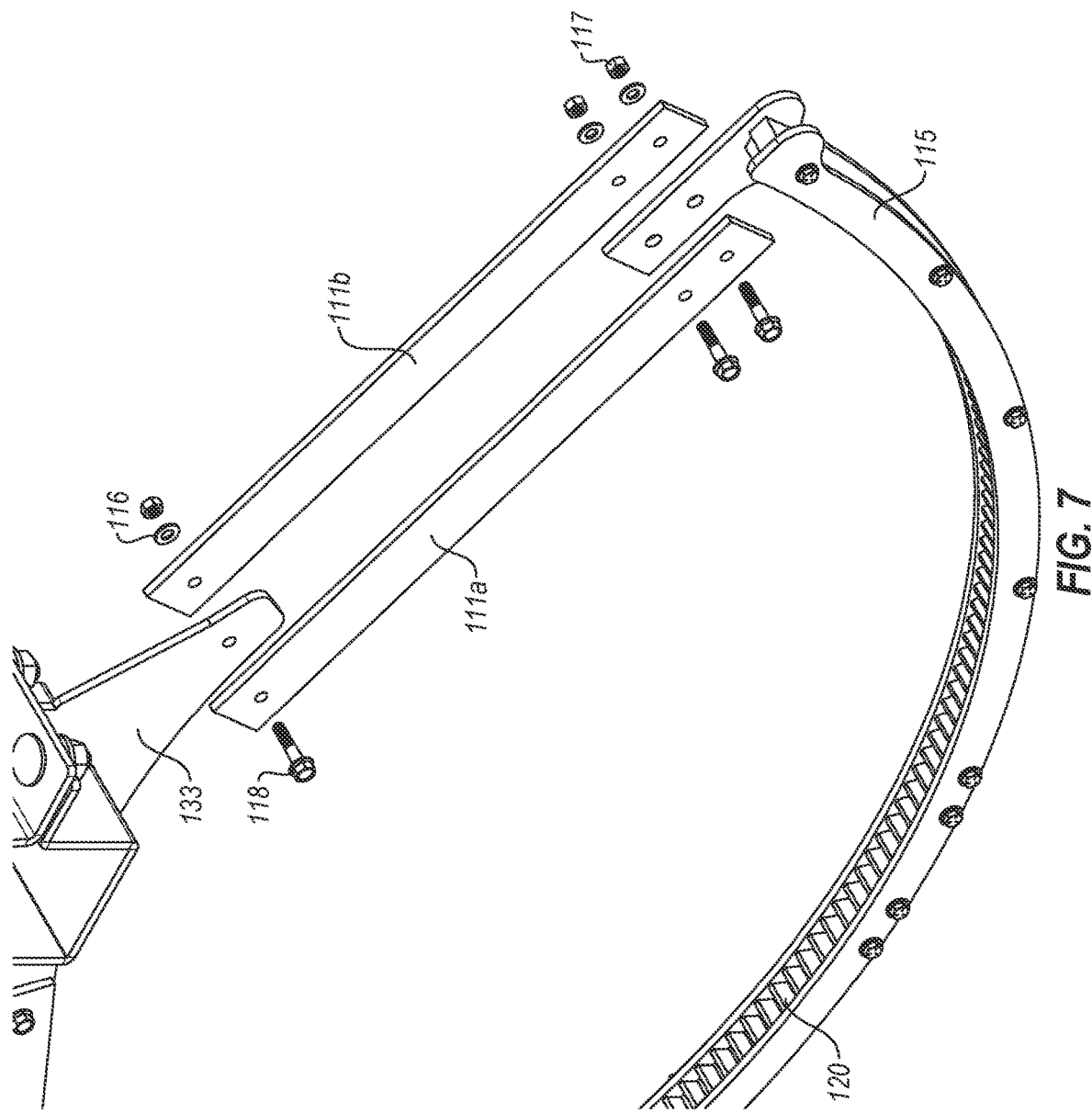
FIG. 7 illustrates an exploded view of a drive arc of the mounting assembly according to the present disclosure.

FIG. 7 illustrates an exploded view of the drive arc 110 of the mounting assembly 100 according to the present disclosure. In some embodiments, the drive arc 110 may include a first leg section 111a and a second leg section 111b. The first leg section 111a may be positioned such that a first end of the first leg section 111a is positioned flush against a first surface of the first connecting member 133 of the bottom section 132 of the ring 130. A second end of the first leg section 111a may be positioned flush against a first surface of an end of the arced connecting member 115. A first end of the second leg section 111b may be positioned flush against a second surface of the first connecting member 133 opposite to the first surface. A second end of the second leg section 111b may be positioned flush against a second surface of the end of the arced connecting member 115. The first end of the first leg section 111a, the first end of the second leg section 111b, the second end of the first leg section 111a, and/or the second end of the second leg section 111b may include one or more openings through which a fastener 118 may extend. The fastener 118 may be locked in place by one or more washers 116 and/or one or more nuts 117. By coupling the various components together, the first connecting member 133 of the bottom section 132, the first leg section 111a, the second leg section 111b, and/or the arced connecting member 115 may move and operate as a single body.

FIG. 8 illustrates an exploded view of the arced connecting member 115 and the toothed drive chain 120 of the mounting assembly 100 according to the present disclosure. The arced connecting member 115 may include a first arced connecting section 115a, a second arced connecting section 115b, the toothed drive chain 120, one or more bolts 123 and/or rivets, and one or more nuts 125. In some embodiments, the first arced connecting section 115a and/or the second arced connecting section 115b may include one or more openings through which the one or more bolts 123 may extend. In these and other embodiments, the toothed drive chain 120 may be positioned between the first arced connecting section 115a and the second arced connecting section 115b. The one or more bolts 123 may fasten the first arced connecting section 115a to the second arced connecting section 115b such that the toothed drive chain 120 is interposed between the first arced connecting section 115a and the second arced connecting section 115b. The one or more bolts 123 may enter the openings of the arced connecting sections from a first surface, and the one or more nuts 125 may be inserted on the one or more bolts 123 from a second surface opposite to the first surface such that the first arced connecting section 115a and the second arced connecting section 115b are secured to one another. By coupling the various components together, the components illustrated in FIG. 7, the first arced connecting section 115a, the second arced connecting section 115b, and/or the toothed drive chain 120 may all move and operate as a single body.

Figure 9:
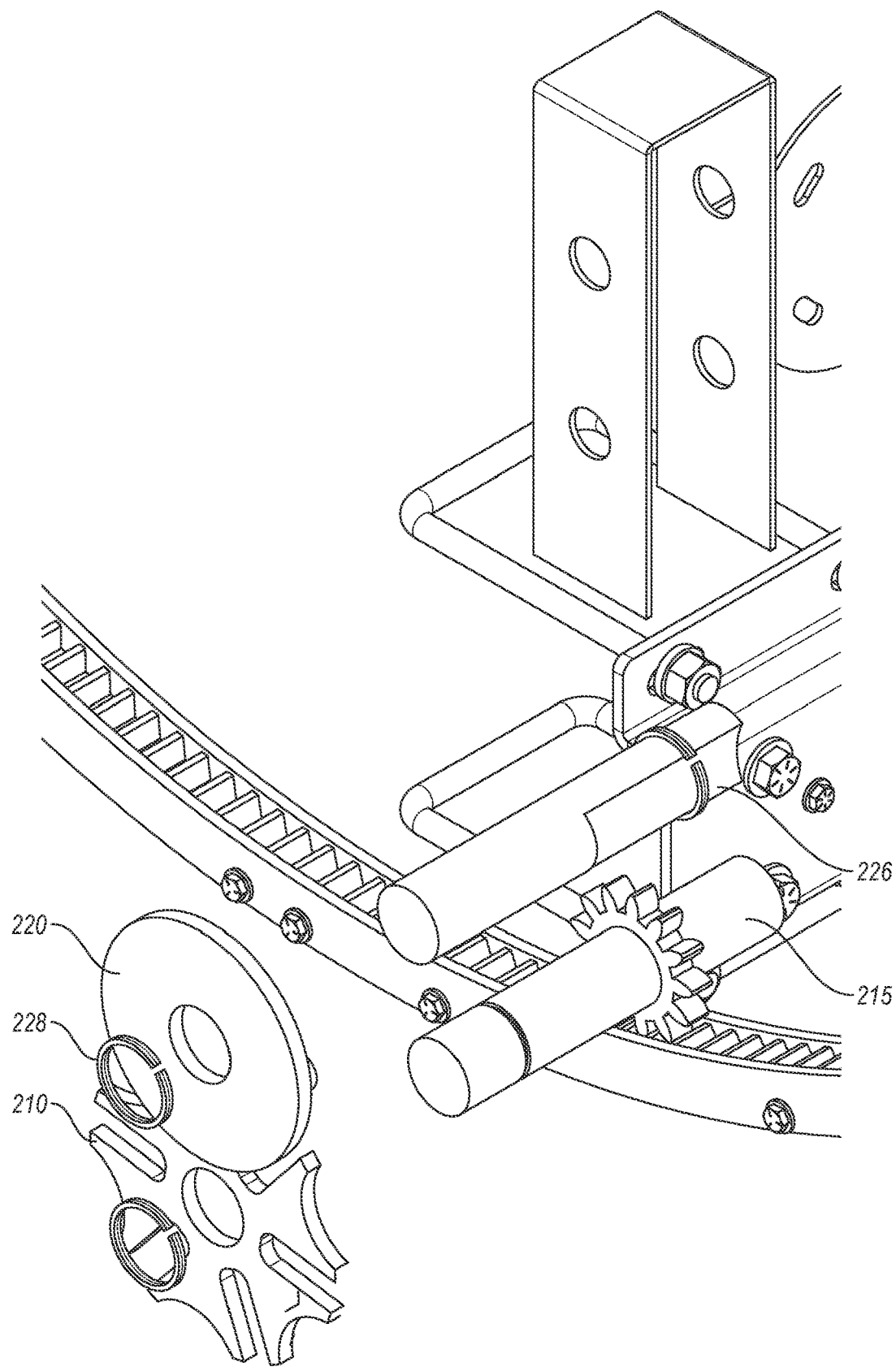
FIG. 9 illustrates an exploded view of the intermittent-motion drive system according to the present disclosure.

FIG. 9 illustrates an exploded view of the intermittent-motion drive system 200 according to the present disclosure. The intermittent-motion drive system 200 may include one or more washers 228 positioned along the driven axle 215 and/or the drive axle 226. In some embodiments, one of the washers 228 may be positioned flush against a first surface of the driven wheel 210, and one of the washers 228 may be positioned flush against a second surface of the driven wheel 210 opposite to the first surface. In these and other embodiments, one of the washers 228 may be positioned flush against a first surface of the drive wheel 220, and one of the washers 228 may be positioned flush against a second surface of the drive wheel 220 opposite to the first surface.

Figure 10A:
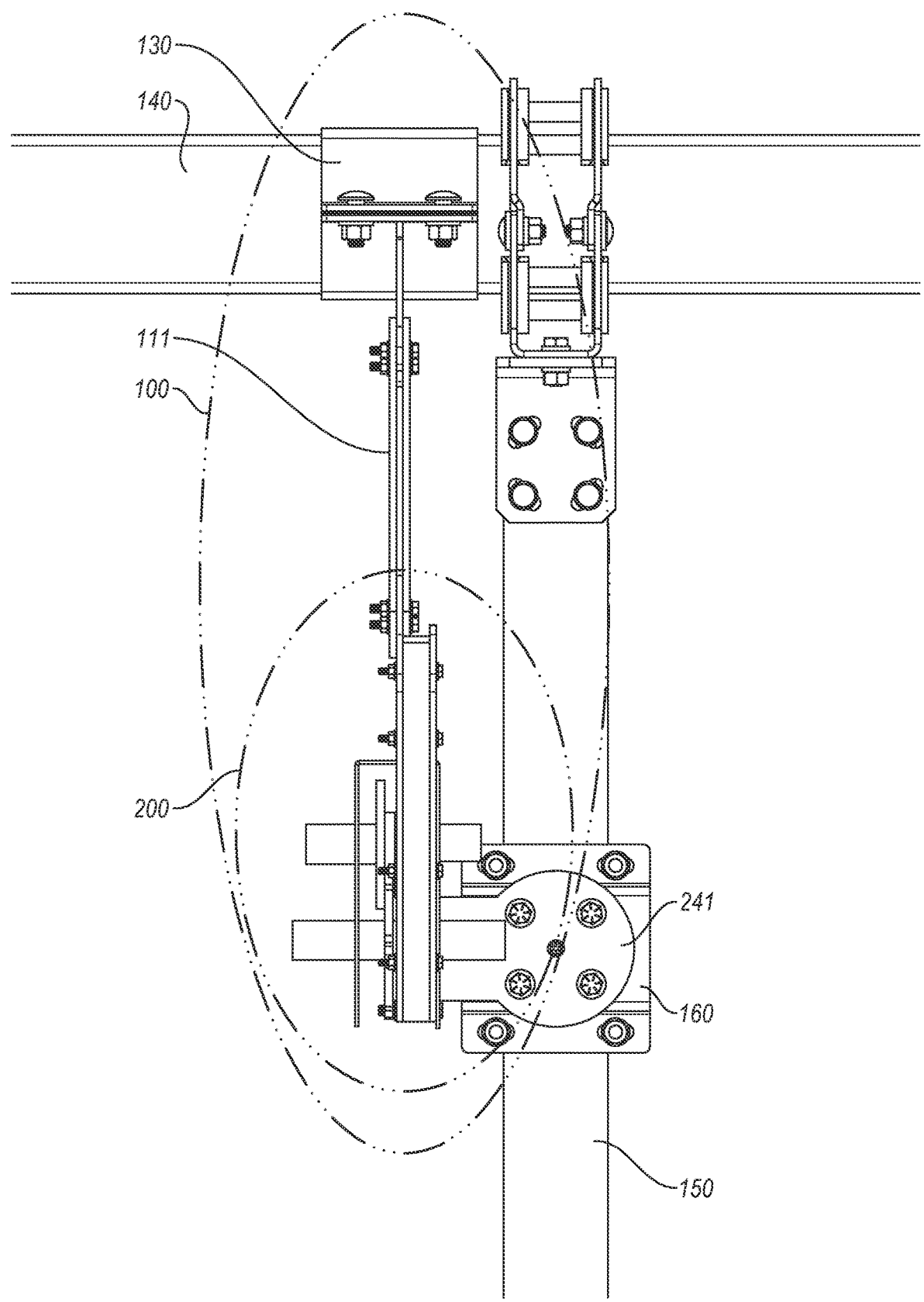
FIG. 10A illustrates a front view of the mounting assembly coupled to the support column and the torsion beam according to the present disclosure.

FIG. 10A illustrates a front view of the mounting assembly 100 coupled to the support beam 150 and the torsion beam 140 according to the present disclosure. The mounting assembly 100 illustrated in FIG. 10A may be the same as or a similar mounting assembly to the mounting assembly 100 illustrated in FIGS. 1-9.

Figure 10B:
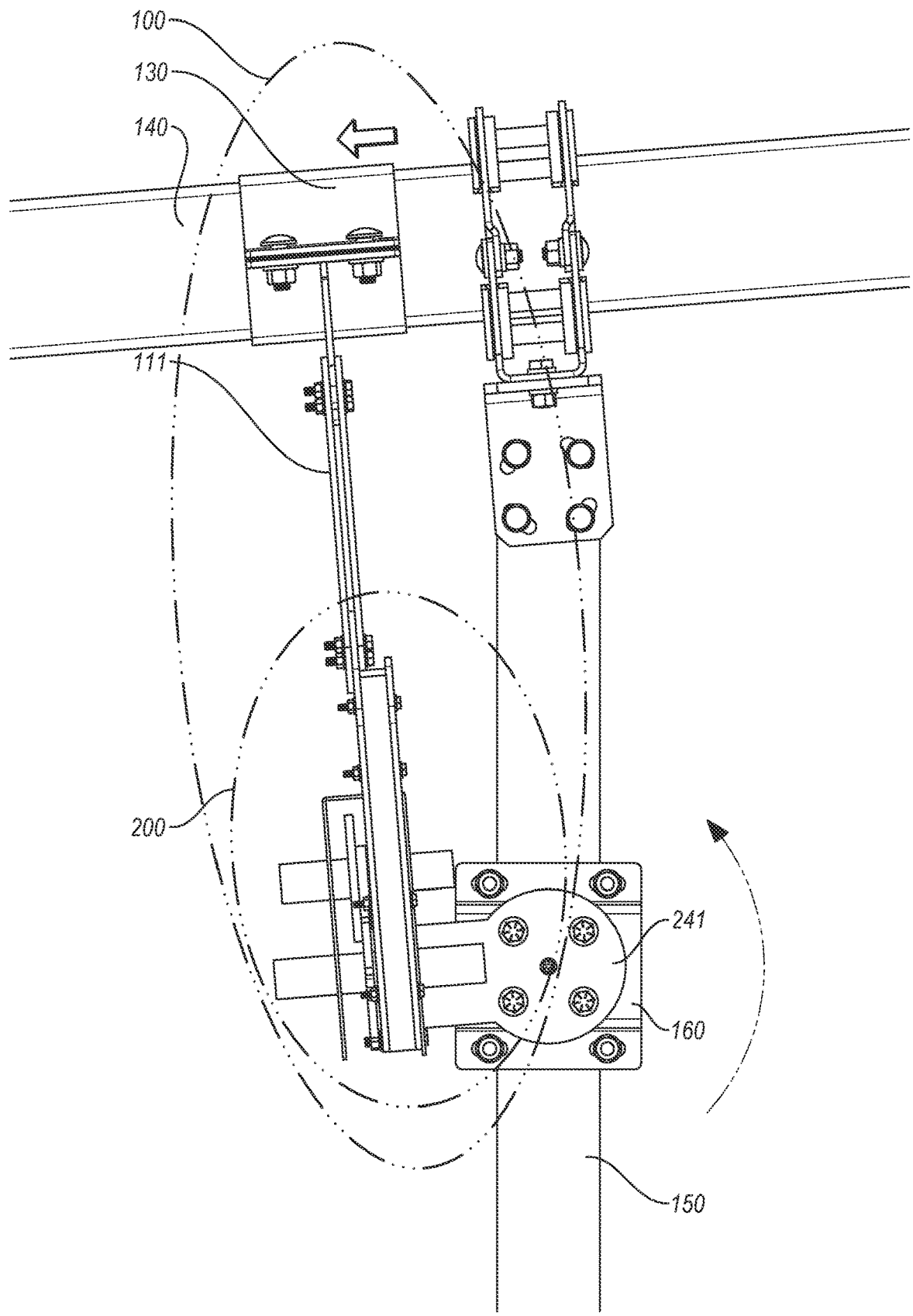
FIG. 10B illustrates the front view of the mounting assembly in which the mounting assembly is engaged to adjust an orientation of the torsion beam.

FIG. 10B illustrates the front view of the mounting assembly 100 in which the mounting assembly 100 is engaged to adjust an orientation of the torsion beam 140. In some embodiments, the driveline mounting bracket 241 and/or the support-beam mounting bracket 160 may rotate to affect a corresponding rotation of the orientation of the mounting assembly 100. The ring 130 may slide along the torsion beam 140 due to the change in orientation of the mounting assembly 100 and cause the torsion beam 140 to tilt. In these and other embodiments, the torsion beam 140 may tilt in a direction perpendicular to the direction of rotation of the torsion beam 140 affected by operation of the intermittent-motion drive system 200. For example, operation of the intermittent-motion drive system 200 including engagement of the sprocket 230 with the toothed drive chain 120 may affect rotation of the torsion beam 140 in an East-West direction, while rotation of the driveline mounting bracket 241 and/or the support-beam mounting bracket 160 may tilt the torsion beam 140 in a North-South direction. In some embodiments, such tipping may accommodate a slope in the ground surface such that the driven axle and/or the drive axle may run generally parallel to the sloped ground while the support beam 150 may run vertically but may not be normal to the slope of the ground.

Figure 11A:
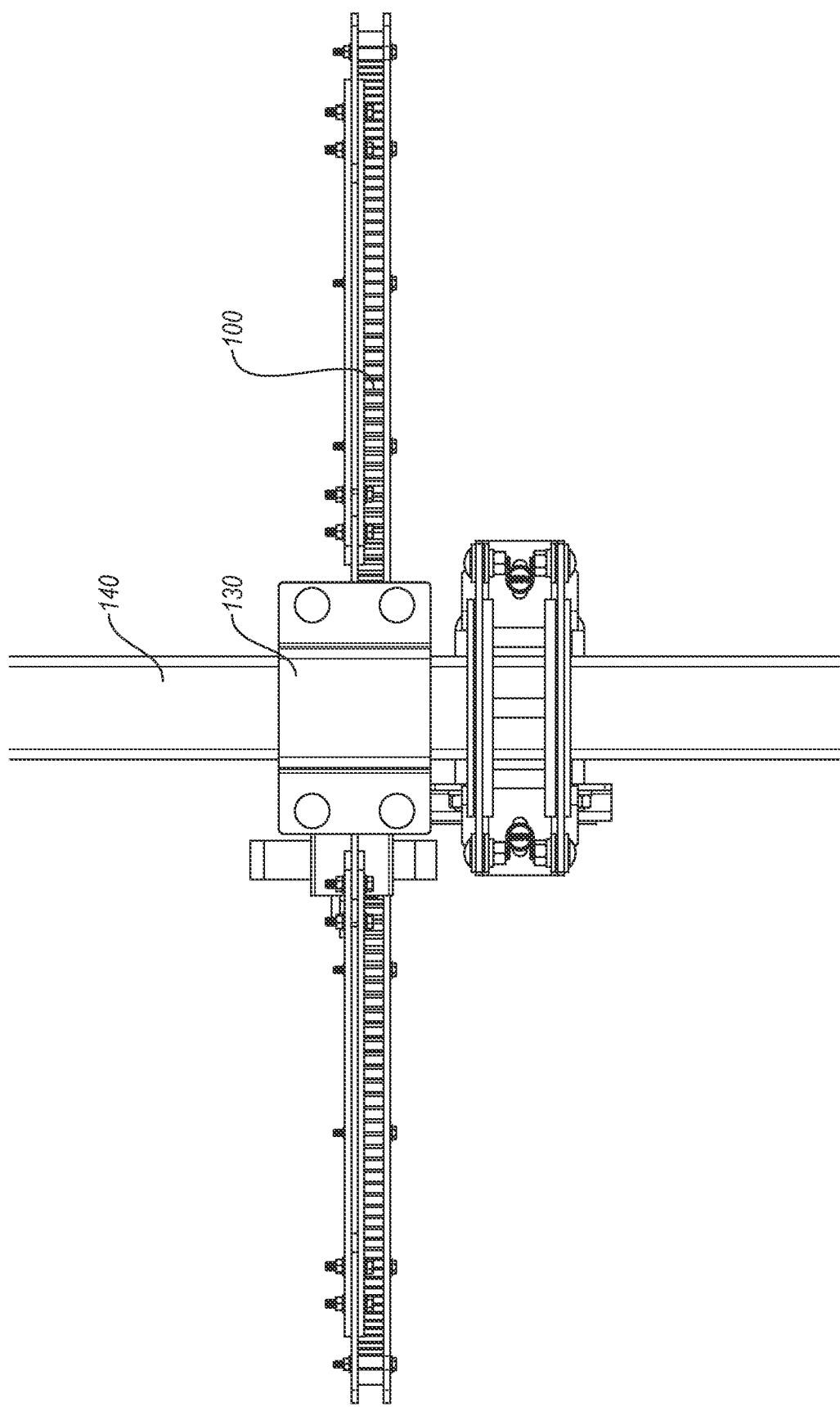

FIGS. 11A-11C illustrate perspective views of the mounting assembly 100 mounted to the support beam 150 and the torsion beam 140 according to the present disclosure. FIG. 11A illustrates a top view of the mounting assembly 100 mounted to the support beam 150 and the torsion beam 140. FIG. 11B illustrates a side view of the mounting assembly 100 mounted to the support beam 150 and the torsion beam 140. FIG. 11C illustrates an isometric view of the mounting assembly 100 mounted to the support beam 150 and the torsion beam 140. The perspective views of the mounting assembly 100 mounted to the support beam 150 and the torsion beam 140 illustrated in FIGS. 11A-11C may include the drive arc 110, first leg 111, the second leg 112, the toothed drive chain 120, the ring 130, the support-beam mounting bracket 160, and/or the intermittent-motion drive system 200.

FIG. 12 illustrates an example drive chain 1200 including varying materials, in accordance with one or more embodiments of the present disclosure. The drive chain 1200 may include one or more portions 1221 (such as the portions 1221a and 1221b) that may be made of a low cost and/or flexible material such as a plastic or polymer. Such portions may include additives such as fibers or surface treatments to increase the strength of the plastic. The drive chain 1200 may include a rigid portion 1222 that may be manufactured using a high strength material, such as stainless steel.

In some embodiments, the drive chain 1200 may include multiple rigid portions 1222 at various positions along the length of the drive chain. By using a rigid material, the drive chain 1220 may include portions of increase stability and structural strength. For example, if high wind speeds are experienced or expected, the drive chain 1200 may be turned until a gear driving the drive chain 1200 is interfacing with the drive chain 1200 in one of the rigid portions 1222.

Figure 13A:
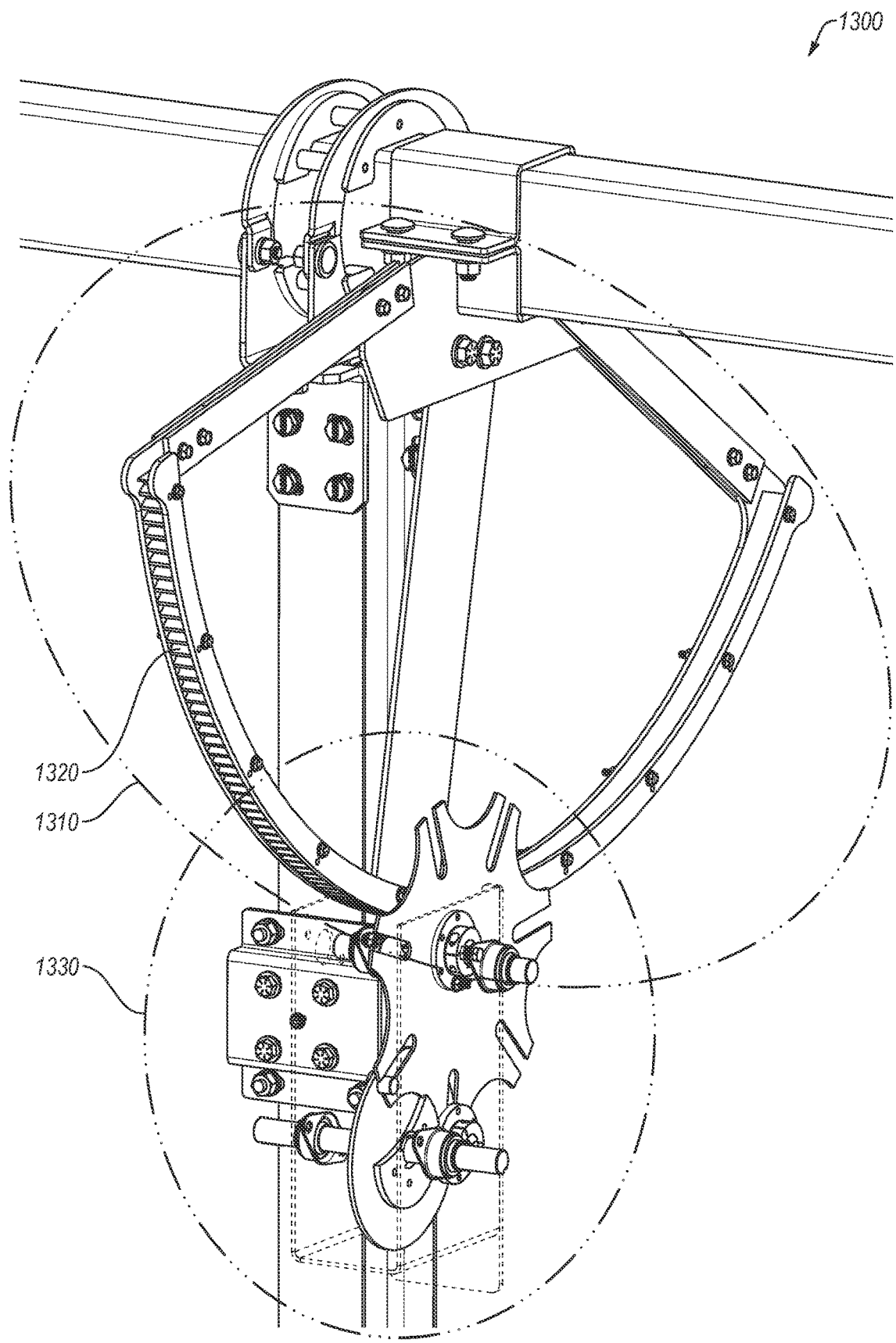
FIGS. 13A and 13B illustrate another example mounting assembly with an example intermittent-motion drive system mounted differently.
Figure 13B:
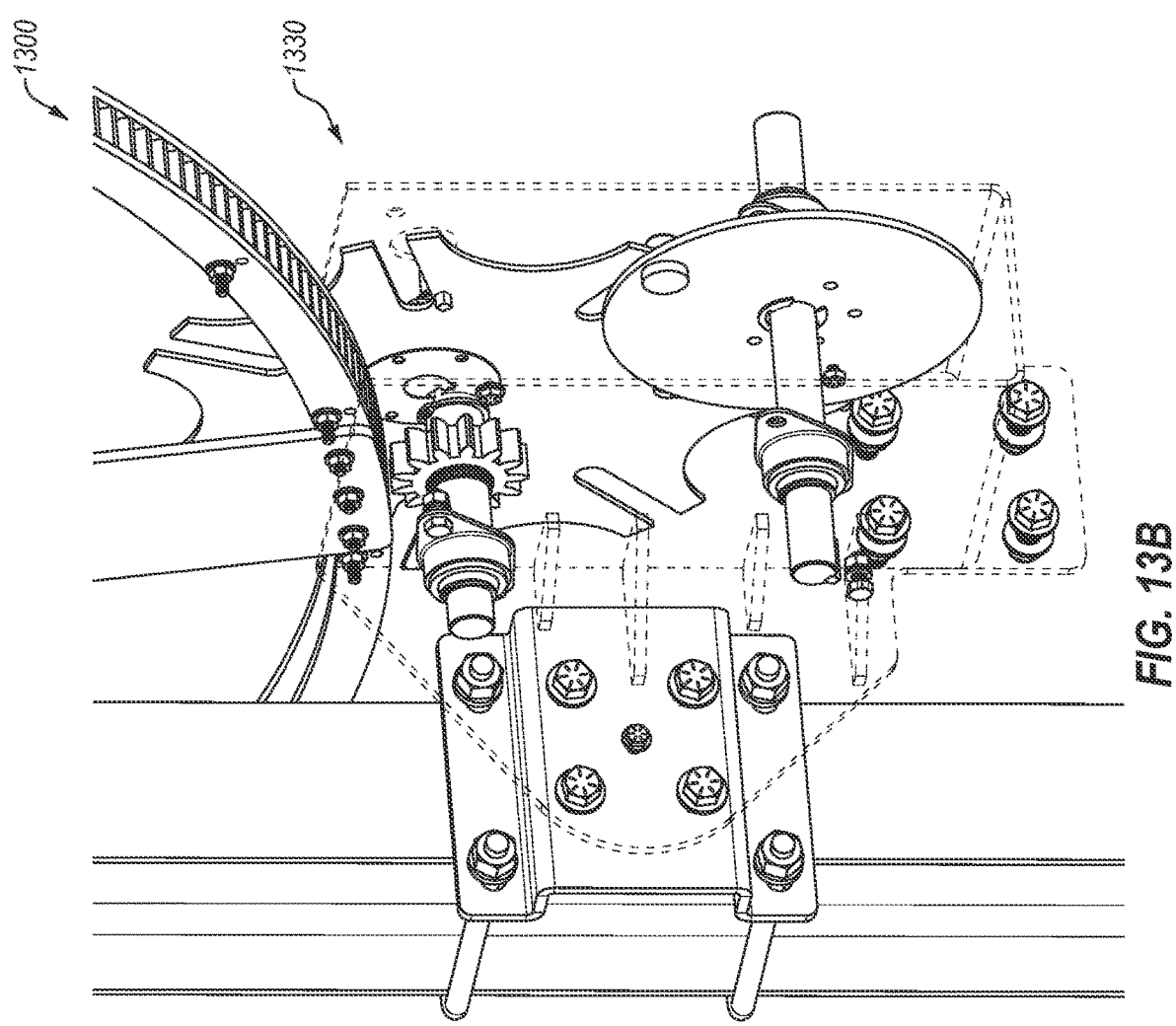

FIGS. 13A and 13B illustrate another example mounting assembly 1300 with an example intermittent-motion drive system 1330 mounted differently, in accordance with one or more embodiments. The mounting assembly 1300 may include a drive arc 1310 with a toothed drive chain 1320 with teeth on the outside face of the drive arc 1310 rather than on the inside surface as illustrated in the embodiment shown in FIG. 1. To accommodate the teeth on the outside surface of the drive arc 1310, the intermittent-motion drive system 1330 may be mounted at a position outside of the drive arc 1310 (e.g., between the drive arc 1310 and the ground) rather than inside of the drive arc 1310.

In these and other embodiments, one or more of the components of the mounting assembly 1300 may be similar or comparable to other similarly named elements of the present disclosure. For example, the drive arc 1310 may be similar or comparable to the drive arc 110, the drive chain 1320 may be similar or comparable to the drive chain 120, and/or the intermittent-motion drive system 1330 may be similar or comparable to the intermittent-motion drive system 200.

Figure 14B:
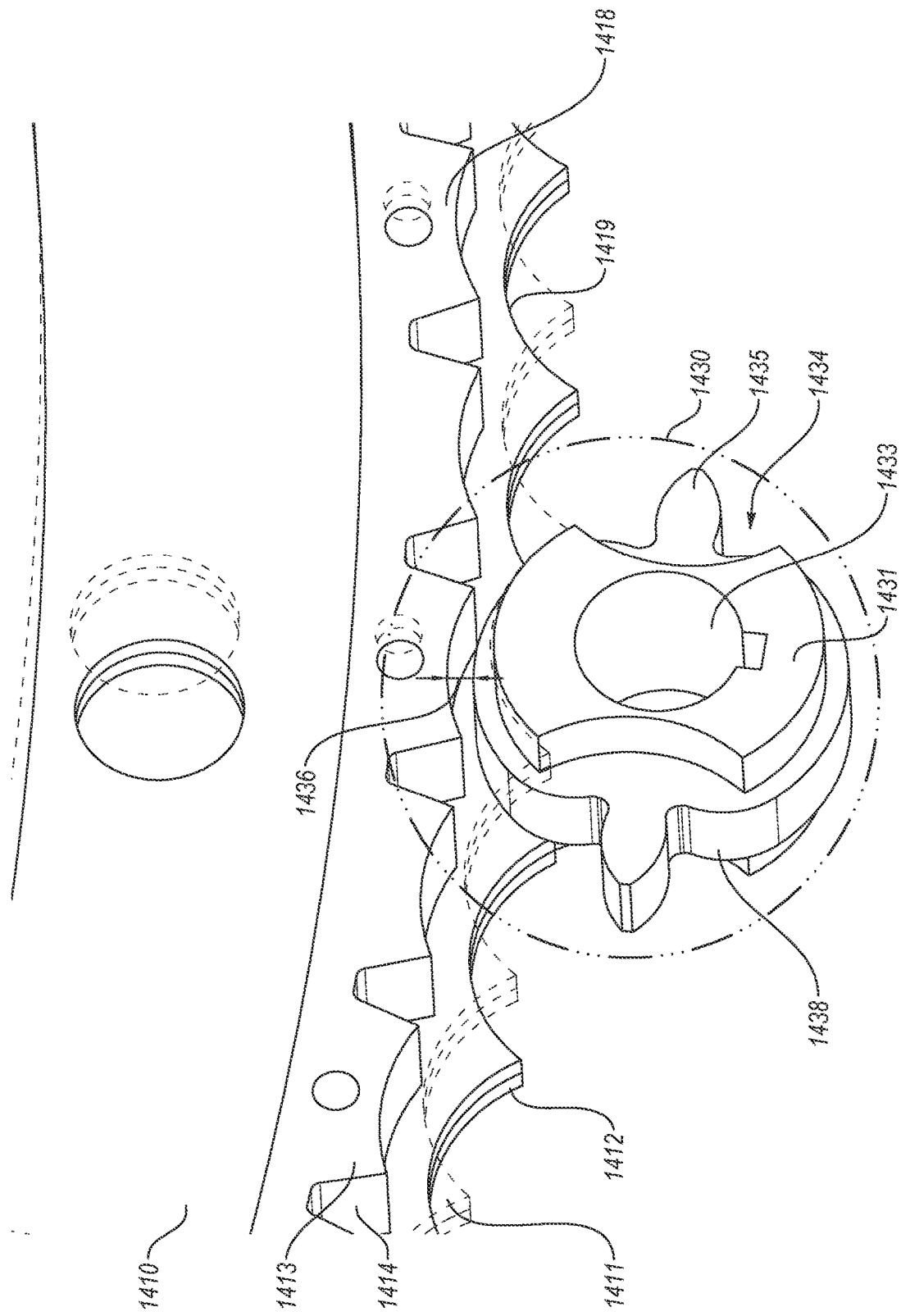

FIG. 14A illustrates a third example embodiment of a mounting assembly 1400 including a multi-point lock internally geared (e.g., intermittent motion) drive system 1430 according to the present disclosure. The mounting assembly 1400 may include an arced connecting member 1410 that connects a first leg 1415 and a second leg 1416 to a support structure 1417 such that movement of the arced connecting member 1410 results in corresponding movements of the first leg 1415 and the second leg 1416, which in turn affects movement and/or rotation of the support structure 1417. In some embodiments, the support structure 1417 may include a ring-based structure that is configured such that a torsion beam or any other support beam may be inserted through an aperture of the ring-based structure as described in relation to the ring 130 of FIG. 1. The arced connecting member 1410 may be rotated by the intermittent-motion drive system 1430, which may interface with the arced connecting member 1410 as described in relation to FIGS. 14B-14D.

In some embodiments, the mounting assembly 1400 may include a reinforcement member 1420 that provides structural support for one or more components of the mounting assembly 1400, including the arced connecting member 1410, the first leg 1415, the second leg 1416, the intermittent-motion drive system 1430, and/or any part of the support structure 1417. The reinforcement member 1420 may include a sheet, beam, or any other type of connector that joins the components of the mounting assembly 1400. The reinforcement member 1420 may be composed of a rigid material, such as stainless steel, cast iron, carbon fiber, polyethylene terephthalate, or any other metals or plastics, such that the reinforcement member 1420 is a stiff supporting piece for other components of the mounting assembly 1400. Additionally or alternatively, the reinforcement member 1420 may be a readily replaceable component composed of a more flexible material, such as copper, polyvinyl chloride, or any other metals or plastics, such that the reinforcement member 1420 may facilitate shock and/or vibration absorption for the mounting assembly 1400.

In these and other embodiments, a shape of the reinforcement member 1420 may be dependent on to which components of the mounting assembly 1400 the reinforcement member 1420 is attached. For example, the reinforcement member 1420 may include a triangular shape as shown in FIG. 14A because the reinforcement member 1420 is connected to (via, for example, a bolt, screw, nut, or any other fastener) the first leg 1415, the second leg 1416, and the arced connecting member 1410. As another example, the reinforcement member 1420 may include a rectangular shape to facilitate connection to the first leg 1415, the second leg 1416, the support structure 1417, and the arced connecting member 1410. Because the intermittent-motion drive system 1430 is positioned underneath the arced connecting member 1410, the reinforcement member 1420 may be positioned in the space between the support structure 1417 and the intermittent-motion drive system 1430 without obstructing movement of the arced connecting member 1410 and/or rotation of the intermittent-motion drive system 1430.

In some embodiments, the first and second protrusions 1431 and/or 1432 may be sized to interface with both the initial layer of the drive chains 1411 and/or 1412 and any additional layers. Doing so may provide a decrease in material costs as only portions of the drive chains 1411/1412 may be reinforced with additional layers. As such, the first and/or second drive chains 1411 and/or 1412 may include one or more reinforced portions of the drive chains. For example, one or more regions of the first and/or second drive chains 1411 and/or 1412 may include a second layer of material, such as a reinforcement plate 1425, for extra locking strength, extra reinforcement, and/or extra rigidity. The reinforcement plate 1425 and/or any other additional layers may be coupled to the main layer in any manner, such as by welding, adhesives, bolting, or other coupling technique.

In these and other embodiments, a length of the reinforcement plate 1425 may correspond to a range of stowing angles of the mounting assembly 1400. Such regions corresponding to the reinforcement plate 1425 may correspond to stow regions or areas within which the PV modules may continue to track (e.g., corresponding to +/−10 degrees from horizontal (one region), +/−10 degrees in addition to a span of 15-25 degrees in each direction (three regions), or any other similar or comparable ranges or number of ranges). If excessive forces are experienced by a tracking system associated with the mounting assembly 1400, the tracking system may elect to stow the PV modules associated with the mounting assembly 1400 to a nearly horizontal position. The tracking system may permit rotation/tracking within the region or at the angles that are covered by the reinforcement plate 425 (e.g., +/−10 degrees from horizontal). Following this example, a longer reinforcement plate 1425 may facilitate a wider range of tracking within the stowing range and/or correspond to a wider range of stowing angles, while a shorter reinforcement plate 1425 may reduce the range of stowing angles.

Additionally or alternatively, multiple reinforcement plates 1425 may be coupled at different points along the arced connecting member 1410 to provide multiple discrete ranges of stowing angles of the mounting assembly 1400 (e.g., one range at −25 to −30 degrees, one range at +/−10 degrees, and one range at 25 to 30 degrees). In these and other embodiments, multiple reinforcement members 1420 or a multi-pronged reinforcement member 1420 may be used such that each reinforcement member 1420 may be coupled to a respective reinforcement plate 1425.

Figure 14D:
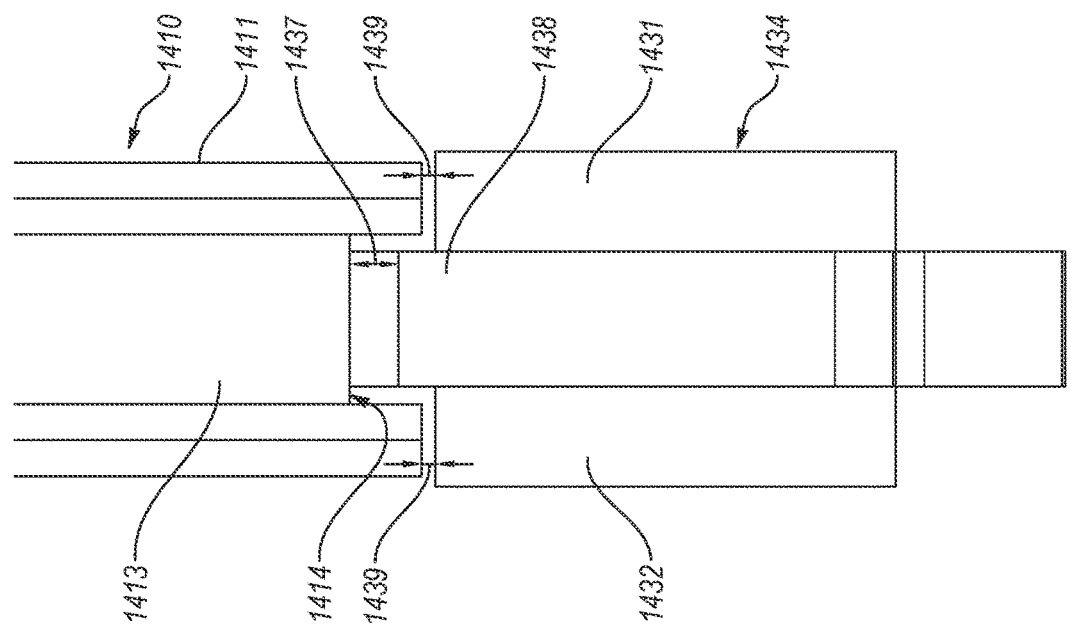
FIG. 14D illustrates a close-up frontal view of the intermittent-motion drive system interfacing with the arced connecting member according to the present disclosure.

FIGS. 14B and 14C illustrate close-up views of the intermittent-motion drive system 1430 according to the present disclosure. FIG. 14D illustrates a close-up frontal view of the intermittent-motion drive system 1430 interfacing with the arced connecting member 1410 according to the present disclosure. The close-up view illustrated in FIG. 14B depicts the intermittent-motion drive system 1430 in a locking state with nubs 1435 (as labeled in FIG. 14C) positioned perpendicular with respect to notches 1414 (as labeled in FIG. 14C) in which the locking state indicates rotation of a drive wheel 1434 may affect rotational movement of an arced connecting member 1410, but a reciprocal rotational movement of the arced connecting member 1410 may or may not affect rotation of the drive wheel 1434 as described in further details below.

The intermittent-motion drive system 1430 may include a drive wheel 1434 that includes a first protrusion 1431 extending from a first surface of the drive wheel 1434 and a second protrusion 1432 extending from a second surface of the drive wheel 1434. In some embodiments, the intermittent-motion drive system 1430 may include an opening 1433 that extends through an entire thickness of the intermittent-motion drive system 1430 such that a drive axle (not shown), such as the drive axle 226 as described in relation to FIG. 2, may be inserted through the intermittent-motion drive system 1430. In these and other embodiments, the opening 1433 may be shaped based on a shape of the drive axle that is intended to be inserted through the intermittent-motion drive system 1430. For example, the opening 1433 may include a circular cross-section as shown in FIGS. 14B and 14C because the drive axle that is intended to be inserted through the intermittent-motion drive system 1430 includes a corresponding circular cross-section. Additionally or alternatively, the opening 1433 may include a keyed shape such to provide an orientation for fitting the drive axle through the intermittent-motion drive system 1430 and/or facilitate rotation of the intermittent-motion drive system 1430 by the drive axle inserted through the opening 1433.

The intermittent-motion drive system 1430 may be configured to interface with the arced connecting member 1410 such that rotation of the intermittent-motion drive system 1430 (e.g., when driven by the drive axle inserted through the intermittent-motion drive system 1430) may affect movement of the arced connecting member 1410 in the direction of the intermittent-motion drive system's 1430 rotation. In some embodiments, the arced connecting member 1410 may include a three-layered configuration in which the arced connecting member 1410 includes a first toothed drive chain 1411, a second toothed drive chain 1412, and a third toothed drive chain 1413 interposed between the first toothed drive chain 1411 and the second toothed drive chain 1412. In these and other embodiments, the first toothed drive chain 1411 and the second toothed drive chain 1412 may include the same or substantially similar shapes. For example, a bottom surface of one or more of the toothed drive chains may include a wave shape made of multiple concave arcs positioned adjacent to one another along a length of the toothed drive chains. For convenience of observing the intermittent-motion drive system 1430, the first toothed drive chain 1411 is dashed out in FIGS. 14B and 14C to facilitate a more complete view of the second and third toothed drive chains 1412 and 1413.

The first protrusion 1431 of the intermittent-motion drive system 1430 may be configured to interface with the first toothed drive chain 1411, while the second protrusion 1432 may be configured to interface with the second toothed drive chain 1412. For example, the first toothed drive chain 1411 and/or the second toothed drive chain 1412 may each include a wave shape with concave arcs between each wave as illustrated in FIGS. 14B and 14C, and the first protrusion 1431 and the second protrusion 1432 may each include a pattern of curved shapes that corresponds with the curvature of the concave arcs of the first toothed drive chain 1411 and/or the second toothed drive chain 1412.

Additionally or alternatively, the third toothed drive chain 1413 interposed between the first toothed drive chain 1411 and the second toothed drive chain 1412 may or may not include a shape that is different from those of the first toothed drive chain 1411 and the second toothed drive chain 1412. Additionally or alternatively, a contact surface between the first protrusion 1431 and a surface of the first toothed drive chain 1411 and/or a contact surface between the second protrusion 1432 and a surface of the second toothed drive chain 1412 may be greater than a contact surface between the third toothed drive chain 1413 and a lateral surface 1438 of the drive wheel 1434 as depicted in FIG. 14B. The contact surface and greater arc angle between the first protrusion 1431 and the first toothed drive chain 1411 and/or the second protrusion 1432 and the second toothed drive chain 1412 may increase the locking effect between the arced connecting member 1410 and the drive wheel 1434 when the surfaces interface with one another. For example, as greater fractions of the arced surfaces of the first protrusion 1431 and/or the second protrusion 1432 interface with the first toothed drive chain 1411 and/or the second toothed drive chain 1412, respectively, the drive wheel 1434 and the arced connecting member 1410 may experience a greater locking effect. In such a circumstance, rotational movement in the arced connecting member 1410 does not affect any rotation of the drive wheel 1434 while still allowing rotation of the drive wheel 1434 to affect rotational movement in the arced connecting member 1410.

In these and other embodiments, the third toothed drive chain 1413 may be configured to interface with at least part of the lateral surface 1438 of the drive wheel 1434 to provide a locking effect between the arced connecting member 1410 and the drive wheel 1434. The third toothed drive chain 1413 may include one or more notches 1414 spaced at regular intervals along the length of the third toothed drive chain 1413. The drive wheel 1434 may include one or more nubs 1435 that may enter and interface with the notches 1414 as the drive wheel 1434 rotates. Rotation of the drive wheel 1434 while the nubs 1435 interface with the notches 1414 may push the arced connecting member 1410 in the direction of the drive wheel's 1434 rotation such that the arced connecting member 1410 moves in the direction of the rotation. In some embodiments, the nubs 1435 may be spaced evenly along a circumference of the drive wheel 1434 such that the rotation of the drive wheel 1434 translates into a regular, predictable, and intermittent movement of the arced connecting member 1410. For example, the notches 1414 may be spaced at three-inch intervals, and a particular drive wheel 1434 may include two nubs 1435 spaced opposite to one another as illustrated in FIGS. 14B-14D. In this and other examples, a half rotation of the particular drive wheel 1434 corresponds to a three-inch movement of the arced connecting member 1410, and a full rotation of the particular drive wheel 1434 corresponds to a six-inch movement of the arced connecting member 1410. As this occurs, the arced connecting member 1410 moves through only a portion of the continuous rotation of the drive wheel 1434, e.g., when the nub 1435 interfaces with the notch 1414. During the other portions of rotation, e.g., when the lateral surface 1438 interfaces with a central protrusion 1418, the arced connecting member 1410 may remain in a locked configuration. In these and other embodiments, the drive wheel 1434 may include any number of nubs 1435. For example, the drive wheel 1434 may include one, two, three, four, five, or more nubs 1435 that are evenly spaced along the circumference of the drive wheel 1434. Additionally or alternatively, although illustrated as having a convex triangular shape, the nubs 1435 and/or the notches 1414 may include any shapes that correspond with one another even if the shape of the nubs 1435 is not the same shape as the notches 1414. For example, the nubs 1435 and/or the notches 1414 may include rectangular, triangular, semicircular, or any other shapes so long as the nubs 1435 may interface with the notches 1414, and rotation of the nubs 1435 as they are interfaced with the notches 1414 results in the driving movement of the arced connecting member 1410.

In some embodiments, the lateral surface of the drive wheel 1434 may or may not come into physical contact with the third toothed drive chain 1413 as the drive wheel 1434 rotates through the locking configuration. For example, as shown in FIG. 14B, a gap 1436 may exist between the lateral surface 1438 of the drive wheel 1434 and the third toothed drive chain 1413 as the drive wheel 1434 rotates in situations in which the nubs 1435 are not interfaced with the notches 1414. Additionally or alternatively, a gap 1437 may exist between the lateral surface 1438 of the drive wheel 1434 and the third toothed drive chain 1413 as the drive wheel 1434 rotates in situations in which the nubs 1435 are interfaced with the notches 1414. Because the lateral surface 1438 of the drive wheel 1434 does not interface with the surface of the third toothed drive chain 1413 as the drive wheel 1434 rotates, wear and tear on the third toothed drive chain 1413 and the drive wheel 1434 may be reduced.

In some embodiments, a gap may exist between the first protrusion 1431 and/or the second protrusion 1432 and the corresponding wave surfaces 1419 of the first and second drive chains 1411 and 1412. In these and other embodiments, the gap(s) between the first and/or second protrusions and the corresponding wave surfaces 1419 may be smaller than the gap between the lateral surface 1438 of the drive wheel 1434 and the central protrusion 1418 of the third drive chain 1413.

FIG. 14D illustrates a close-up frontal view of the intermittent-motion drive system 1430 interfacing with the arced connecting member 1410 according to the present disclosure. The frontal view of the intermittent-motion drive system 1430 illustrates the gap 1437 between the lateral surface 1438 of the drive wheel 1434 and the third toothed drive chain 1413 as the drive wheel 1434 rotates in situations in which the nubs 1435 are interfaced with the notches 1414. Additionally or alternatively, the frontal view shows gaps 1439 between the first protrusion 1431 and the first drive chain 1411 and between the second protrusion 1432 and the second drive chain 1412. In some embodiments, the drive wheel 1434 may be positioned higher or lower relative to the arced connecting member 1410 to adjust a size of the gap 1437 and the gaps 1439, which may affect a degree to which the drive wheel 1434 interfaces with the arced connecting member 1410, and correspondingly, a strength of locking between the drive wheel 1434 and the arced connecting member 1410.

In some embodiments, the first drive chain 1411 and/or the second drive chain 1412 may be made of two or more layers to facilitate a stronger locking effect between the arced connecting member 1410 and the drive wheel 1434. By increasing the number of layers included in the first drive chain 1411 and/or the second drive chain 1412 and/or adjusting a number of layers with which the first protrusion 1431 and/or the second protrusion 1432, respectively, may interface, the locking effect between the arced connecting member 1410 and the drive wheel 1434 may be increased.

Additionally or alternatively, the first drive chain 1411 and the second drive chain 1412 may or may not include a greater height than the third drive chain 1413 as illustrated in FIG. 14D. In some embodiments, interactions between the first drive chain 1411 and the second drive chain 1412 with the first protrusion 1431 and the second protrusion 1432, respectively, may include a continuous transferal of rotational motion from the drive wheel 1434 to the arced connecting member 1410 based on the wave shapes of the first drive chain 1411 and the second drive chain 1412. In these and other embodiments, interactions between the third drive chain 1413 with the drive wheel 1434 may provide intermittent rotational motion caused by the nub 1435 of the drive wheel 1434 interfacing with the notches 1414 of the third drive chain 1413 periodically during rotation of the drive wheel 1434.

While illustrated with the third drive chain 1413 being higher than the first and the second drive chains 1411 and 1412, it will be appreciated that the third drive chain 1413 may be lower than the first and the second drive chains 1411 and 1412. In these and other embodiments, the first and the second protrusions 1431 and 1432 may extend beyond the lateral surface 1438, creating a channel between the first and the second protrusions 1431 and 1432 within which the lateral surface 1438 resides and from which the nubs 1435 extend.

FIG. 15A illustrates a fourth example embodiment of a mounting assembly 1500 including an intermittent-motion drive system 1530 according to the present disclosure. The mounting assembly 1500 may include an arced connecting member 1510 that includes a solid body or a substantially solid body with few if any gaps, openings, or holes in a surface of the arced connecting member 1510. Additionally or alternatively, the arced connecting member 1510 may include a shape and/or configuration that is the same as or similar to the arced connecting member 1410 included in the mounting assembly 1400. Similar to the mounting assembly 1400, the arced connecting member 1510 may include a first leg similar to the first leg 1415 and a second leg similar to the second leg 1416 which are connected via the solid body of the arced connecting member 1510, which may be a reinforcement member 1520. As such, the reinforcing member 1520 of the arced connecting member 1510 may provide structural support for the mounting assembly 1500 alongside a support beam 1550.

In some embodiments, the support beam 1550 may be a vertically oriented support beam that is coupled to a support structure 1516 and the arced connecting member 1510. For example, as illustrated in FIG. 15A, the reinforcement member 1520 is coupled to a support structure 1516, the arced connecting member 1510, and a housing 1525 of the intermittent-motion drive system 1530. In this and other examples, the support structure 1516 to which the support beam 1550 may be coupled may include a sleeve 1542 that further includes a bushing 1544 through which a torsion beam 1540 may be inserted. In this and other examples, the support structure 1516, the sleeve 1542, the bushing 1544, and/or the torsion beam 1540 may be the same as or similar to the support structures described in relation to FIGS. 1, 4A, and 6, respectively. For example, the bushing 1544 may permit rotation of the torsion beam 1540 relative to the support beam 1550 while still being supported by the support beam 1550.

FIGS. 15B and 15C illustrate close-up views of the intermittent-motion drive system 1530 according to the present disclosure. FIG. 15B illustrates the intermittent-motion drive system 1530 when driving the arced connecting member 1510, and FIG. 15C illustrates the intermittent-motion drive system 1530 in a locked configuration. The intermittent-motion drive system 1530 may include a drive wheel 1531 that includes a protrusion 1532 extending from one or more surfaces of the drive wheel 1531. The protrusion 1532 may be shaped to include a leg 1533 that pushes against a first row of pegs 1512 and/or a second row of pegs 1514 of the arced connecting member 1510 as the drive wheel 1531 rotates due to rotation of a drive axle 1560. The pushing motion of the leg 1533 against the first row of pegs 1512 and/or the second row of pegs 1514 may result in movement of the arced connecting member 1510 in the direction of the rotation of the drive wheel 1531. In some embodiments, the protrusion 1532 may include one leg 1533 or more than one leg 1533 such that one full rotation of the drive wheel 1531 may correspond to one or more movements of the arced connecting member 1510. For example, the protrusion 1532 may include a substantially circular cross-sectional shape, and a combined shape of the protrusion 1532 and the leg 1533 may be a droplet shape or a half-stadium shape (e.g., a rectangular shape with a generally half-circle shape at one end of the rectangular shape). As another example, the protrusion may include the substantially circular cross-sectional shape with two legs extending from the protrusion 1532 in a stadium shape.

In some embodiments, the drive wheel 1531 may include a first protruding wall 1534 and/or a second protruding wall 1535. The first protruding wall 1534 and the second protruding wall 1535 may each be spaced at particular distances away from the protrusion 1532 along the surface of the drive wheel 1531 such that a first channel 1536 is formed between the protrusion 1532 and the first protruding wall 1534 and a second channel 1537 is formed between the first protruding wall 1534 and the second protruding wall 1535. During rotation of the drive wheel 1531, the first channel 1536 and/or the second channel 1537 may accommodate one or more of the pegs included in each of the rows of pegs 1512, 1514 to prevent collision of any part of the drive wheel 1531 aside from the leg 1533 of the protrusion 1532 with the pegs and providing support and/or guidance for the rotating drive wheel 1531. Additionally or alternatively, the protrusion 1532, the first protruding wall 1534, and/or the second protruding wall 1535 may prevent misalignment of the drive wheel 1531 as the drive wheel 1531 rotates by locking the orientation of the drive wheel 1531 relative to the arced connecting member 1510 relative to the first channel 1536 and/or the second channel 1537.

As illustrated in FIG. 15C, when the peg(s) 1512 and/or 1514 are within the channel(s) 1536 and/or 1537, the arced connecting member 1510 may be in the locked configuration. The locked configuration of this embodiment provides similar or comparable benefits to the locked configuration for the other embodiments of the present disclosure, such as greater rigidity, decreased forces on the motor and/or drivetrain, greater stability when experiencing forces, among other benefits. In some circumstances, the locked configuration may provide resistance against torsional or other rotational forces due to the drive wheel 1531 interfacing with the arced connecting member 1510.

Figure 16B:
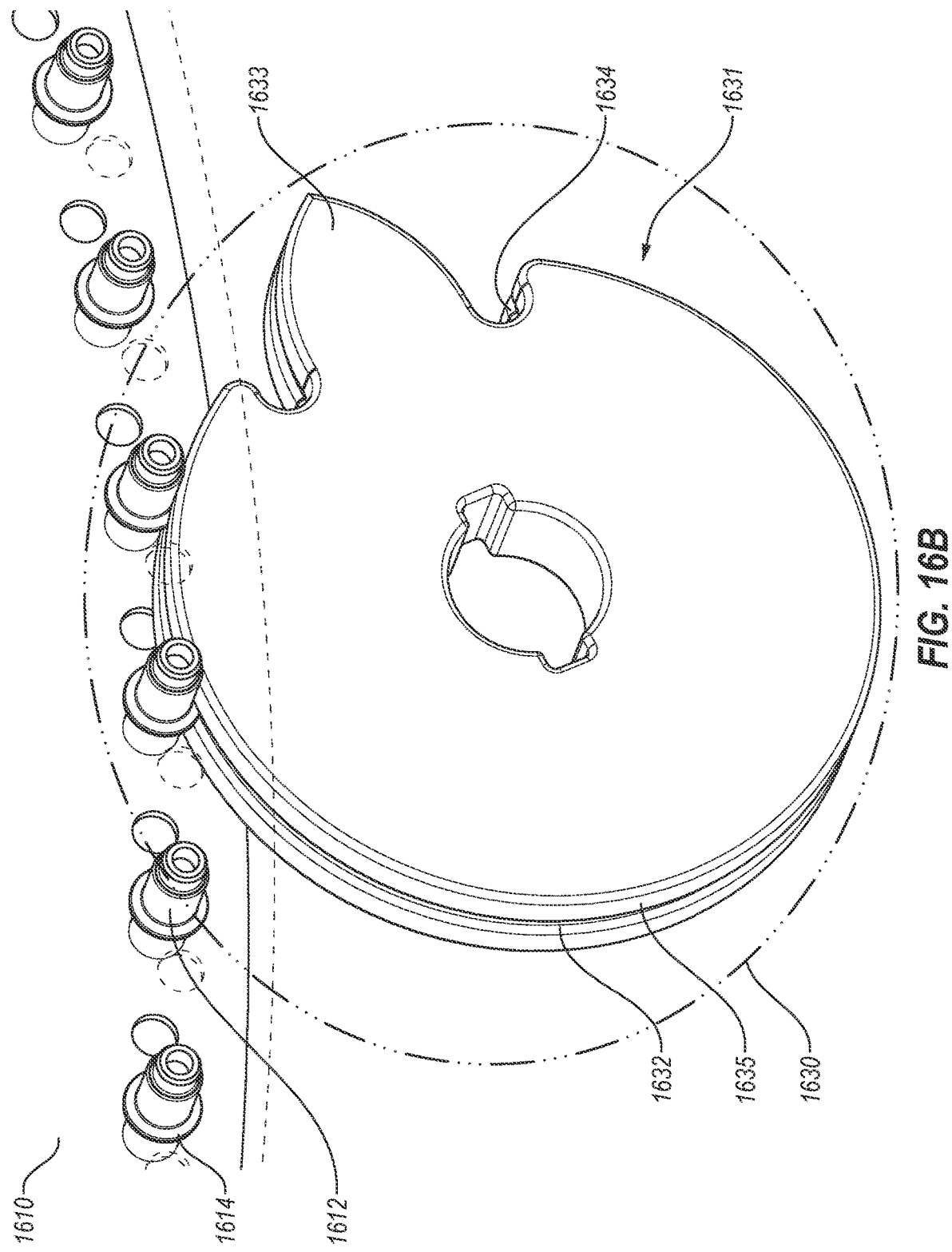
FIGS. 16B and 16C illustrate close-up views of the fifth example embodiment of the intermittent-motion drive system according to the present disclosure.

FIG. 16A illustrates a fifth example embodiment of a mounting assembly 1600 including a multi-point lock internally geared (e.g., intermittent motion) drive system 1630 according to the present disclosure. The mounting assembly 1600 may include an arced connecting member 1610 that is the same as or substantially similar to the arced connecting member 1510 described in relation to FIG. 15A. The pegs of the arced connecting member 1610 may or may not differ from the pegs included in the arced connecting member 1510 as described below in relation to close-up views of the intermittent-motion drive system 1630 as illustrated in FIGS. 16B and 16C.

Figure 16C:
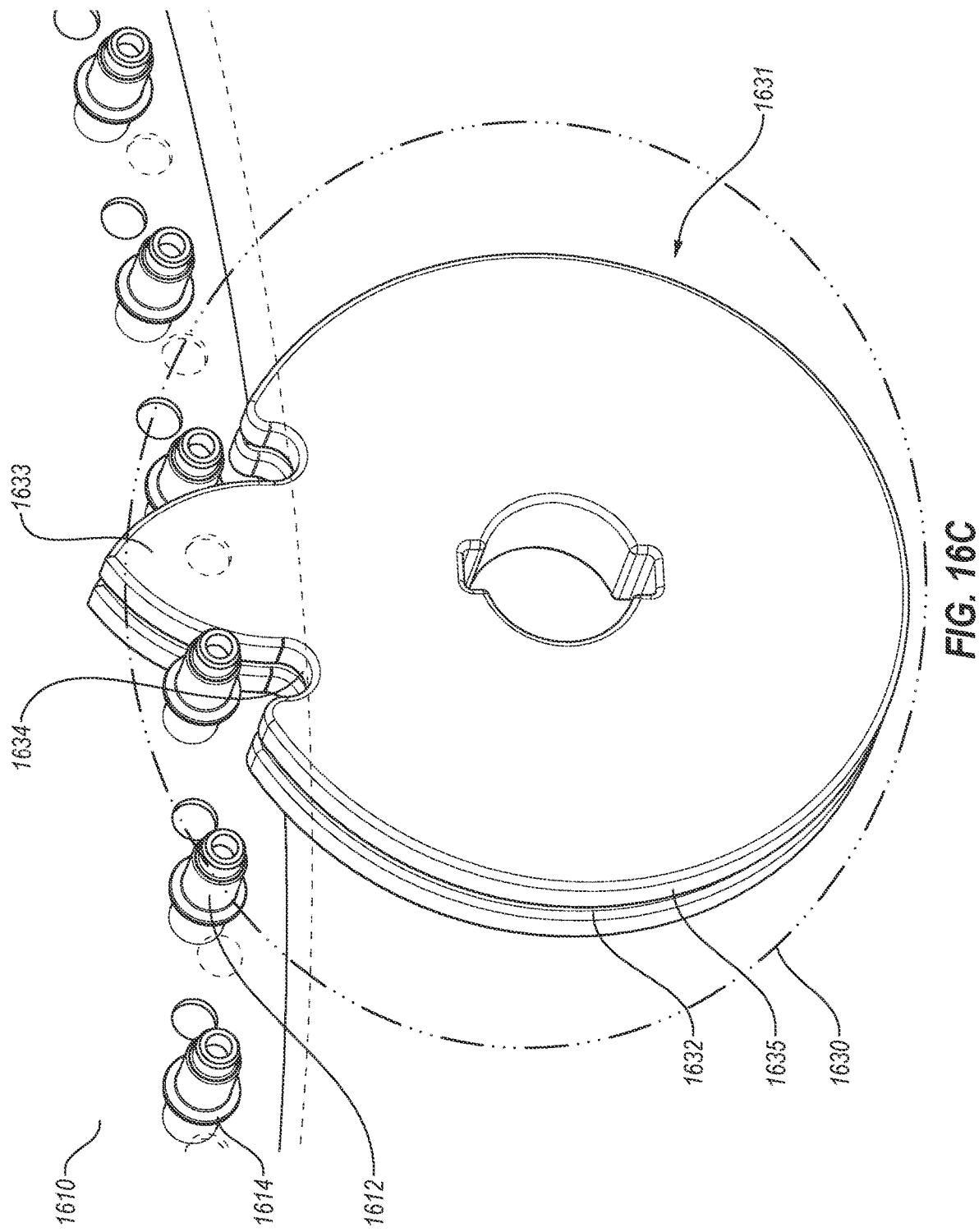

FIGS. 16B and 16C illustrate the close-up views of the intermittent-motion drive system 1630 according to the present disclosure. FIG. 16B illustrates the intermittent-motion drive system 1630 in a locked configuration, and FIG. 16C illustrates the intermittent-motion drive system 1630 when driving the arced connecting member 1610. In some embodiments, the intermittent-motion drive system 1630 may include a channel 1632 indented into a circumferential surface 1635 of a drive wheel 1631. The channel 1632 may be configured to interface with a ring 1614 of a peg 1612 included in the arced connecting member 1610 as the drive wheel 1631 rotates to prevent interference between the drive wheel 1631 and the pegs 1612 of the arced connecting member 1610. The use of the ring 1614 and the channel 1632 may also facilitate alignment of the drive wheel 1631 with the arced connecting member 1610.

The drive wheel 1631 may be positioned so that a nub 1633 at least partially overlaps with the pegs 1612. In some embodiments, the nub 1633 may be shaped and sized to fit between two of the pegs 1612 as the drive wheel 1631 rotates. A surface of the nub 1633 may push into one or more of the pegs 1612 as the drive wheel 1631 rotates to affect movement of the arced connecting member 1610. In these and other embodiments, the nub 1633 may include a tapered shape to facilitate the nub 1633 sliding between and out from between the pegs 1612 as the drive wheel 1631 rotates. Rotation of the drive wheel 1631 and interactions between the nub 1633 and the pegs 1612 may cause the arced connecting member 1610 to move in the direction of the rotation. For example, one full rotation of the drive wheel 1631 as depicted in FIGS. 16B and 16C may cause the arced connecting member 1610 to move a distance equal to or substantially equal to the spacing between two of the pegs 1612 as the nub 1633 pushes the arced connecting member 1610 via the pegs 1612. In this and other examples, the distance the arced connecting member 1610 moves per full rotation of the drive wheel 1631 may be adjusted by increasing a number of nubs 1633 included along the drive wheel 1631 and/or by changing the spacing between the pegs 1612.

Additionally or alternatively, the drive wheel 1631 may include one or more grooves 1634 adjacent to the nub 1633 to facilitate rotation of the nub 1633 into positions between the pegs 1612. The grooves 1634 may provide clearance for the nub 1633 as the nub 1633 rotates and slides into and out from between the pegs 1612. As such, the grooves 1634 may prevent locking of the drive wheel 1631 and/or the nub 1633 against the pegs 1612 or any other surfaces of the arced connecting member 1610 as the drive wheel 1631 and/or the nub 1633 rotate.

As illustrated in FIG. 16B, when the nub 1633 of the drive wheel 1631 is not interfacing with the pegs 1612, the intermittent-motion drive system 1630 may be in the locked configuration. The locked configuration of this embodiment provides similar or comparable benefits to the locked configuration for the other embodiments of the present disclosure, such as greater rigidity, decreased forces on the motor and/or drivetrain, greater stability when experiencing forces, among other benefits.

In any of the preceding embodiments (such as those illustrated in FIGS. 14A-16C), a lubricant may be used at one or more of the interfaces between components of the intermittent-motion drive systems. Such lubricant may be topical or may be a surface treatment or material component of the elements of the intermittent-motion drive systems. For example, the drive wheels 1434, 1531, 1631 and/or the respective arced connecting members 1410, 1510, 1610 may include an oil, graphite, or other lubricant between such components. As another example, one or more of such components may be made of galvanized bronze or steel, impregnated plastics, oil-impregnated bronze, graphite bronze, stainless steel, impregnated steel, or other such materials.

FIGS. 17A-17M illustrate alternative examples of mechanisms to produce intermittent motion when driving the drive chain. For example, the driven wheel 210 and/or the drive wheel 220 of FIG. 2 may interface to cause intermittent motion of the driven axle 215. In like manner, the various mechanical linkages illustrated in FIGS. 17A-17M may be used to provide intermittent motion between a drive axle and a driven axle. Additionally or alternatively, the various mechanical linkages illustrated in FIGS. 17A-17M may be used to provide intermittent motion between the drive wheels 1434, 1531, 1631 and the respective arced connecting members 1410, 1510, 1610.

Figure 17B:
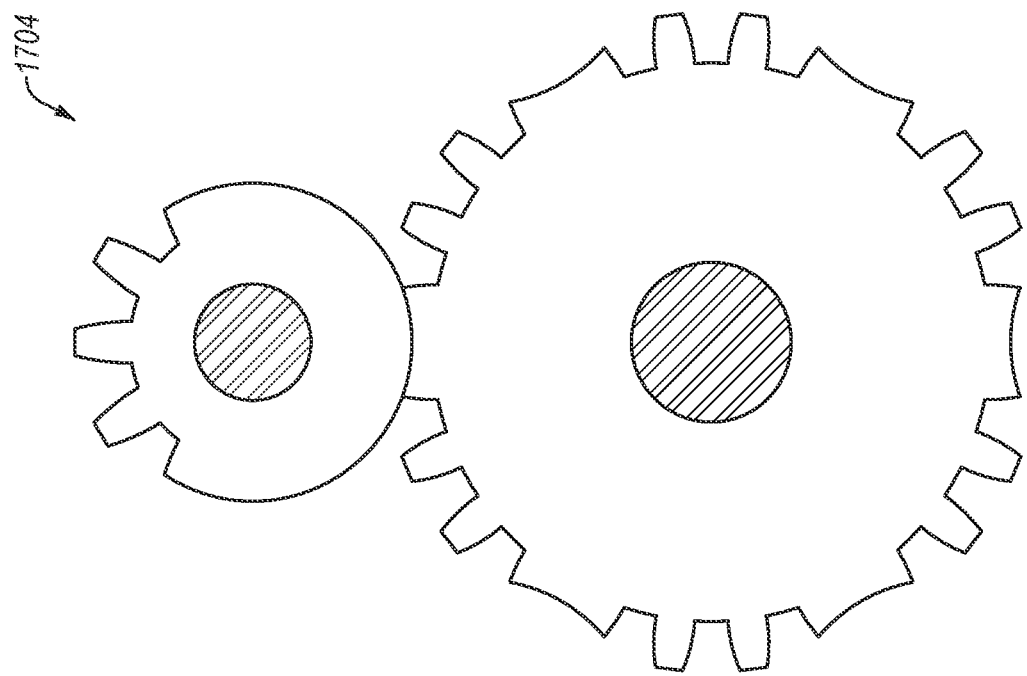
Figure 17A:
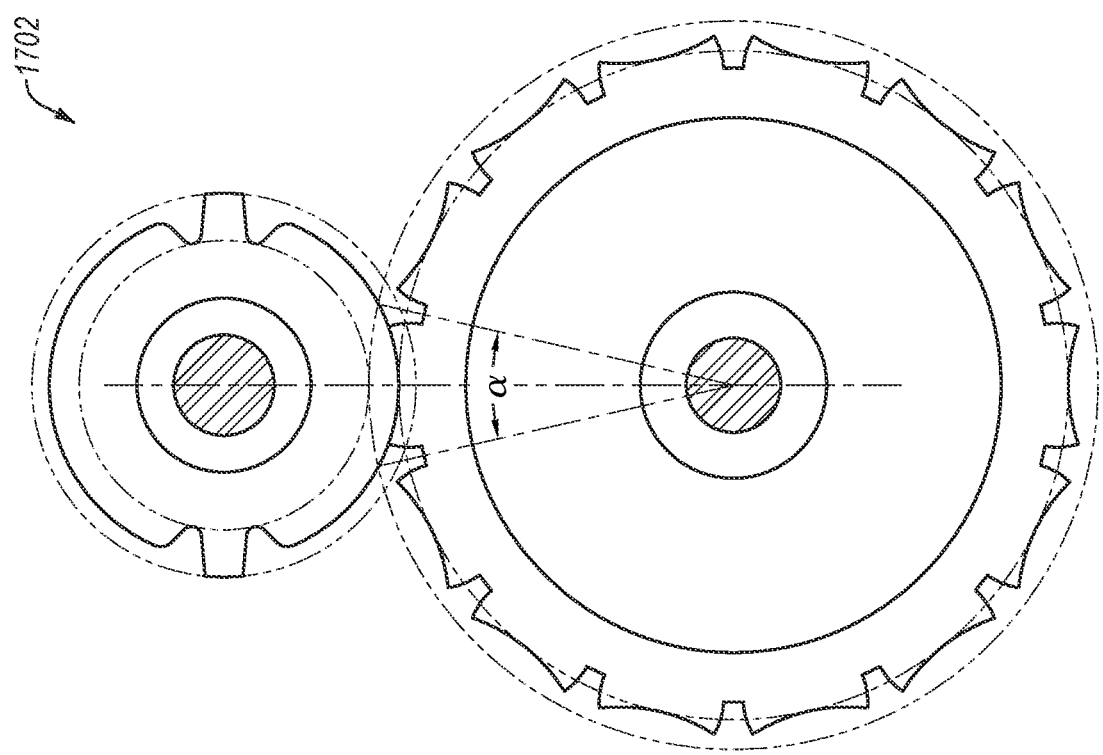

A mechanical linkage 1702 as shown in FIG. 17A functions by rotating a driver gear such that a tooth of a driver gear interfaces with a tooth space of a driven gear to affect intermittent rotational motion of the driven gear.

A mechanical linkage 1704 as illustrated in FIG. 17B may be an additional or alternative embodiment of the mechanical linkage 1702 in which the driven gear includes a smaller number of rest periods between rotational motion. Additionally or alternatively, the driven gear may turn a farther distance per revolution of the driver gear because the driver gear includes three successive teeth.

Figure 17D:
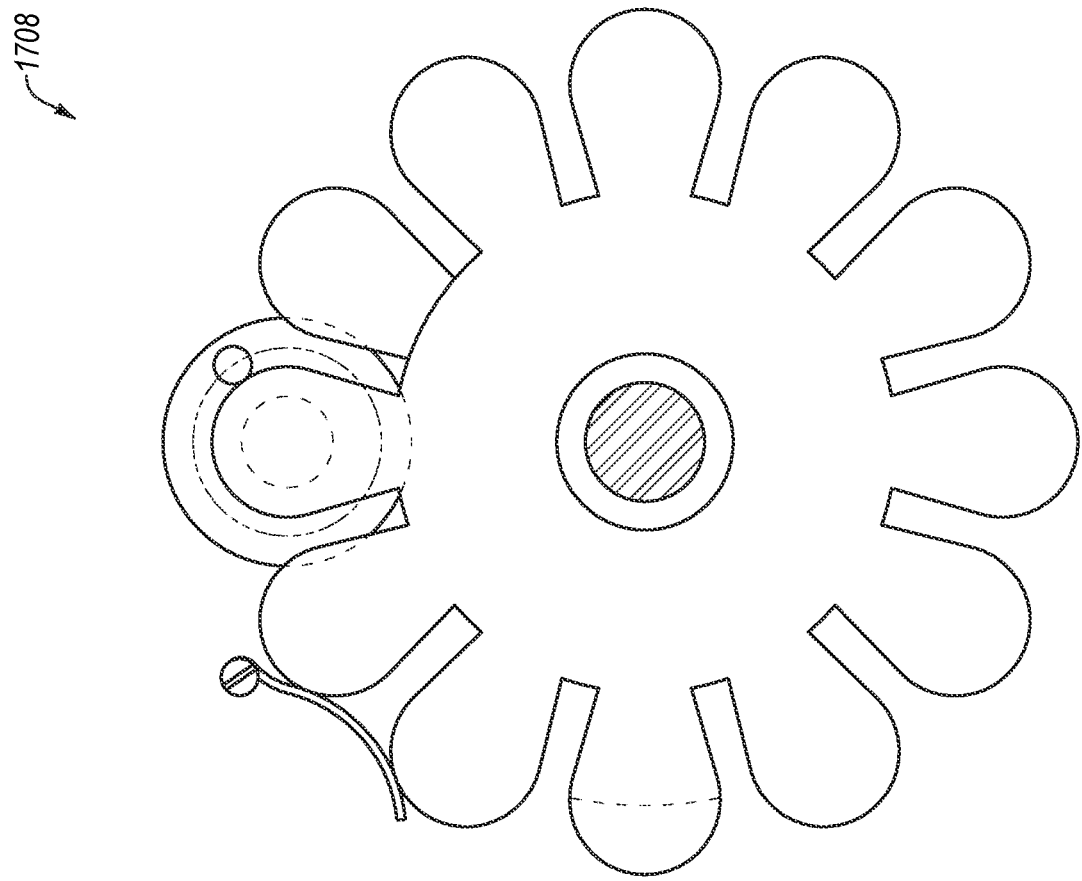
Figure 17C:
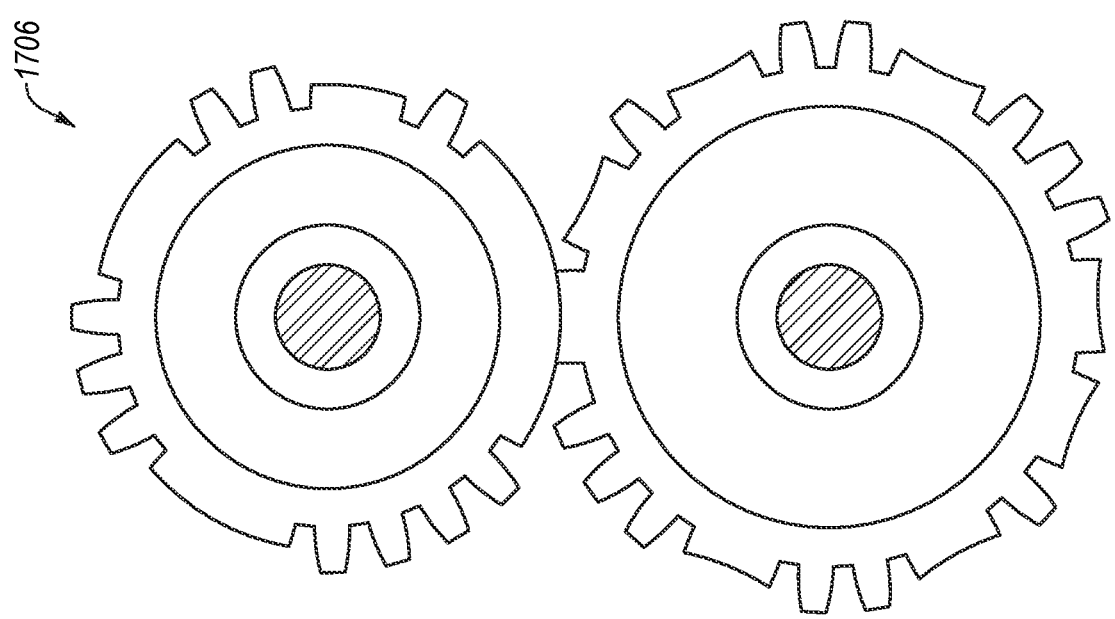

A mechanical linkage 1706 as illustrated in FIG. 17C may include a driver gear with four driving points around a circumference of the driver gear with a number of teeth at each of the driving points ranging from one tooth to four teeth. The driven gear may include a corresponding number of tooth spaces based on the driving points of the driver gear, which may result in an increasing or a decreasing rate of motion depending on a rotational direction of the driver gear.

A mechanical linkage 1708 as illustrated in FIG. 17D may include a driver gear with a stud that engages one or more radial slots in a driven gear.

Figure 17F:
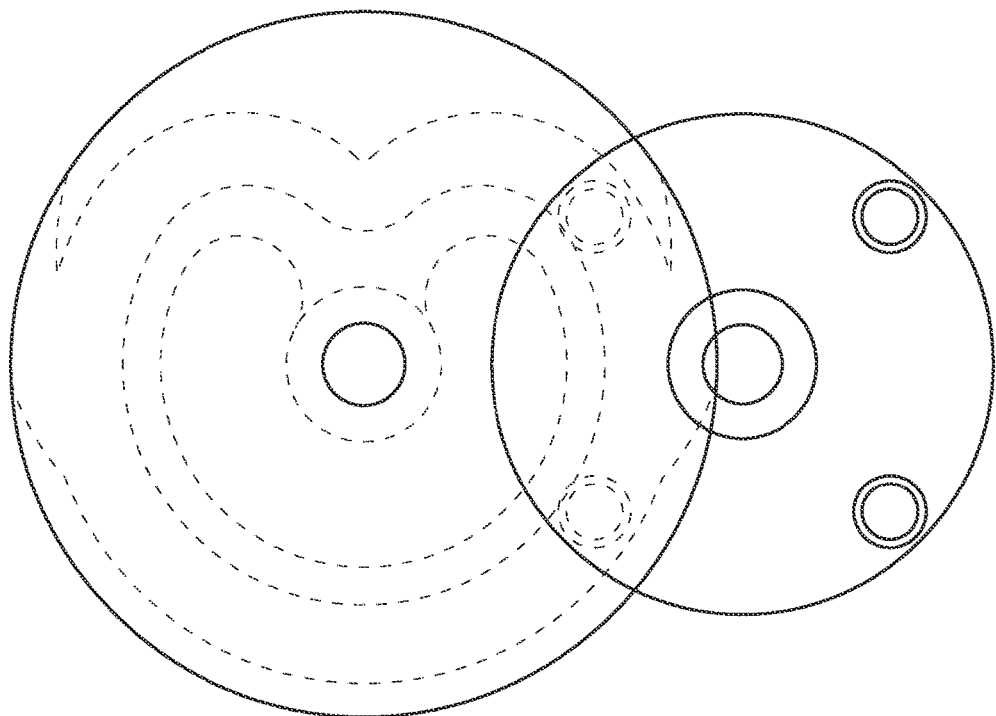
Figure 17E:
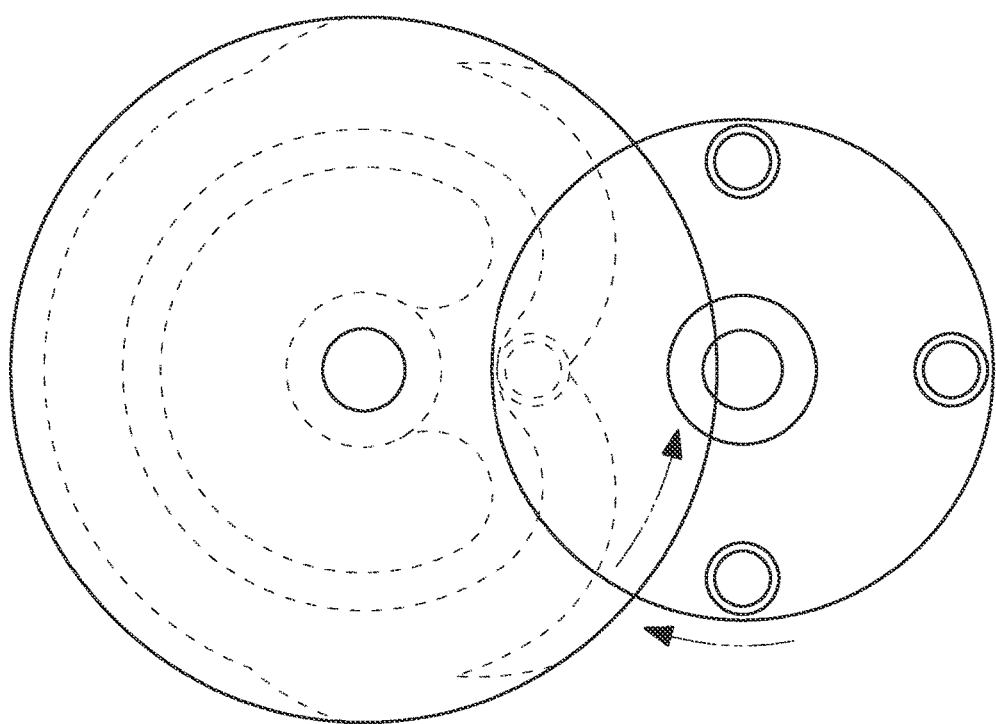

A mechanical linkage 1710 as illustrated in FIGS. 17E and 17F may include a driver gear with a channel that is shaped to engage with and cause rotational motion of a driven gear by catching onto a stud included on the driven gear.

Figure 17G:
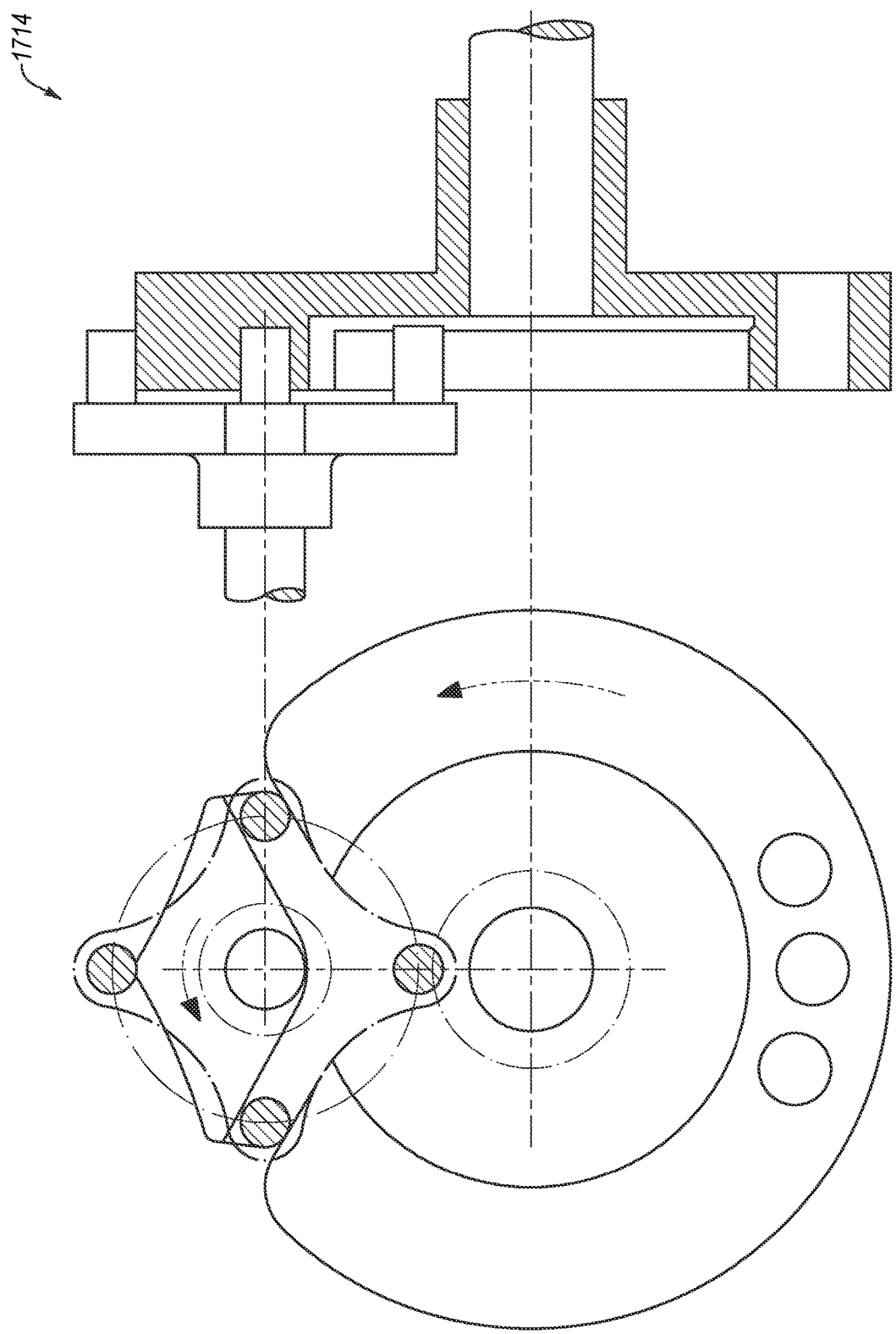

A mechanical linkage 1712 as illustrated in FIG. 17G may include a driver gear that includes rings that interface with one or more pegs of a driven gear.

Figure 17I:
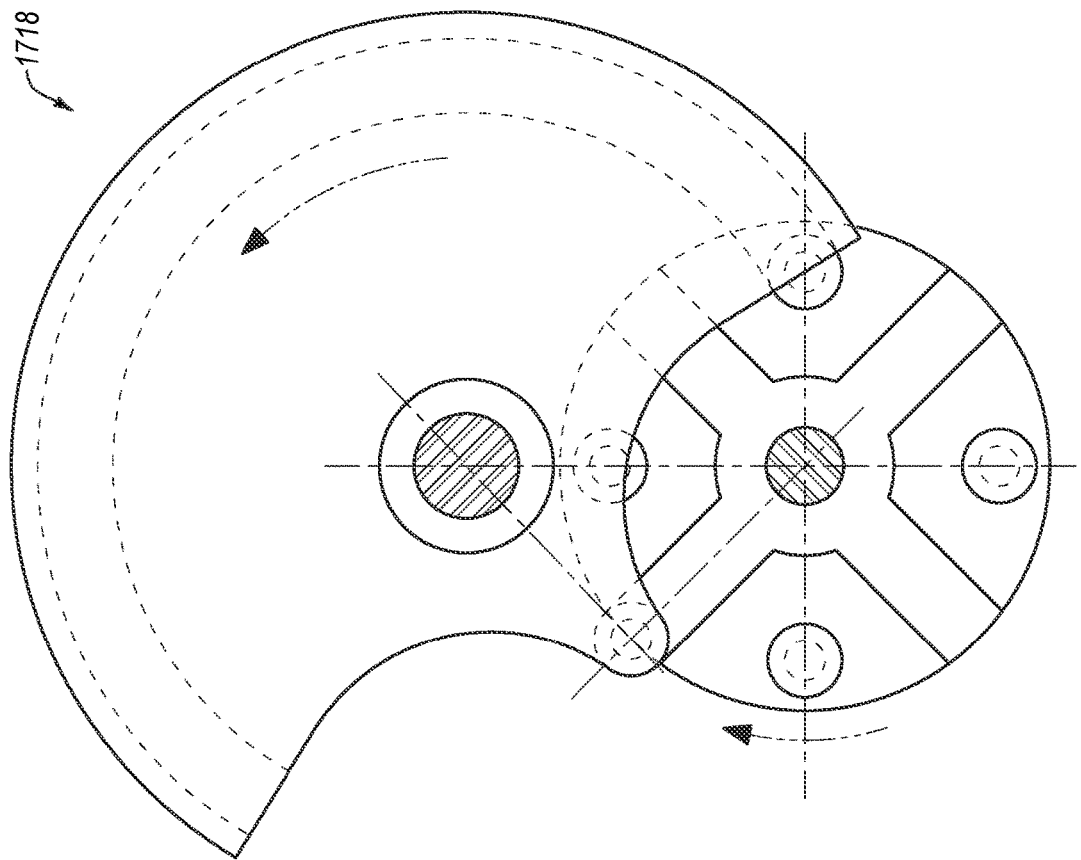
Figure 17H:
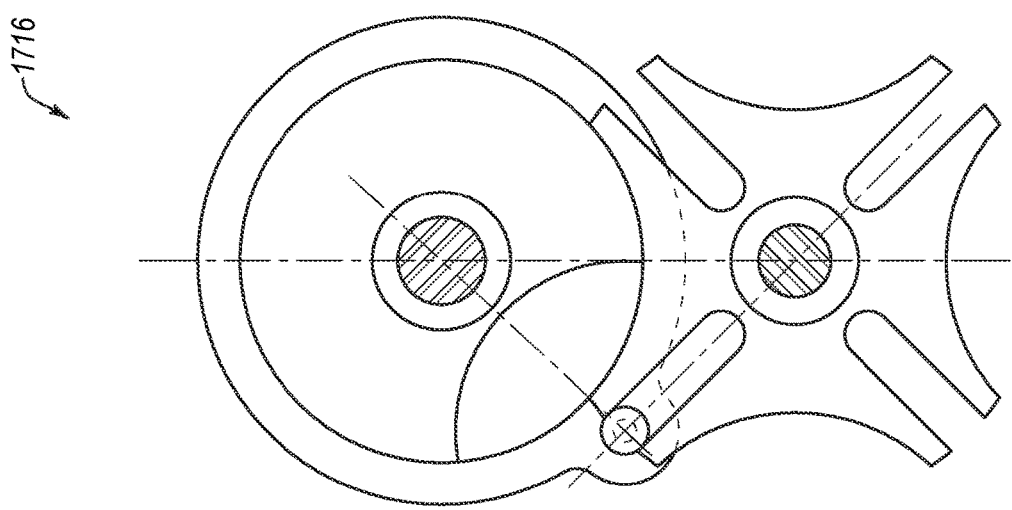

A mechanical linkage 1714 as illustrated in FIG. 17H may include a driver gear that includes a peg that interfaces with one or more radial slots of a driven gear.

A mechanical linkage 1714 as illustrated in FIG. 17I may include a driver gear that includes a driving roller and a circular groove. The driving roller of the driver gear may interface with one or more radial slots of a driven gear as one or more rollers of the driven gear interface with the circular groove.

Figure 17J:
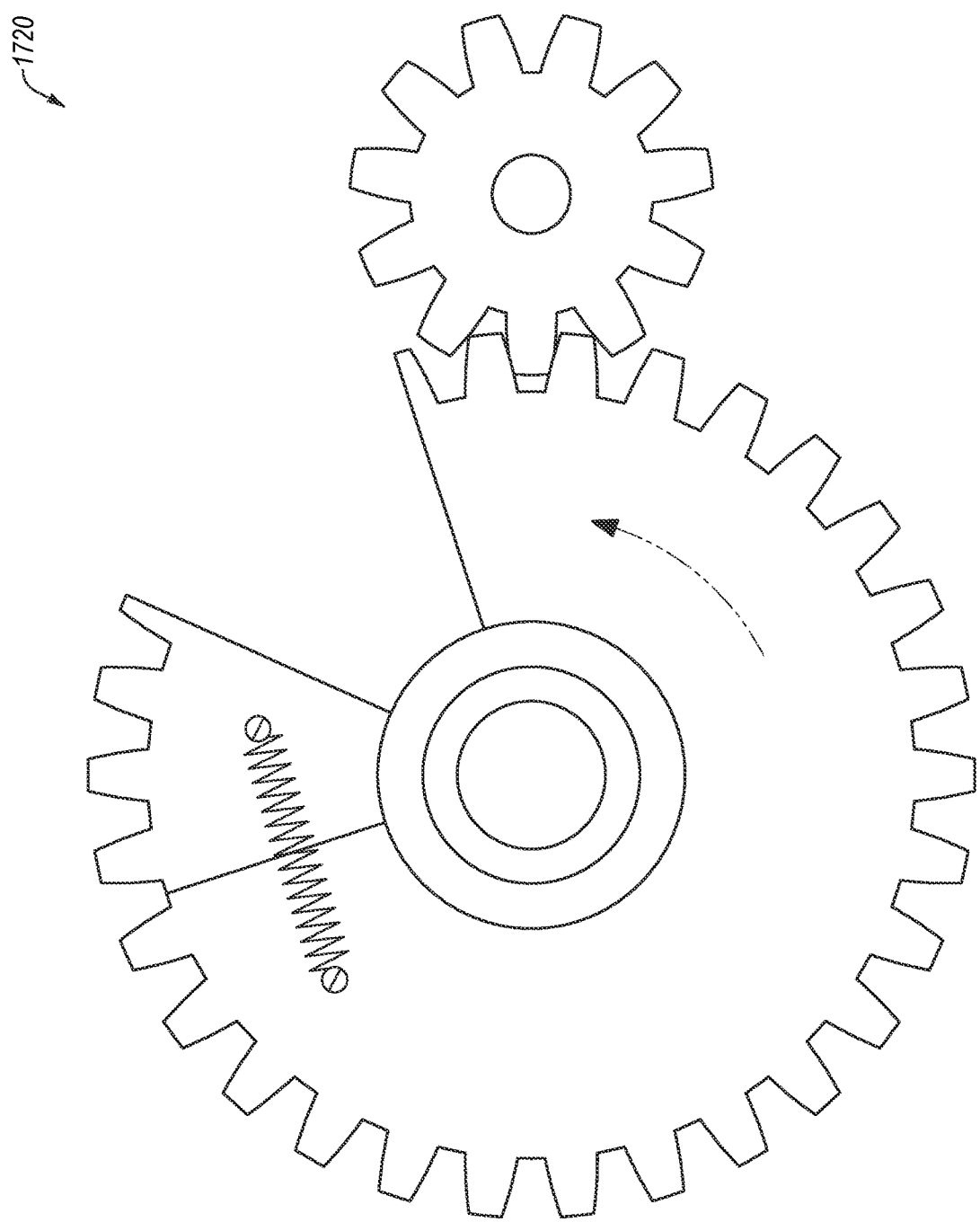

A mechanical linkage 1714 as illustrated in FIGS. 17Ja and 17Jb may include a driver gear and a driven gear oriented perpendicular relative to one another. A flange of the driver gear may interface with a surface of the driven gear to cause rotational movement of the driven gear.

A mechanical linkage 1714 as illustrated in FIG. 17K may include a driver gear that includes one or more teeth and a driven gear that includes tooth spaces positioned along a circumference of the driven gear. Additionally or alternatively, the driven gear may include blank spaces along its circumference that correspond to a curvature of the driver gear.

A mechanical linkage 1714 as illustrated in FIG. 17L may include a driver gear that includes teeth along a circumference of the driver gear that may interface with one or more notches of a plate corresponding to a driven gear. Rotation of the teeth of the driver gear past the notches of the plate may cause rotational movement of the driven gear, while rotation of a flat surface of the driver gear does not cause rotational movement of the driven gear.

Figure 17M:
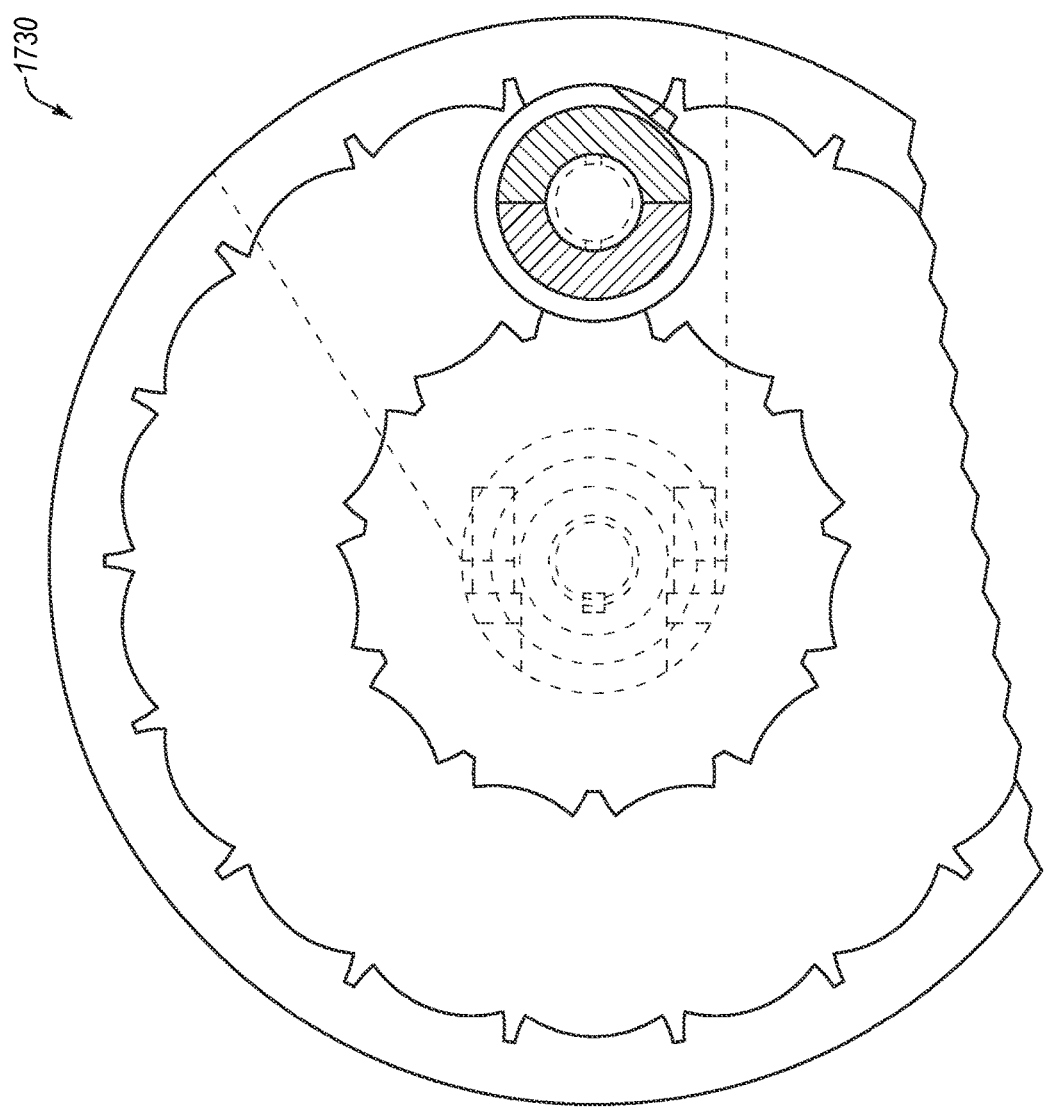

A mechanical linkage 1714 as illustrated in FIG. 17M may include a driver gear with a peg interposed between a first driven gear and a second driven gear. The first driven gear and the second driven gear may each include radial slots that the peg of the driver gear may interface with to affect rotational movement of the first driven gear and/or the second driven gear.

Terms used in the present disclosure and especially in the appended claims (e.g., bodies of the appended claims) are generally intended as "open terms" (e.g., the term "including" should be interpreted as "including, but not limited to.").

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is expressly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase preceding two or more alternative terms, whether in the description, claims, or drawings, should be understood to contemplate the possibilities of including one of the terms, either of the terms, or both of the terms. For example, the phrase "A or B" should be understood to include the possibilities of "A" or "B" or "A and B."

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A mounting assembly, comprising:
an arced connecting member that includes:
    a first plate;
    a second plate positioned adjacent to the first plate; and
    a plurality of pegs interposed between the first plate and the second plate;
an intermittent-motion drive system that includes:
    a drive wheel positioned at least partially between the first plate and the second plate;
    a protrusion extending from a center of a base surface of the drive wheel, the protrusion being shaped to interface with one or more pegs of the plurality of pegs,
    a first protruding wall that extends from the base surface of the drive wheel; and
    a second protruding wall that extends from the base surface of the drive wheel, wherein the first protruding wall is located closer to the center of the drive wheel than the second protruding wall.

2. The mounting assembly of claim 1, wherein the first protruding wall and the second protruding wall each include an arced shape.

3. The mounting assembly of claim 1, wherein:
a first gap is formed between the base surface of the drive wheel, the protrusion, and the first protruding wall, the first gap including a width greater than a width of one peg of the plurality of pegs; and
a second gap is formed between the base surface of the drive wheel, the first protruding wall, and the second protruding wall, the second gap including a width greater than the width of one peg of the plurality of pegs.

4. The mounting assembly of claim 1, wherein the plurality of pegs includes:
a first set of pegs extending from a first surface of the first plate towards the second plate, the first surface facing the second plate; and
a second set of pegs extending from a second surface of the second plate towards the first plate, the second surface facing the first plate.

5. A mounting assembly, comprising:
an arced connecting member that includes:
    a first plate;
    a second plate positioned adjacent to the first plate; and
    a plurality of pegs interposed between the first plate and the second plate proximate a bottom surface of the arced connecting member;
an intermittent-motion drive system that includes a drive wheel positioned at least partially between the first plate and the second plate, the drive wheel including a substantially circular shape and a nub protruding from a lateral surface of the drive wheel, the drive wheel further positioned so the nub at least partially overlaps with the plurality of pegs, wherein the lateral surface of the drive wheel includes one or more grooves positioned at an interface between the substantially circular shape and the nub protruding from the lateral surface of the drive wheel.

6. The mounting assembly of claim 5, wherein the nub protruding from the lateral surface of the drive wheel includes a convex triangular shape.

7. The mounting assembly of claim 5, wherein each peg of the plurality of pegs includes a cylindrical shape in which a first base surface of each peg is attached to a first surface of the first plate and a second base surface of each peg is attached to a second surface of the second plate.

8. The mounting assembly of claim 7, wherein each peg of the plurality of pegs includes a ring extending from a lateral surface of each peg.

9. The mounting assembly of claim 8, wherein the drive wheel includes a channel circumscribing the drive wheel along the lateral surface of the drive wheel.

* * * * *